(12) United States Patent
Pyeon et al.

(10) Patent No.: US 7,853,727 B2
(45) Date of Patent: *Dec. 14, 2010

(54) APPARATUS AND METHOD FOR PRODUCING IDENTIFIERS REGARDLESS OF MIXED DEVICE TYPE IN A SERIAL INTERCONNECTION

(75) Inventors: Hong Beom Pyeon, Kanata (CA); HakJune Oh, Kanata (CA); Jin-Ki Kim, Kanata (CA); Shuji Sumi, Kanata (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 9 days.

This patent is subject to a terminal disclaimer.

(21) Appl. No.: 11/692,446

(22) Filed: Mar. 28, 2007

(65) Prior Publication Data

US 2008/0192649 A1    Aug. 14, 2008

Related U.S. Application Data

(60) Provisional application No. 60/889,572, filed on Feb. 13, 2007, provisional application No. 60/868,773, filed on Dec. 6, 2006.

(51) Int. Cl.
G06F 3/00    (2006.01)
G06F 13/28    (2006.01)

(52) U.S. Cl. ............... 710/8; 710/4; 710/10; 710/9; 710/24

(58) Field of Classification Search ............... 710/4, 710/10, 8, 9, 24
See application file for complete search history.

(56) References Cited

U.S. PATENT DOCUMENTS 4,174,536 A    11/1979   Misunas et al.
(Continued)

FOREIGN PATENT DOCUMENTS

EP    1717985 A1    11/2006
WO    01/69411 A2    9/2001

OTHER PUBLICATIONS

IBM Technical Disclosure Bulletin, "Programmable Identification for I/O Devices," Aug. 1, 1979, NN7908882, vol. 22, Issue No. 3.*
Craig L. King, Ezana Haile, Microchip Technology Inc., "Communicating with Daisy Chained MCP42XXX Digital Potentiometers", 2001, pp. 1-8.

(Continued)

*Primary Examiner*—Alford W Kindred
*Assistant Examiner*—Farley J Abad
(74) *Attorney, Agent, or Firm*—Leslie A. Kineman; Borden Ladner Gervais LLP

(57) ABSTRACT

A plurality of memory devices of mixed type (e.g., DRAMs, SRAMs, MRAMs, and NAND-, NOR- and AND-type Flash memories) is serially interconnected. Each device has device type information on its device type. A specific device type (DT) and a device identifier (ID) contained in a serial input (SI) as a packet are fed to one device of the serial interconnection. The device determines whether the fed DT matches the DT of the device. In a case of match, a calculator included in the device performs calculation to generate an ID accompanying the fed DT for another device and the fed ID is latched in a register of the device. In a case of no match, the ID generation is skipped and no ID is generated for another device. The DT is combined with the generated or the received ID depending on the device type match determination. The combined DT and ID is as a packet transferred to a next device. Such a device type match determination and ID generation or skip are performed in all devices of the serial interconnection. With reference to device type provided to the interconnected devices, IDs are sequentially generated. The SI containing the DT, the ID and an ID generation command is transmitted in a packet basis to a next device. A memory controller can recognize the total number of one DT, in response to the ID received from the last device. In a case of a "don't care" DT is provided to the interconnected devices, IDs are sequentially generated and the total number of the interconnected devices is recognized, regardless of the differences in DTs of the devices.

54 Claims, 33 Drawing Sheets

U.S. PATENT DOCUMENTS

| | | | |
|---|---|---|---|
| 4,360,870 A * | 11/1982 | McVey | 710/9 |
| 4,617,566 A | 10/1986 | Diamond | |
| 4,733,376 A | 3/1988 | Ogawa | |
| 4,796,231 A | 1/1989 | Pinkham | |
| 5,126,808 A | 6/1992 | Montalvo et al. | |
| 5,136,292 A | 8/1992 | Ishida | |
| 5,175,819 A | 12/1992 | Le Ngoc et al. | |
| 5,204,669 A | 4/1993 | Dorfe et al. | |
| 5,243,703 A | 9/1993 | Farmwald et al. | |
| 5,249,270 A | 9/1993 | Stewart et al. | |
| 5,280,539 A | 1/1994 | Yeom et al. | |
| 5,319,598 A | 6/1994 | Aralis et al. | |
| 5,365,484 A | 11/1994 | Cleveland et al. | |
| 5,404,460 A | 4/1995 | Thomsen et al. | |
| 5,430,859 A | 7/1995 | Norman et al. | |
| 5,440,694 A | 8/1995 | Nakajima | |
| 5,452,259 A | 9/1995 | McLaury | |
| 5,473,563 A | 12/1995 | Suh et al. | |
| 5,473,566 A | 12/1995 | Rao | |
| 5,473,577 A | 12/1995 | Miyake et al. | |
| 5,535,336 A | 7/1996 | Smith et al. | |
| 5,596,724 A | 1/1997 | Mullins et al. | |
| 5,602,780 A | 2/1997 | Diem et al. | |
| 5,636,342 A | 6/1997 | Jeffries | |
| 5,671,178 A | 9/1997 | Park et al. | |
| 5,721,840 A | 2/1998 | Soga | |
| 5,740,379 A | 4/1998 | Hartwig | |
| 5,761,146 A | 6/1998 | Yoo et al. | |
| 5,771,199 A | 6/1998 | Lee | |
| 5,802,006 A | 9/1998 | Ohta | |
| 5,806,070 A | 9/1998 | Norman et al. | |
| 5,809,070 A | 9/1998 | Krishnan et al. | |
| 5,818,785 A | 10/1998 | Ohshima | |
| 5,828,899 A | 10/1998 | Richard et al. | |
| 5,835,935 A | 11/1998 | Estakhri et al. | |
| 5,859,809 A | 1/1999 | Kim | |
| 5,872,994 A | 2/1999 | Akiyama et al. | |
| 5,937,425 A | 8/1999 | Ban | |
| 5,941,974 A | 8/1999 | Babin | |
| 5,959,930 A | 9/1999 | Sakuria | |
| 5,995,417 A | 11/1999 | Chen et al. | |
| 6,002,638 A | 12/1999 | John | |
| 6,009,479 A | 12/1999 | Jeffries | |
| 6,085,290 A | 7/2000 | Smith et al. | |
| 6,091,660 A | 7/2000 | Sasaki et al. | |
| 6,107,658 A | 8/2000 | Itoh et al. | |
| 6,144,576 A | 11/2000 | Leddige et al. | |
| 6,148,364 A | 11/2000 | Srinivasan et al. | |
| 6,178,135 B1 | 1/2001 | Kang | |
| 6,304,921 B1 | 10/2001 | Rooke | |
| 6,317,350 B1 | 11/2001 | Pereira et al. | |
| 6,317,352 B1 | 11/2001 | Halbert et al. | |
| 6,317,812 B1 | 11/2001 | Lofgren et al. | |
| 6,438,064 B2 | 8/2002 | Ooishi | |
| 6,442,098 B1 | 8/2002 | Kengeri | |
| 6,453,365 B1 | 9/2002 | Habot | |
| 6,535,948 B1 | 3/2003 | Wheeler et al. | |
| 6,567,904 B1 | 5/2003 | Khandekar et al. | |
| 6,584,303 B1 | 6/2003 | Kingswood et al. | |
| 6,594,183 B1 | 7/2003 | Lofgren et al. | |
| 6,601,199 B1 | 7/2003 | Fukuda et al. | |
| 6,611,466 B2 | 8/2003 | Lee et al. | |
| 6,658,509 B1 | 12/2003 | Bonella et al. | |
| 6,658,582 B1 | 12/2003 | Han | |
| 6,680,904 B1 | 1/2004 | Kaplan et al. | |
| 6,715,044 B2 | 3/2004 | Lofgren et al. | |
| 6,718,432 B1 | 4/2004 | Srinivasan | |
| 6,732,221 B2 | 5/2004 | Ban | |
| 6,754,807 B1 | 6/2004 | Parthasarathy et al. | |
| 6,763,426 B1 | 7/2004 | James et al. | |
| 6,807,103 B2 | 10/2004 | Cavaleri et al. | |
| 6,816,933 B1 | 11/2004 | Andreas | |
| 6,850,443 B2 | 2/2005 | Lofgren et al. | |
| 6,853,557 B1 | 2/2005 | Haba et al. | |
| 6,853,573 B2 | 2/2005 | Kim et al. | |
| 6,928,501 B2 | 8/2005 | Andreas et al. | |
| 6,944,697 B2 | 9/2005 | Andreas | |
| 6,950,325 B1 | 9/2005 | Chen | |
| 6,967,874 B2 | 11/2005 | Hosono | |
| 6,996,644 B2 | 2/2006 | Schoch et al. | |
| 7,032,039 B2 | 4/2006 | DeCaro | |
| 7,043,630 B1 * | 5/2006 | Xia | 713/1 |
| 7,073,022 B2 | 7/2006 | El-Batal et al. | |
| 2002/0188781 A1 | 12/2002 | Schoch et al. | |
| 2003/0009760 A1 * | 1/2003 | Sakamoto et al. | 725/74 |
| 2003/0074505 A1 | 4/2003 | Andreas et al. | |
| 2003/0128702 A1 | 7/2003 | Satoh et al. | |
| 2003/0221061 A1 | 11/2003 | El-Batal et al. | |
| 2004/0001380 A1 | 1/2004 | Becca et al. | |
| 2004/0019736 A1 | 1/2004 | Kim et al. | |
| 2004/0024960 A1 | 2/2004 | King et al. | |
| 2004/0039854 A1 | 2/2004 | Estakhri et al. | |
| 2004/0148482 A1 | 7/2004 | Grundy et al. | |
| 2004/0199721 A1 | 10/2004 | Chen | |
| 2004/0230738 A1 | 11/2004 | Lim et al. | |
| 2005/0160218 A1 | 7/2005 | See et al. | |
| 2005/0213421 A1 | 9/2005 | Polizzi et al. | |
| 2005/0273539 A1 | 12/2005 | Yamamoto | |
| 2006/0050594 A1 | 3/2006 | Park | |
| 2006/0200602 A1 | 9/2006 | James | |

OTHER PUBLICATIONS

PCT Patent Application No. PCT/CA2007/002193 International Search Report dated Apr. 7, 2008.
PCT Patent Application No. PCT/CA2007/002171 International Search Report dated Mar. 17, 2008.
PCT Patent Application No. PCT/CCA2007/002173 International Search Report dated Apr. 7, 2008.
PCT Patent Application No. PCT/CA2007/002182 International Search Report dated Mar. 18, 2008.
Samsung Electronics Co. Ltd, "256M×8 Bit / 128 M×16 Bit / 512M×8 Bit NAND Flash Memory", K9K4G08U1M, May 6, 2005, pp. 1-41.
Toshiba, "2GBIT (256M×8 Bits) CMOS NAND E2PROM", TH58NVG1S3AFT05, May 19, 2003, pp. 1-32.
Amtel Corp., "High Speed Small Sectored SPI Flash Memory", pp. 1-22, 2006.
64 Megabit CMOS 3.0 Volt Flash Memory with 50MHz SPI, Spansion, pp. 1-22 (2006).
King, et al., "Communicating with Daisy Chained MCP42XXX Digital Potentiometers", Microchip AN747, pp. 1-8, 2001.
Intel Corporation, "Intel® Advanced+ Boot Block Flash Memory (C3)", May 2005, pp. 1-72.
M-Systems Flash Disk Pioneers Ltd., "DiskOnChip H1 4Gb (512MByte) and 8Gb (1 GByte) High Capacity Flash Disk with NAND and x2 Technology", Data Sheet, Rev. 0.5 (Preliminary), pp. 1-66, 2005.
Tal, A., "Guidelines for Integrating DiskOnChip in a Host System", AP-DOC-1004, Rev. 1.0, M-Systems Flash Pioneers Ltd., pp. 1-15, 2004.
Samsung Electronics Co. Ltd, OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, pp. 1-125, Dec. 23, 2005.
Kennedy, J., et al., "A 2Gb/s Point-to-Point Heterogeneous Voltage Capable DRAM Interface for Capacity-Scalable Memory Subsystems", ISSCC 2004/Session 1/DRAM/11.8, IEEE International Solid-State Circuits Conference, Feb. 15-19, 2004, vol. 1, pp. 214-523.
Kim, Jae-Kwan, et al., "A 3.6Gb/s/pin Simultaneous Bidirectional (SBD) I/O Interface for High-Speed DRAM", ISSCC 2004/Session 22/DSL and Multi-Gb/s I/O 22.7, IEEE International Solid-State Circuits Conference Feb. 15-19, 2004, vol. 1, pp. 414-415.

"HyperTransport TM I/O Link Specification", Revision 2.00, Document No. HTC20031217-0036-00, Hypertransport Technology Consortium, pp. 1-325, 2001.

"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. i-91, (Mar. 1996).

Oshima, et al., "High-Speed Memory Architectures for Multimedia Applications", Circuits & Devices, IEEE 8755-3996/97, pp. 8-13, Jan. 1997.

Gjessing, S., et al., "RamLink: A High-Bandwidth Point-to-Point Memory Architecture", Proceedings CompCom 1992, IEEE 0-8186-2655-0/92, pp. 328-331, Feb. 24-28, 1992.

Gjessing, S., et al., "Performance of the RamLink Memory Architecture", Proceedings of the Twenty-Seventh Annual Hawaii International Conference on System Sciences, IEEE 1060-3425/94, pp. 154-162, Jan. 1994.

Gjessing, S., et al., "A RAM Link for High Speed", Special Report/Memory, IEEE Spectrum, pp. 52-53, Oct. 1992.

Diamond, S.L., "SyncLink: High: High-speed DRAM for the Future", Micro Standards, IEEE Micro, pp. 74-75, Dec. 1996.

Samsung Electronics, "DDR2 Fully Buffered DIMM 240pin FBDIMMS based on 512Mb C-die" Rev. 1.3, Sep. 2006, pp. 1-32, Sep. 2006.

HyperTransport TM I/O Link Specification, Revision 3.00, Document No. HTC20051222-0046-0008, Hypertransport Technology Consortium, pp. 1-428, Apr. 2006.

"8-megabit 2.5-volt Only or 2.7-volt Only DataFlash®," Technical Specification, Atmel, Rev. 2225H-DFLSH (2004).

Samsung Electronics, "K9XXG08UXM Preliminary Flash Memory," Technical Specification, Samsung Electronics.

"1024K12C™ CMOS Serial EEPROM," Technical Specification, Microchip Technology Inc., (2006).

The I2C-Bus Specification, Version 2.1, Philips Semiconductors, Jan. 2000.

"16 Mbit LPC Serial Flash," Preliminary Specification, Silicon Storage Technology Inc., (2006).

"16 Mbit SPI Serial Flash," Preliminary Specification, Silicon Storage Technology Inc., (2005).

"2Mbit, Low Voltage, Serial Flash Memory with 40 Mhz SPI Bus Interface," Technical Specification, STMicroelectronics Group of Companies (2005).

"NAND Flash Applications Design Guide," Revision 1.0, Toshiba America Electronic Components, Inc., (Apr. 2003).

* cited by examiner

APPARATUS AND METHOD FOR PRODUCING IDENTIFIERS REGARDLESS OF MIXED DEVICE TYPE IN A SERIAL INTERCONNECTION

CROSS REFERENCE TO RELATED APPLICATIONS

This application claims the benefit of priority from U.S. Provisional Patent Application No. 60/889,572 filed Feb. 13, 2007, the disclosure of which is expressly incorporated herein by reference in its entirety and from U.S. Provisional Patent Application No. 60/868,773 filed Dec. 6, 2006.

FIELD OF THE INVENTION

The present invention relates generally to semiconductor device systems. More particularly, the present invention relates to apparatus and method for producing device identifiers for a serial interconnection configuration of devices of mixed type.

BACKGROUND OF THE INVENTION

Current electronic equipment uses semiconductor devices, such as, for example, memory devices and processing devices. For example, mobile electronic products such as, for example, digital cameras, portable digital assistants, portable audio/video players and mobile terminals continue to require mass storage memories, preferably non-volatile memory with ever increasing capacities and speed capabilities. Non-volatile memory and hard disk drives are preferred since data is retained in the absence of power, thus extending battery life.

While existing memory devices operate at speeds sufficient for many current consumer electronic equipment, such memory devices may not be adequate for use in future electronic products and other products where high data rates are desired. For example, a mobile multimedia device that records high definition moving pictures is likely to require a memory module with a greater programming throughput than one with current memory technology. While such a solution appears to be straightforward, there is a problem with signal quality at such high frequencies, which sets a practical limitation on the operating frequency of the memory. The memory communicates with other components using a set of parallel input/output (I/O) pins, the number of which depends on the desired configuration. The I/O pins receive command instructions and input data and provides output data. This is commonly known as a parallel interface. High speed operation may cause deleterious communication effects such as, for example, cross-talk, signal skew and signal attenuation, which degrade signal quality.

In order to incorporate higher density and faster operation on the system boards, there are two design techniques possible: multi-drop and serial interconnection configurations. These design techniques may be used to overcome the density issue that determines the cost and operating efficiency of memory swapping between a hard disk and a memory system. However, multi-drop configurations have shortcomings relative to the serial interconnection of memory systems. For example, if the number of multi-drop memory systems increases, as a result of the loading effect of each pin, the delay time also increases so that the total performance of multi-drop is degraded by the multi-drop connection caused by the wire resistor-capacitor loading and the pin capacitance of the memory device. A serial link may provide a serial interconnection configuration to control command bits, address bits, and data bits effectively through the serial interconnection. In the serial interconnection configuration, each device is identified by a device identifier or a device address.

SUMMARY OF THE INVENTION

In accordance with an aspect of the present invention, there is provided a system comprising: a signal processor capable of outputting a serial input signal and receiving a serial output signal; and a serial interconnection configuration of first to N-th devices of mixed type, N being an integer greater than one. Each of the devices has a serial input connection and a serial output connection. Each of the devices is capable of determining a device type (DT) and providing a combination of the DT and a device identifier (ID). The serial input connection of one of the devices is coupled to the signal processor or the serial output connection of a previous device. The serial output connection of the one of the devices is coupled to the serial input connection of a next device or the signal processor. The serial signal provided to the serial input connection of the first device from the signal processor is propagated through the N devices with or without being altered. The propagated serial input signal is outputted from the serial output connection of the N-th device as the serial output signal received by the signal processor.

For example, each of the devices comprises: a receiver for receiving an ID and a DT provided through the serial input connection of the device; a determiner for determining the DT of the device from the received DT; an output ID provider for outputting an ID in response to a determination result; an information provider for providing a combination of the received DT and the outputted ID; and a device type provider for providing device type information (DTI) associated with the device as a reference DT.

Advantageously, the output ID provider includes: a calculator for performing a calculation based on the received ID and a pre-defined value to produce a calculated ID; and a selector for selecting the received ID or the calculated ID in response to the determination result, the selected ID being outputted from the ID provider.

For example, the determiner includes a comparator for comparing the received DT with the reference DT to provide the determination result. A selector may select the received ID or the calculated ID in response to the determination result. The selected ID being outputted to the information provider.

Advantageously, the DT and ID are transmitted as a packet. For example, the packet includes an ID generation command. A packet interpreter may interpret the ID generation command and the received DT.

The information provider may further include a combiner for combining the ID generation command, the DT and the ID; and a packet output provider for providing the combined command, DT and ID as a packet.

In accordance with another aspect of the present invention, there is provided a method for assigning a device identifier for a plurality of devices of mixed type in a serial interconnection configuration, a first device having a serial input connection coupled to a serial output connection of a previous device, a second device having a serial input connection coupled to a serial output connection of the first device, the method being adopted to at least one of the devices. The method comprises: receiving a device identifier (ID) and a device type (DT) through the serial input connection of the first device; performing: a first determination of whether the DT of the device contains pre-defined data corresponding to one including all device types to provide a first determination result; and a second determination of the DT of the device in response to the received DT to provide a second determination result; and outputting a device ID in response to the first and second determination results.

For example, the step of performing comprises: performing the first determination whether the received DT of the device matches a pre-defined data; and performing the second determination of whether the received DT matches a reference DT assigned to the device. The step of the first determination comprises: providing a pre-defined value as the pre-defined data that corresponds to any of the types of devices. The step of performing the second determination comprises: providing the reference DT programmably.

Advantageously, the first determination is performed by a decoder for decoding the received DT to produce the first determination result when the pre-defined data is detected. The second determination is performed by a comparator to compare the received DT with the provided reference DT to provide the second determination result. Alternatively, the first determination is performed by another comparator for comparing the received DT with the pre-defined data to make a decision whether the pre-defined data is contained in the received DT.

In accordance with a further aspect of the present invention, there is provided an apparatus for assigning a device identifier at a first device coupled to a second device in a serial interconnection configuration, the first device having a serial input connection coupled to a serial output connection of a previous device in the serial interconnection configuration, the second device having a serial input connection coupled to a serial output connection of the first device, the devices being of different types. The apparatus comprises: a receiver for receiving an ID and a device type (DT) provided through the serial input connection of the device; a determiner for performing: a first determination of whether the DT of the device contains pre-defined data corresponding to one including all device types to provide a first determination result; and a second determination of the DT of the device based on the received DT to provide a second determination result; and an output ID provider for outputting a device identifier (ID) in response to the first and second determination results.

For example, the output ID provider comprises: a calculator for performing the calculation of the received ID with a pre-defined value; and a selector for selecting the received ID or the calculated ID depending upon the determination result, the selected ID being outputted through the output connection of the device.

The apparatus may further comprise a device type provider for providing device type information (DTI) of the device. For example, the determiner comprises: a first comparator for comparing the received DT with the pre-defined data to provide the first determination result; and a second comparator for comparing the received DT with the provided DTI to provide the second determination result.

In accordance with yet a further aspect of the present invention, there is provided a system comprising a plurality of devices of mixed type in a serial interconnection configuration, a first device having a serial input connection coupled to a serial output connection of a previous device, a second device having a serial input connection coupled to a serial output connection of the first device. At least one of the devices comprises: a receiver for receiving a device identifier (ID) and a device type (DT) provided through the serial input connection of the device; a determiner for determining the DT of the device based on the received DT or whether the DT of the device contains pre-defined data corresponding to one including all device types; and an output ID provider for outputting an ID in response to the determination result.

In accordance with yet a further aspect of the present invention, there is provided a method for assigning a device identifier for a plurality of devices of mixed type in a serial interconnection configuration, a first device having a serial input connection coupled to a serial output connection of a previous device, a second device having a serial input connection coupled to a serial output connection of the first device. The method comprises: providing a device type (DT) to a device; holding the provided DT at the device; determining whether the DT matches a reference DT associated with the device; determining whether the DT of the device contains pre-defined data corresponding to one including all device types; outputting a device identifier (ID) to one of the device in the serial interconnection configuration, through the serial input connection of that device; and at the device wherein the ID is provided, conducting an ID assignment in response to the determination results at that device.

In accordance with yet a further aspect of the present invention, there is provided a method for assigning a device identifier associated with a serial interconnection configuration of N devices of mixed type, N being an integer greater than one, a first device having a serial input connection coupled to a serial output connection of a previous device, a second device having a serial input connection coupled to a serial output connection of the first device. The method comprises: at each of the devices, determining a device type (DT); providing a serial input signal to the first device of the serial interconnection configuration, the serial input signal being propagated through the N devices with or without being altered; and in response to a serial output signal from the N-th device provided to the signal processor, recognizing a last device identifier (ID).

For example, the step of recognizing comprises: performing the recognition of the number of the devices in response to the recognized last ID.

In accordance with yet a further aspect of the present invention, there is provided a method for use in a serial interconnection configuration of N devices of mixed type, N being an integer greater than one, a first device having a serial input connection coupled to a serial output connection of a previous device, a second device having a serial input connection coupled to a serial output connection of the first device, each of the devices determining a device type (DT) and providing a combination of the DT and a device identifier (ID). The method comprises: providing a serial input signal to the first device of the serial interconnection configuration, the serial input signal being propagated through the N device with or without being altered; and receiving a serial output signal provided from the N-th device.

For example, the step of receiving comprises: recognizing an ID number contained in the propagated serial input signal from the serial output connection of the N-th device.

Advantageously, the step of providing comprises: providing a unique DT accompanied with an initial ID number contained in the serial input signal to the first device of the serial interconnection configuration, the unique DT matching any of the types of the devices, the propagated serial input signal containing an ID number altered by the device in response to a determination result. The step of recognizing comprises: receiving the propagated serial output signal containing the ID number accompanied with the unique DT from the N-th device; and recognizing the number of the devices in the serial interconnection configuration based on the received ID number.

The step of providing may further comprise: providing an ID generation command; and combining the ID generation command, the initial ID number and the unique DT. Advantageously, the DT and ID are transmitted as a packet.

In accordance with yet a further aspect of the present invention, there is provided a machine-readable medium storing commands and instructions which, when executed, cause a processor to perform a method of receiving an output signal from a last device of N devices of mixed type in a serial interconnection, N being an integer greater than one, a first device having a serial input connection coupled to a serial output connection of a previous device, a second device having a serial input connection coupled to a serial output connection of the first device, each of the devices determining a device type (DT) and providing a combination of the DT and a device identifier (ID). The method comprises: providing a serial input signal to the first device of the serial interconnection configuration, the serial input signal being propagated through the N device with or without being altered; and receiving a serial output signal provided from the N-th device.

In accordance with yet a further aspect of the present invention, there is provided a machine-readable medium storing commands and instructions which, when executed, cause a processor to perform a method of assigning a device identifier (ID) for a plurality of devices of mixed type in a serial interconnection configuration, a first device having a serial input connection coupled to a serial output connection of a previous device, a second device having a serial input connection coupled to a serial output connection of the first device, the method being adopted to at least one of the devices. The method comprises: receiving an ID and a device type (DT) through the serial input connection of the first device; performing: a first determination of whether the DT of the device contains pre-defined data corresponding to one including all device types to provide a first determination result; and a second determination of the DT of the device in response to the received DT to provide a second determination result; and outputting a device ID in response to the first and second determination results.

In accordance with an embodiment, there is provided a plurality of memory devices of mixed type that is serially interconnected. The devices are, for example, random access memories and Flash memories. Each device has device type information on its device type. An ID generation command, a specific device type (DT) and a device identifier (ID) are provided by a memory controller to a device that determines whether the fed DT matches the device's DT. If there is a match between them, an addition of ID is performed in the device to produce an ID. If there is no DT match, no addition is performed in the device (i.e., the ID production is skipped or bypassed). The added ID (the produced ID) or the fed ID (the non-calculated ID) is selected and the selected ID accompanying the fed DT is transferred to a next device in the serial interconnection configuration. Such a device type match determination and ID production or skip are performed in all devices of the serial interconnection configuration. With reference to device type provided to the interconnected devices, IDs are sequentially generated. The Serial Input (SI) containing the DT, the ID and an ID generation command is transmitted in a packet basis to a next device. The memory controller can recognize the total number of one DT, in response to the ID received from the last device. In a case of a "don't care" DT is provided to the interconnected devices, IDs are sequentially generated and the total number of the interconnected devices is recognized, regardless of the difference in DTs.

In accordance with an embodiment, there is provided an ID generation with skip function for serially interconnected memory devices of mixed type, in accordance with the device types. The devices may be random access memories such as dynamic random access memory (DRAM), static random access memory (SRAM), magnetoresistive random access memory (MRAM) and Flash memories such as NAND-, NOR- and AND-types.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached figures, wherein.

DETAILED DESCRIPTION

Figure 1:
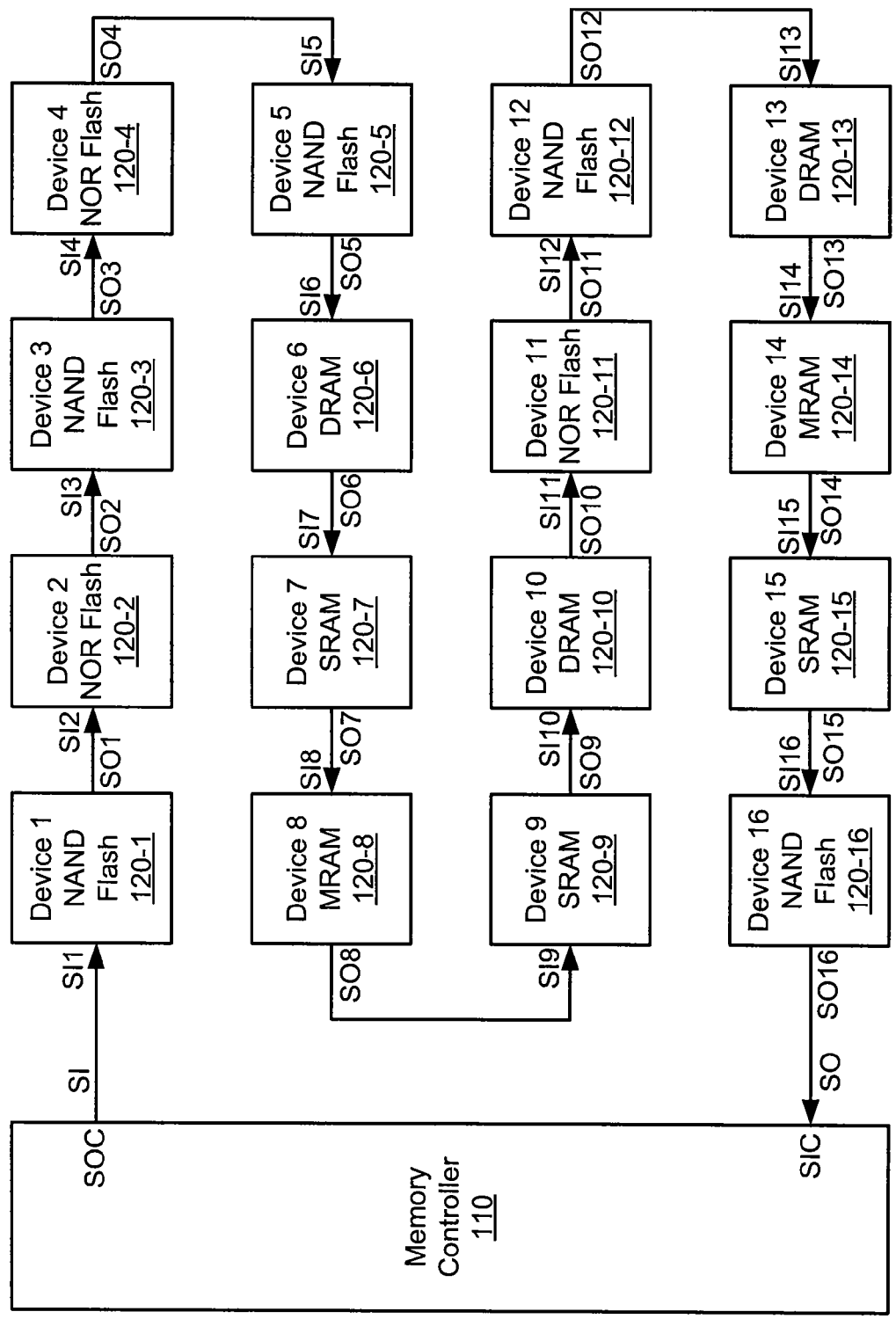
FIG. 1 is a block diagram illustrating a system including a plurality of devices in a serial interconnection configuration to which embodiments of the present invention are applied.

In the following detailed description of embodiments of the present invention, reference is made to the accompanying drawings which form a part hereof, and in which is shown by way of illustration of embodiments in which the present invention may be practiced. These embodiments are described in sufficient detail to enable those of ordinary skill in the art to practice the present invention, and it is to be understood that other embodiments may be utilized and that logical, electrical, and other changes may be made without departing from the scope of the present invention. The following detailed description is, therefore, not to be taken in a limiting sense, and the scope of the present invention is defined by the appended claims.

Generally, the present invention provides apparatus and method for producing device identifiers in serially interconnected devices.

Some memory subsystems employ multiple memory devices, such as Flash memory devices, with serial interfaces. Here, the command string may be fed to all of the devices even though the command may only be performed on one of the devices. To select the device on which the command is to be performed, the command string may contain a device identifier (ID) or a device address that identifies the memory device to which the command is directed. Each device receiving the command string compares the ID contained in the command string to an ID associated with the device. If the two match, the device will assumes that the command is directed to the device to execute the command.

The above-described arrangement needs to assign an ID for each device. One technique that may be used to assign an ID for a device is to hardwire an internal unique ID into the device. One drawback with this approach, however, is that if large volumes of devices are used, the size of the ID may have to be quite large in order to ensure that each device contains a unique ID. Managing a large-sized ID may add significant complexity to the device which in turn may increase the cost of producing the device. In addition, reclaiming IDs that are associated with devices that are no longer in use may further add to the complexity of this scheme.

Another approach to assigning IDs to devices involves externally hardwiring an ID for each device. Here, the ID may be specified by wiring various pins on the device to certain states to assign an ID for the device. The device reads the wired state of the pins and assigns its ID from the read state. One drawback with this approach, however, is that external wiring is needed to assign the ID for each device. This may add to the complexity of, e.g., printed circuit boards (PCBs) that hold the memory devices. Another drawback with this approach is that it may require pins to be dedicated for the assignment of the ID. This may consume precious resources that may be otherwise better used. In addition, dedicating pins for the assignment of the ID may require a greater footprint for the device than if pins were not used to assign the ID.

At least some of embodiments of the present invention address at least some of these shortcomings. At least some example embodiments automatically assign an ID for a device, for example, in a serial interconnection configuration, in a manner that does not require special internal or external hardwiring of the ID. According to an aspect of the techniques described herein, an input signal is transferred to a first device in an arrangement including multiple devices (e.g., a serial interconnection configuration) using inputs that are also used by the first device to input other information to the device (e.g., data, commands, control signals). A generator generates an ID in response to the input signal. A transmitter transfers an output signal associated with the ID to a second device through a serial output of the first device. The serial output may also be used by the first device to output other information (e.g., signals, data) to another device in the configuration.

In an embodiment of the techniques described herein, a write ID operation is initiated at a device in a serial interconnection configuration of memory devices of mixed type to cause the device to produce an ID. A first device receives information on a device type (DT) and a first value by acquiring the state of one or more inputs of the first device. If the received DT matches the device type of the first device, it will generate an ID from the first value, which may include placing the first value in storage (e.g., an ID register) associated with the device. The first device generates a second value from the acquired state. The first device outputs a second value via an output of the first device to a second device in the serial interconnection configuration. The second device inputs the value output by the first device and repeats this process to generate an ID.

Embodiments of the present invention will now be described in conjunction with the ID generation in a packet basis wherein during an ID generation operation, an ID generation command is serially transferred through the serial interconnection of devices. A device receives serial packet basis commands at the serial input thereof in response to clocks and interprets them for ID generation. A packet based ID generation is disclosed in U.S. patent application Ser. No. 11/529,293 filed Sep. 29, 2006 entitled "Packet Based ID Generation for Serially Interconnected Devices", the content of which is entirely incorporated herein by reference. Also, details of ID generation for a serial interconnection configuration of memory devices of mixed type are disclosed in U.S. Provisional Patent Application No. 60/887,401 filed Jan. 31, 2007, the content of which is entirely incorporated herein by reference.

FIG. 1 shows a system including a plurality of (N) devices of mixed type in a serial interconnection configuration and a memory controller, in which embodiments of the present invention are implemented. In this particular example, N is 16 and 16 devices are serially interconnected. The devices' types are mixed and the memory devices included in the serial interconnection configuration are of any type of memories, such as, for example, random access memories and Flash memories. For example, the random access memories are DRAM, SRAM and MRAM and the Flash memories are NAND-type, NOR-type, AND-type, and other types of Flash memories. In the particular example shown in FIG. 1, devices 1, 3, 5, 12 and 16 are NAND Flash devices; devices 2, 4 and 11 are NOR Flash devices; devices 6, 10 and 13 are DRAM devices; devices 7, 9 and 15 are SRAM devices; and devices 8 and 14 are MRAM devices. A signal processor, such as, for example, a memory controller 110 is connected to the first and last devices in the serial interconnection configuration. The memory controller 110 sends a serial input SI from its signal output connection (SOC) to device 1, 120-1, and receives a serial output SO at its signal input connection (SIC) from device 16, 120-16.

The serial interconnection configuration shown in FIG. 1 includes NAND and NOR Flash devices and DRAM, SRAM and MRAM devices only. Those of ordinary skill in the art understand that the serial interconnection configuration, such as the one shown in FIG. 1, can include any other type of memory devices.

The data inputted as the SI to a serial input port (SIP) connection of each device contains various information for system operation. In a normal operation mode of the system, the SI includes data to be processed by an intended device (e.g., device 3) and its processed data is outputted as serial output data from its serial output port (SOP) connection. Due to the nature of the serial interconnection configuration, an intended device for receipt of the serial data needs to be identified for data processing. Such an identifier is attached to the serial data as an ID. For example, the ID for device 3, 120-3, is provided by the memory controller 110. The size of the ID depends on the requirements of the system. Then, device 3 provides a serial output SO3 from its SOP connection, the SO3 being fed, as the SI4, to device 4, 120-4. Similarly, device 120-4 provides a serial output SO4, as the SI5, to device 5, 120-5. As such, each device receives serial input data through its SIP connection from a previous device and provides serial output data to a next device through its SOP connection. In an ID generation mode of the system, prior to the normal operation mode, IDs are generated and assigned to relevant devices.

The following description will give details of the ID generation operation and apparatuses and systems for performing the ID generation function.

Figure 2A:
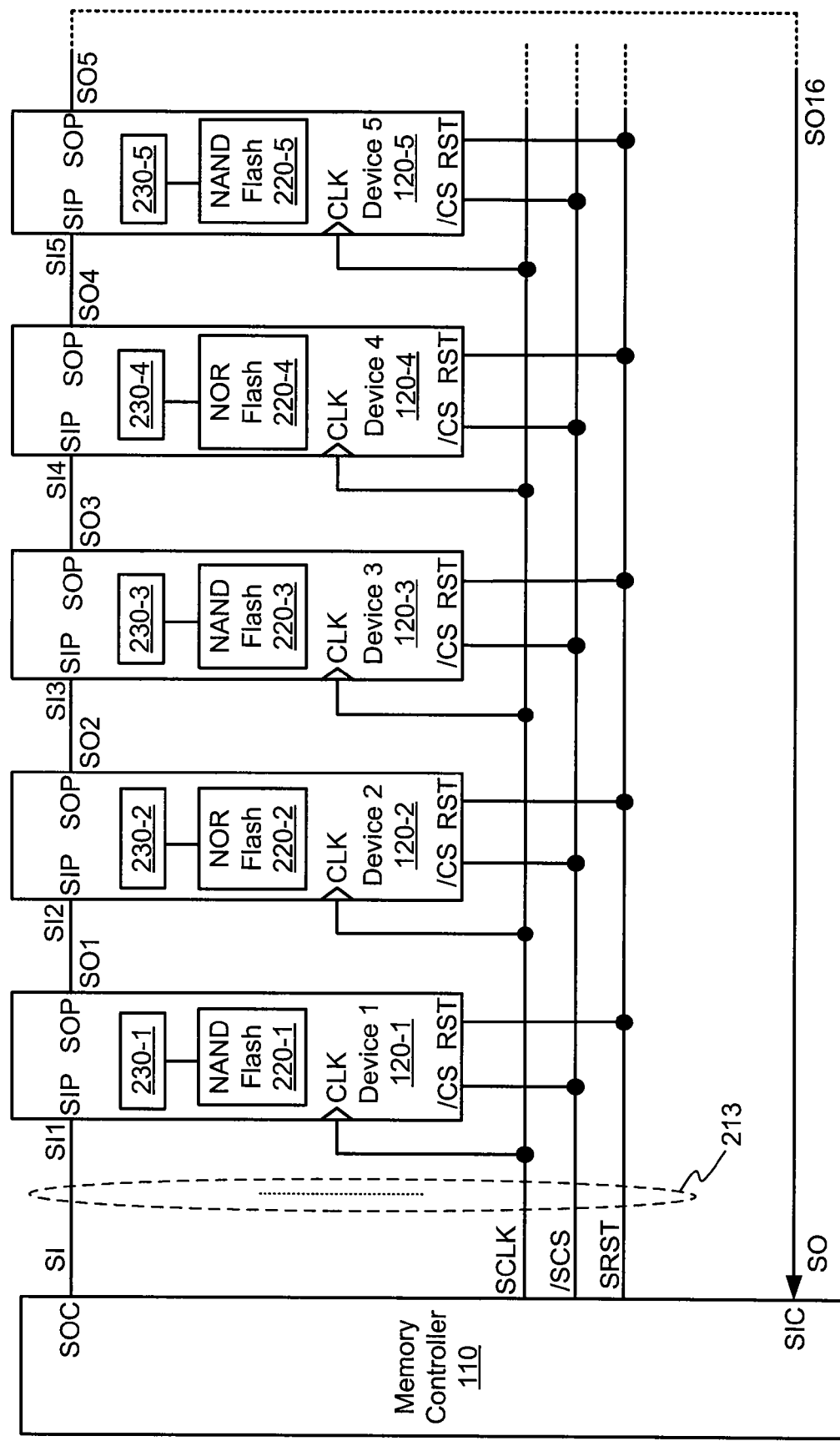
FIG. 2A is a block diagram illustrating the system including part of the plurality of devices in the serial interconnection configuration shown in FIG. 1.

FIG. 2A shows details of part of the system of FIG. 1. Referring to FIG. 2A, part of the serial interconnection configuration includes devices 1-5 (120-1-120-5), which include memories 220-1-220-5 therein, respectively. Each of the memories 220-1, 220-3 and 220-5 is a NAND-type Flash memory. Each of the memories 220-2 and 220-4 is a NOR-type Flash memory. For example, a system implementing such an arrangement of different type or a mixed-device serial interconnection may require that only devices of a certain type (e.g., NAND Flash devices) be assigned IDs. Alternatively, the system may require that all devices be assigned IDs, but that all devices of the same type be assigned IDs in a consecutive sequence. In order to meet such requirements in a system implementing ID generation as described above, devices 1-5 (120-1-120-5) are provided with device controllers 230-1-230-5, respectively. One of functions performed by the device controller is to assign an ID based on the device type.

Each of the serially interconnected devices has a similar structure with the exception of the memory and the device type. Each of the devices includes an SIP connection, an SOP connection, a chip select input (/CS), a clock input (CLK) and a reset input (RST). The memory controller 110 provides a group of signals 213 containing information on the chip select /SCS, serial input SI, clock SCLK, reset SRST and other control and data information (not shown). In the particular example shown in FIG. 2A, the chip select signal /SCS, the clock signal SCLK and the reset signal SRST are commonly fed to all of the serially interconnected devices.

The serial input SI is fed from the SOC of the memory controller 110, as a serial input SI1, to the SIP connection of device 1, 120-1. Device 1 outputs a serial output SO1 from its SOP connection to a next device (i.e., device 2, 120-2). The memory controller 110 receives a serial output SO from the SOP connection of the last device (i.e., device 16) at its SIC. Each of the devices performs similar functions and thus, the serial input SI is propagated through the interconnected devices with or without being altered. The serial input to and the serial output from each device are transmitted as input and output packets, respectively.

Figure 2B:
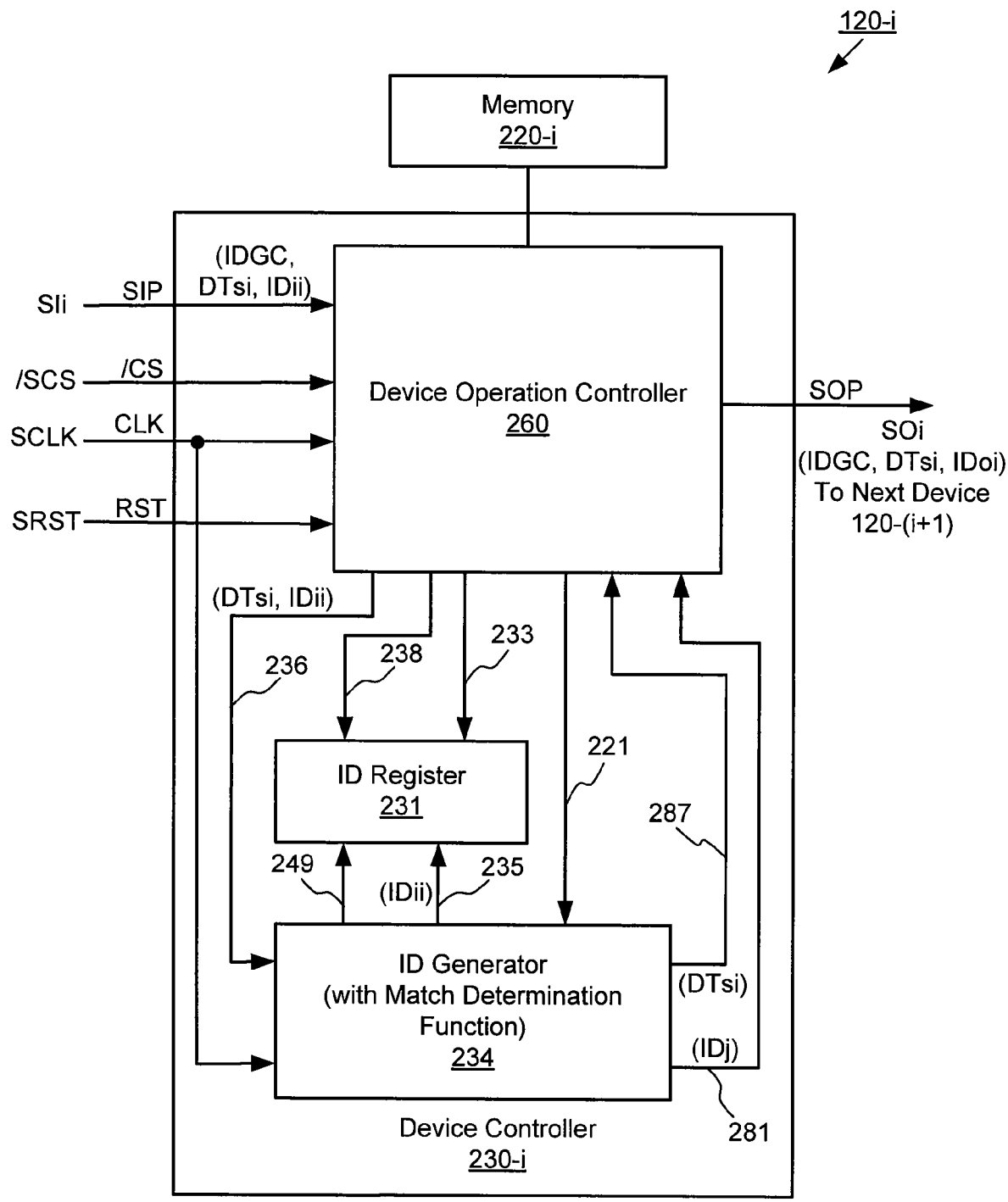
FIG. 2B is a block diagram illustrating one of the devices shown in FIG. 2A.

FIG. 2B shows details of a device 120-*i* which represents any of the devices 120-1-120-5 shown in FIG. 2A. Referring to FIG. 2B, the device 120-*i* includes a memory 220-*i* and a device controller 230-*i* connected thereto. The device controller 230-*i* includes a device operation controller 260, an ID generator 234 and an ID register 231. The device operation controller 260 receives the serial input signal SI1, the chip select signal /SCS, the clock signal SCLK and the reset signal SRST and performs the functions of control and data processing. The serial input signal SI1 is fed by a previous device 120-(*i*−1) or the memory controller 110. The SI1 fed to the SIP connection of the device 120-*i* contains the commands and other signal data. In the example, the commands include an ID generation command IDGC of p bits (e.g., p being eight). The SI1 signal also includes information on a device type DTsi and a device identifier IDii. The serial input SI includes other commands (not shown). The device operation controller 260 provides a serial input information signal 236 containing the DTsi and the IDii and a DT determination control signal 221 to the ID generator 234 that is capable of DT match determination and ID generation.

The ID generator 234 determines whether a received device type matches a pre-defined device type. The received device type is the device type DTsi contained in the serial input SI1. The pre-defined device type is a reference DT, DTref, which is associated with the device 120-*i*. In the example, the reference DT, DTref, is provided by storage means (not shown) of the device 120-*i*. The ID generator 234 generates an ID, IDj, based on the received ID, IDii, to produce an ID for an ID assignment, in response to the determination result. The ID generator 234 provides a serial output ID signal 281 containing the IDj and a serial output DT signal 287 containing the DTsi to the device operation controller 260.

The produced ID by the ID generator 234 is outputted through the device operation controller 260 to a next device 120-($i$+1). The ID generator 234 provides an ID signal 235 and a DT match signal 249 to the ID register 231. The ID signal 235 contains an ID to be assigned to the present device 230-$i$. In this particular example, the assigned ID is equal to the received ID, IDii.

Figure 2C:
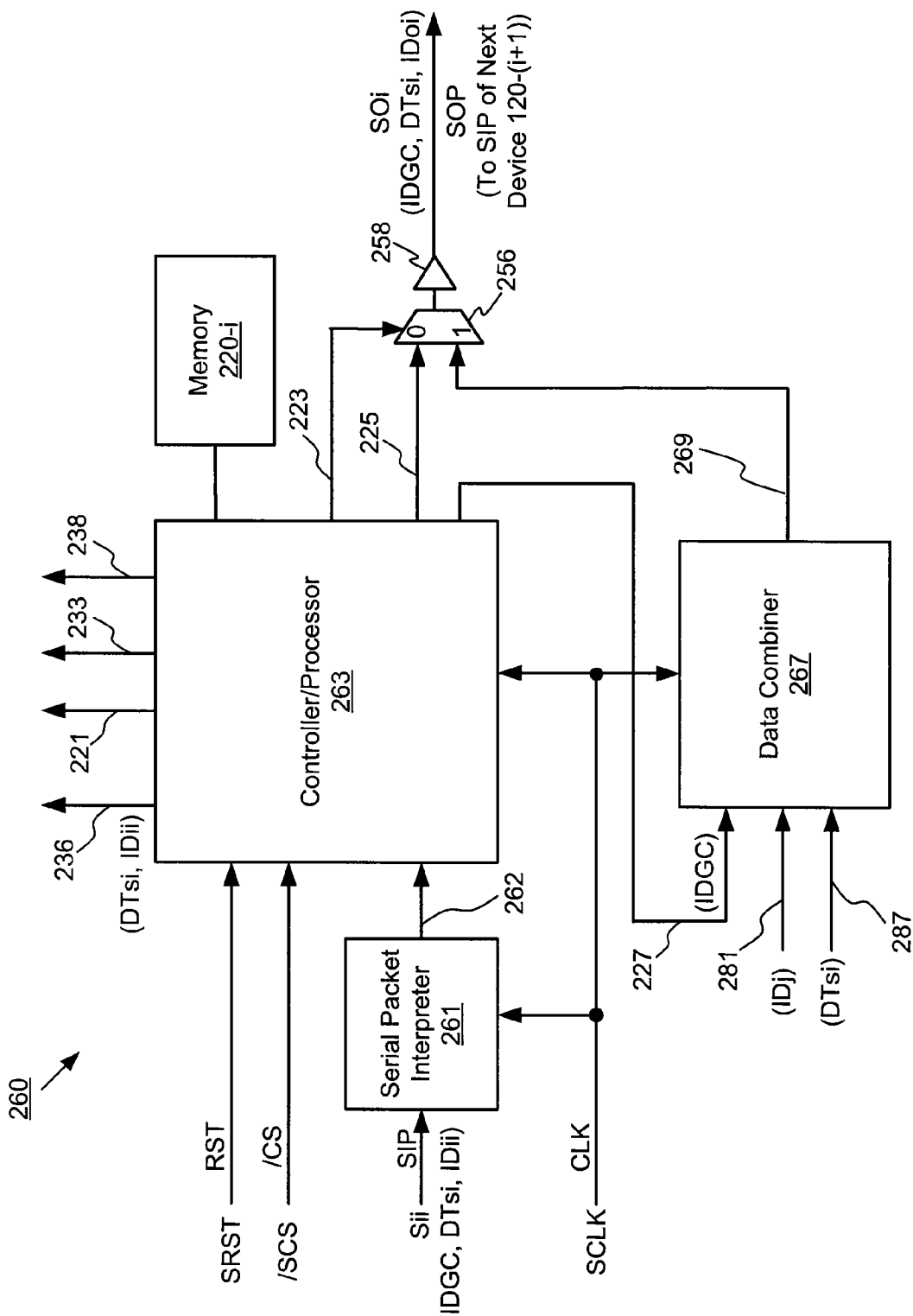
FIG. 2C is a block diagram illustrating an example of a device operation controller shown in FIG. 2B.

FIG. 2C shows details of the device operation controller 260 of FIG. 2B. Referring to FIGS. 2B and 2C, the device operation controller 260 includes a serial packet interpreter 261 that receives a packet of the serial input signal SI1 and the clock signal SCLK. The serial packet interpreter 261 includes a temporary register (not shown) for holding received packets and an interpreter (not shown) for interpreting the held packet bits. The serial packet interpreter outputs a packet interpreted signal 262 containing information or data included in the SI1. In the ID generation mode, an input packet contains the ID generation command IDGC, the device type DTsi, the device identifier IDii and others. A controller/processor 263 receives the packet interpreted signal 262, the chip select signal /SCS, the clock signal SCLK and the reset signal SRST and others. The controller/processor 263 provides the serial input information signal 236 and the DT determination control signal 221 to the ID generator 234. Also, the controller/processor 263 provides an ID write enable signal 233 and an internal reset signal 238 to the ID register 231. The controller/processor 263 accesses the memory 220-$i$ and provides a processed data signal 225 to a selector 256.

In response to the packet interpreted signal 262, the controller/processor 263 provides a command signal 227 containing a code of the ID generation command IDGC to a data combiner 267 and a data selection signal 223 to the selector 256. The IDGC is p-bit serial data. The data combiner 267 receives the clock signal SCLK, the serial output ID signal 281 containing the n-bit ID and the serial output DT signal 287 containing the m-bit DT from the ID generator 234. The data combiner 267 combines the ID generation command IDGC, the device type DTsi and the ID, IDj. A data combination signal 269 containing a combined IDGC-DT-ID is fed by the data combiner 267 to the selector 256. The selector 256 also receives the processed data signal 225 provided by the controller/processor 263 accessing the memory 220-$i$ of that device 120-$i$. In response to the data selection signal 223, the selector 256 selects one of the combined IDGC-DT-ID and the processed data. A selected data is provided through a buffer 258 to the next device 120-($i$+1).

In the normal operation mode, an input packet contains data to be captured and processed, addresses and others. Therefore, the controller/processor 263 has temporary registers for holding the data and addresses. As such registers do not operate in the ID generation mode, they are not shown in the drawings and no details of their operations are described here.

Figure 2D:
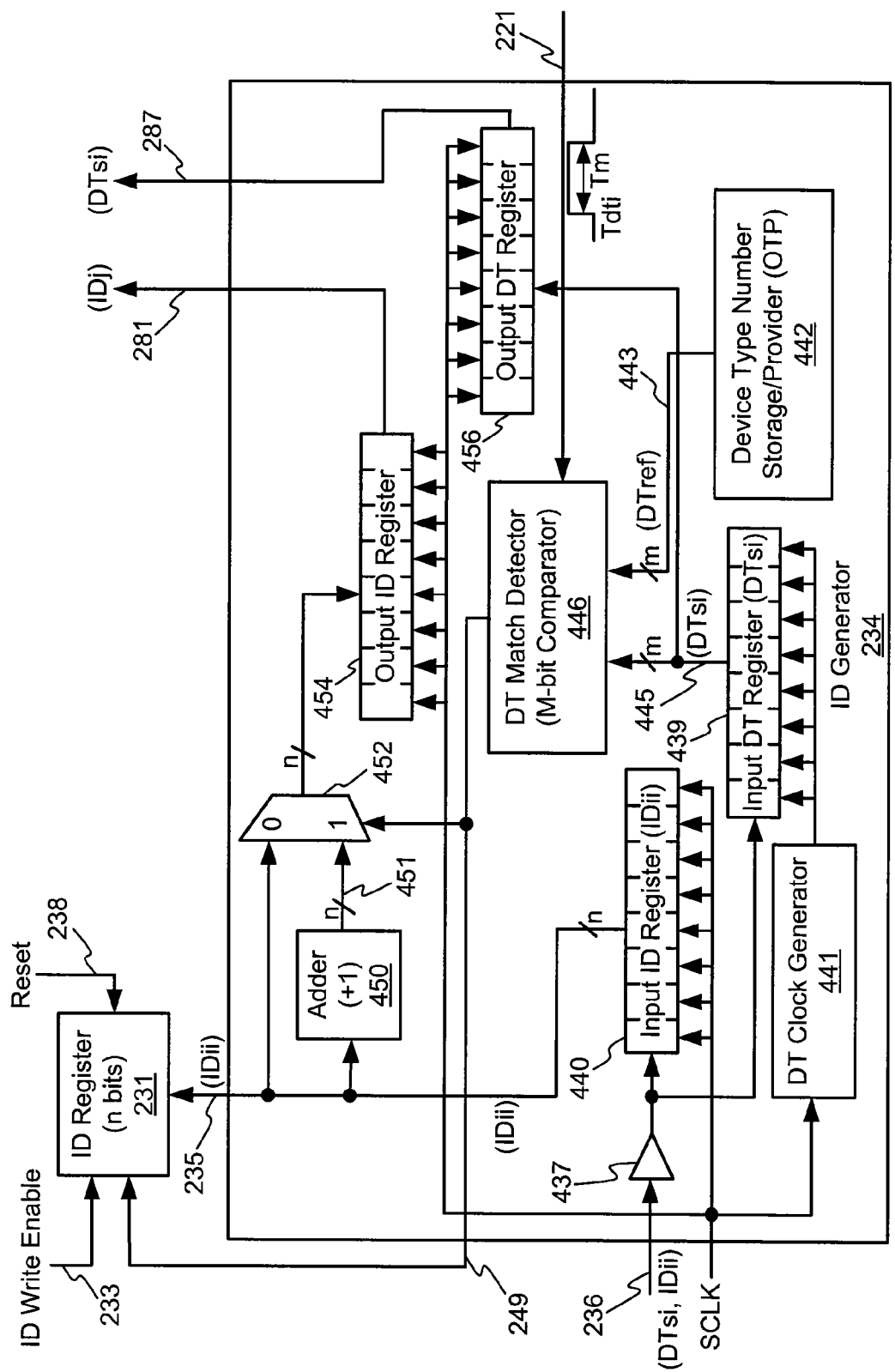
FIG. 2D is a block diagram illustrating an example of an ID generator shown in FIG. 2B.

FIG. 2D shows details of the ID generator 234 shown in FIG. 2B. Referring to FIGS. 2A-2D, the ID generator 234 includes a device type number storage/provider 442 of a one-time-programmable (OTP) element configured by a non-volatile memory. The OTP element stores a device type number as a device type reference (DTref) that is programmed to the device prior to the ID generation. Table 1 shows an example of the definition of device types in serialized byte code.

TABLE 1

| Device Type | HEX | Bit 7 | Bit 6 | Bit 5 | Bit 4 | Bit 3 | Bit 2 | Bit 1 | Bit 0 |
|---|---|---|---|---|---|---|---|---|---|
| NAND Flash (DTnd) | 00h | 0 | 0 | 0 | 0 | 0 | 0 | 0 | 0 |
| NOR Flash (DTnr) | 01h | 0 | 0 | 0 | 0 | 0 | 0 | 0 | 1 |
| AND Flash (DTad) | 02h | 0 | 0 | 0 | 0 | 0 | 0 | 1 | 0 |
| DRAM (DTdm) | 03h | 0 | 0 | 0 | 0 | 0 | 0 | 1 | 1 |
| SRAM (DTsm) | 04h | 0 | 0 | 0 | 0 | 0 | 1 | 0 | 0 |
| MRAM (DTmm) | 05h | 0 | 0 | 0 | 0 | 0 | 1 | 0 | 1 |
| — | — | — | — | — | — | — | — | — | — |
| — | — | — | — | — | — | — | — | — | — |
| Not Used* | FFh | 1 | 1 | 1 | 1 | 1 | 1 | 1 | 1 |

As shown in Table 1 (*), a device type of all bits being "1" is not used as a reference DT. Such a bit structure is predefined to use as a "don't care" device type. Implementation and use of a "don't care" value will be later described with reference to FIGS. 7A-13B.

Those of ordinary skill in the art will understand that the definitions of the device types in Table 1 can be changed and more device types can be added.

The ID generator 234 also includes a serial input buffer 437 that receives a value corresponding to a device type (DT), DTsi, which is a number of m bits (e.g., eight bits). The received SI1 signal includes a value corresponding to an ID, IDii, which is a number of n bits (e.g., eight bits). The clock signal SCLK is fed to an input ID register 440 and a device type (DT) clock generator 441 that generates a DT register clock signal internally in response to the clock signal SCLK to provide it to an input DT register 439. Each of the input ID register 440 and the input DT register 439 is a serial-to-parallel register that registers the input serial data therein in response to the clocks. The input ID register 440 and the input DT register 439 function as temporary registers to hold inputted IDii and DTsi. The m-bit DTsi is serially shifted into the input DT register 439 in response to the DT register clock signal and held therein. The n-bit IDii is serially shifted into the input ID register 440 in response to the clock signal SCLK and held therein.

The m-bit DTsi and the n-bit IDii separately held in the input DT register 439 and the input ID register 440 are outputted in parallel as an m-bit DT signal 445 and the ID signal 235 of n bits, respectively. The ID signal 235 is fed to a selector 452 and an adder 450 that provides a calculation signal 451 having a +1 operation value. The DT signal 445 is fed to a DT match detector 446 having an m-bit comparator (not shown). The DT match detector 446 receives an m-bit DT number, DTref, contained in a reference DT signal 443 from the DT number storage/provider 442. In response to the DT determination control signal 221, at determination time Tdti, the comparator of the DT match detector 446 compares the received DTsi to the reference DT, DTref, to provide the DT match signal 249. If the DTsi and the DTref are identical, the DT match signal 249 will become "high," indicating a match between the two numbers of the device types DTsi, DTref. Otherwise, the DT match signal 249 will be "low," indicating that the received DTsi specifies a type of device that is different from that of the present device 120-$i$ (i.e., no match). The DT match detector 446 outputs the "high" DT match signal having a pulse width, when a device type match occurs. The DT match signal 249 transits "low" in response to the trailing and falling edge of the DT determination control signal 221. A time period Tm of the DT determination control signal 221 is selected as that during the Tm, the +1 operation is completed and the addition result is transferred to an output ID register (a parallel-to-serial register) 454.

The adder 450 adds "1" to the IDii, thereby generating the calculation signal 451 containing an ID, IDii+1, for another device, in a sequence of IDs in the serial interconnection configuration. The adder 450 provides an appropriate function for ID generation when the selected sequence of ID numbers are consecutive integers from low to high.

Alternatively, the sequence of ID numbers could be any other numeral sequence, provided that the adder 450 is replaced with an alternative operator that enables the sequence. For example, the adder 450 could be replaced with a subtractor that subtracts "1" from the ID, IDii, thereby enabling a sequence of consecutive integers from high to low. It will be described later with reference to FIG. 15.

The selector 452 selects one of the two inputs (effectively "added (or altered) ID, IDii+1" and "non-added (or non-altered) ID, IDii") according to the DT match signal 249. If the DT match signal 249 is "high" (corresponding to a match between DTsi and DTref), then the selector 452 will select input "1", which receives the calculation signal 451 of "added IDii+1" from the adder 450. If the DT match signal 249 is "low" (corresponding to a difference between DTsi and DTref), then the selector 452 will select input "0", which receives the ID signal 235 of "non-added IDii" from the input ID register 440. The selected output signal of n bits from the selector 452 is fed to the output ID register 454 that is enabled to register the selected n-bit ID data (IDj) therein immediately before the expiration of the time period Tm, in response to an enable signal (not shown). The output ID register 454 outputs the registered data in a serial manner as the serial output ID signal 281 that is fed to the data combiner 267.

The DT signal 445 containing the m-bit device type DTsi is fed from the input DT register 439 to an output DT register 456 (a parallel-to-serial register) that provides the serial output DT signal 287 to the data combiner 267 in response to the clock signal SCLK. The data combiner 267 combines the p-bit IDGC, the m-bit DT, DTsi, and the n-bit ID, IDj, all of them being serial data. The combined data signal (the data combination signal 269) is fed from the data combiner 267 to the selector 256. The selector 256 also receives the processed data signal 225 provided by the controller/processor 263 accessing the memory 220-i of that device 120-i. In response to the data selection signal 223, the selector 256 selects one of the data combination signal 269 containing the IDGC-DT-ID and the processed data signal 225. When the data selection signal 223 is "high" (an ID generation mode), the selector 256 selects the data combination signal 269 fed to its "1" input. When the data selection signal 223 is "low" (the normal operation mode), the selector 256 selects the processed data signal 225 fed to its "0" input. A selected signal from the selector 256 is outputted through the serial output buffer 258 to the next device 120-(i+1) in the serial interconnection configuration. Thus, in the ID generation mode, the serial output SOi outputted through the SOP connection of the device 120-i contains the ID generation command IDGC of p bits, the device type DTsi of m bits and the output IDo of n bits. The serial output SOi is provided to the next device 120-(i+1).

It is noted that the aforementioned selector 452 is shown for selecting a single bit of IDii or a single bit of IDii+1. Accordingly, there are n duplicate selectors to select the n-bit calculation signal 451 or the n-bit ID signal 235 and output the selected n-bit signal, in response to the DT match signal 249.

The ID generator 234 provides the ID signal 235 containing the n-bit ID, IDii, to the ID register 231. In response to the ID write enable signal 233 from the device operation controller 260, the ID register 231 registers or latches the received ID, IDii, for the present device 120-i. The registered ID is held until powered-off. The ID register 231 is initially reset to the zero state and thus, if no ID latch occurs, the ID register 231 will hold the zero state.

With reference to FIG. 2A, for example, the above ID generation process is completed by device 1's controller 230-1 at device 120-1 that is a NAND Flash device. The device controller 230-1 outputs the resulting ID to device 2, 120-2, that is a NOR Flash device. The device controller 230-2 located at device 120-2 can perform the same operation as the controller 230-1 of device 1, transferring the resulting ID to device 3, 120-3. This process is repeated for all devices in the serial interconnection configuration, until the ID has propagated through all devices.

Figure 3A:
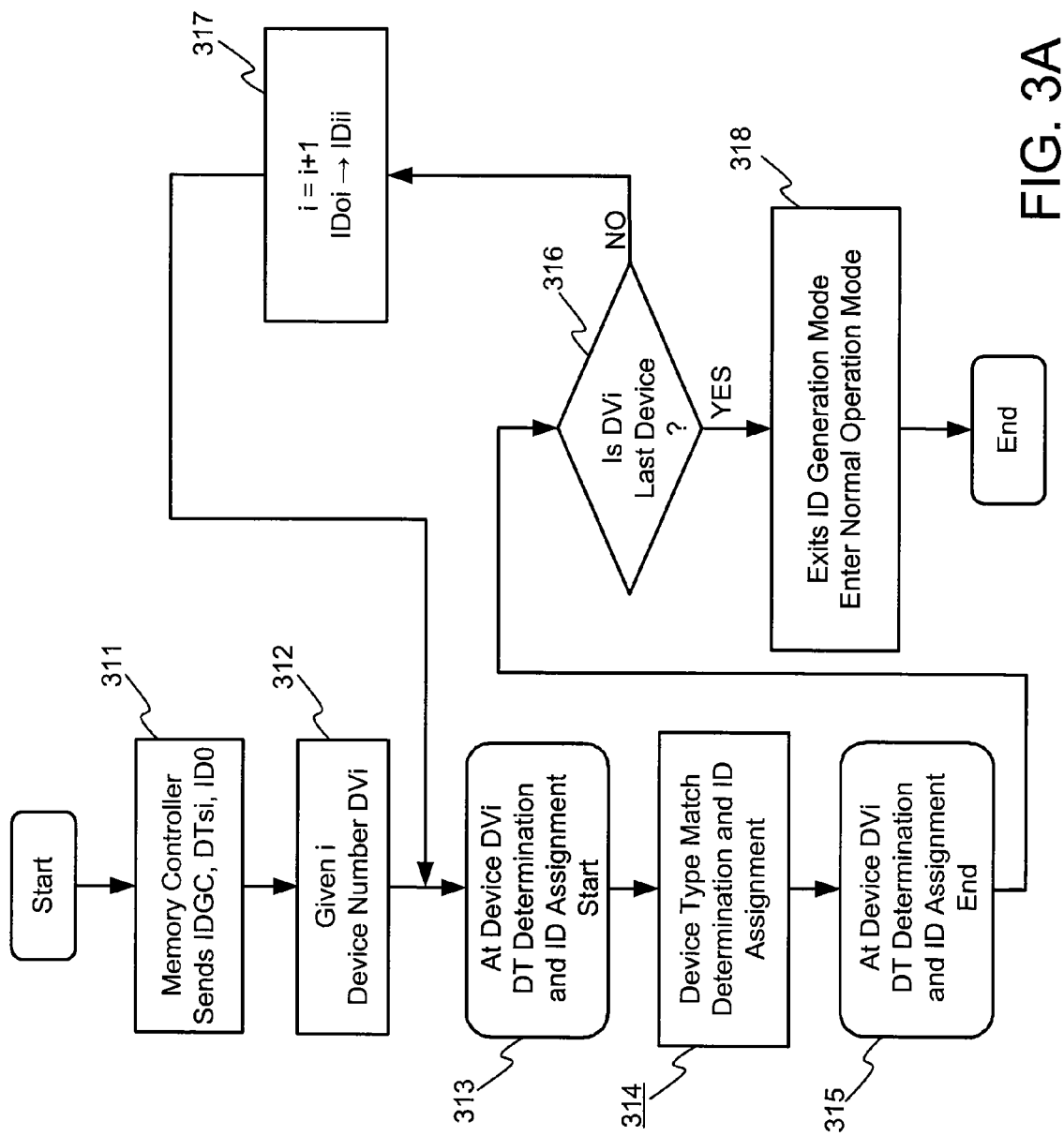
FIG. 3A is a flow chart of operation performed by the serial interconnection configuration of FIG. 2A.

FIG. 3A shows an ID generation process with a skip or bypass function performed by the ID generator 234 of FIG. 2B. Referring to FIG. 3A, a memory controller sends an ID generation command IDGC, a device type DTsi, an initial ID0 and others (step 311). Now, consideration is given to a device DVi that represents any of the devices in a serial interconnection configuration, the device DVi performing a device type match determination, an ID generation or a skip, and an ID assignment. The device DVi receives the ID generation command IDGC, the device type DTsi and the IDii (step 312).

For example, the operation of device 1 is considered. A device order parameter "i" is determined to be "1" (step 312). Then, operation starts at a present device DVi (e.g., device 1) (step 313). The operations of the DT match determination, the ID generation or skip, and the ID assignment are performed at the device DVi (step 314). Upon completion of the operations at step 314, the DT determination and ID generation operations end at the device DVi (step 315). If the device DVi is not the last device (i.e., device N) (NO at step 316), a given device DVi will be a next device DV(i+1) (i.e., the device parameter i is incremented to "i=i+1"). In this case, the serial output SOi from the present device DVi is the serial input SI to the next device DV(i+1) (step 317). At the next device, the process by steps 313-315 is repeated. Such a process is repeated until the last device completes it (YES at step 316), all devices in the serial interconnection configuration perform the operations of the device type match determination, the ID generation or skip, and the ID assignment. After the operations are performed at the last device (YES at step 316), the normal mode operations will be performed under the control by the memory controller (step 318).

At step 314, the DT match determination and ID assignment operations are performed. Then, the given device (or the present device) DVi transmits a combination of the ID generation command IDGC, the device type DTsi and the output IDoi to the next device DV(i+1). If the next device DV(i+1) that received the combined data from the present device DVi is the memory controller 110, the present device DVi will be determined as the last device in the serial interconnection configuration (YES at step 316). This is determined whether the memory controller 110 received the IDGC contained in the combined data. Then, the memory controller 110 recognizes from the received combined data the completion of the DT match determination and ID assignment operations by all devices.

At step 314, if there is a device type match between the received DTsi and a device type (i.e., a reference device type DTref) of the device DVi, an ID assignment for the present device and an ID generation for another device will be performed. If there is no match, neither ID assignment nor ID generation will be performed. Details of the operations of the DT match determination and the ID assignment performed at step 314 are shown in FIG. 3B.

Figure 3B:
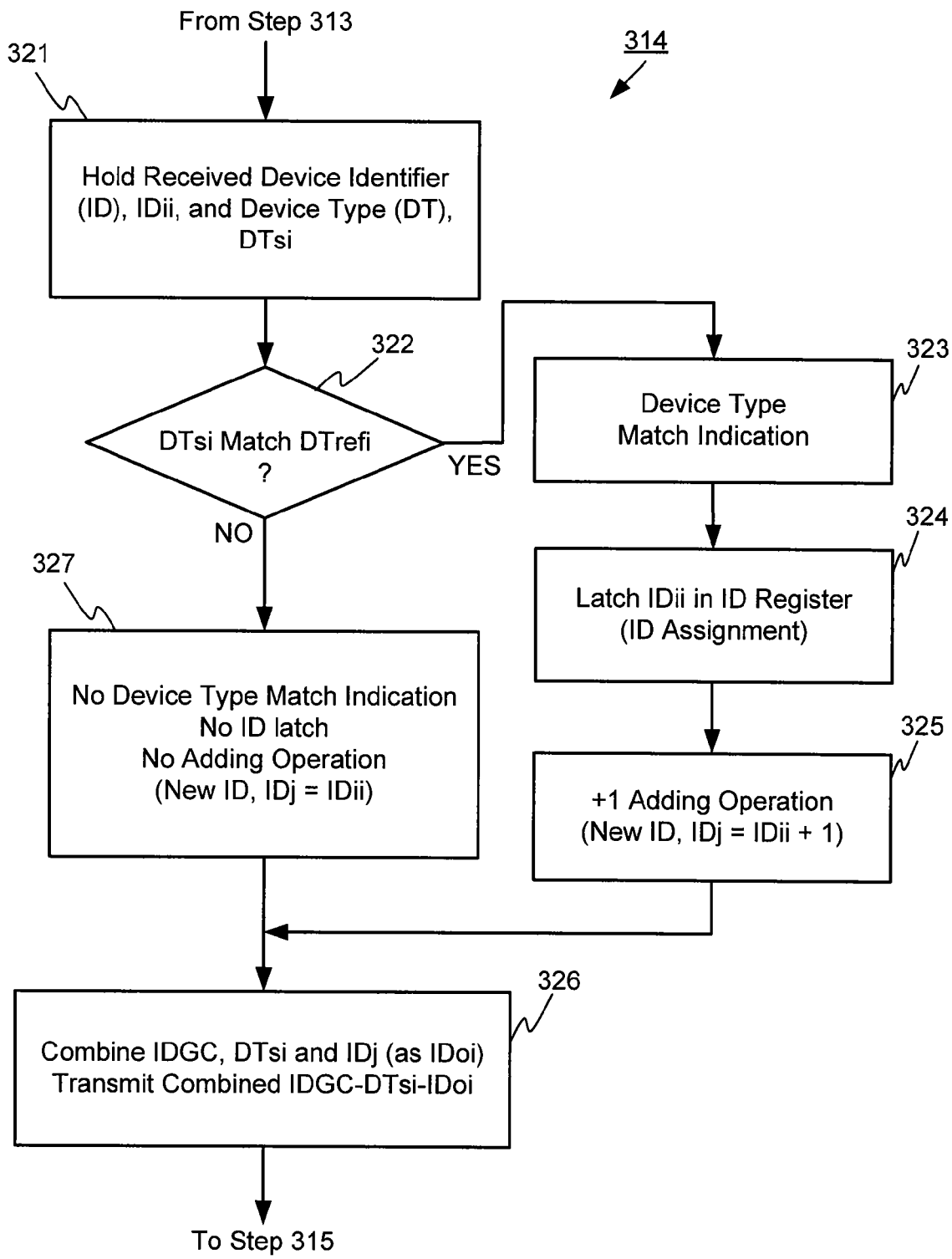
FIG. 3B is a flow chart of part of the operation shown in FIG. 3A.

Referring to FIGS. 2D, 3A and 3B, in the example, a device DVi is given and then, the operations of DT match determination and ID assignment process start at the present device DVi (step 313). The device DVi (e.g., device 2) receives, from a previous device DV(i−1) (e.g., device 1), an input ID, IDii, and the received ID, IDii, is held in the input ID register 440. Also, the device type DTsi for the device type match determination is received and is held in the input DT register 439 (step 321). Then, the held DTsi is compared with the reference DT, DTrefi, by the comparator of the DT match detector 446 to determine whether there is a match between the DTsi and the DTref (step 322). If the DTsi matches the DTrefi (YES at step 322), the DT match signal 249 will be "high" to indicate that the generation of a new ID and the ID assignment are to be performed (step 323). In response to the DT match signal 249 being "high", the n-bit IDii contained in the ID signal 235 is registered or latched in the ID register 231 that has been enabled by the ID write enable signal 233. Thus, the received ID, IDii, is assigned to the present device DVi as an ID (step 324). Upon completion of step 324, the ID number or value is then altered by a "+1" operation (step 325) by the adder 450 and the altered or calculated ID is selected by the selector 452, resulting in a new ID, IDj.

If the values of the DTsi and the DTref do not match (NO at step 322), the DT match signal 249 will be "low". This signal indicates to the present device DVi not to latch the received ID number, IDii, with no adding operation (i.e., no alteration). Thus, the received ID, IDii, is selected by the selector 452 and is kept as a new ID, IDj. (step 327).

After such a new ID is determined (step 325 or 327), the new ID, IDj, is fed from the selector 452 to the output ID register 454. In response to the clock signal SCLK, The serial ID read from the ID register 454 is provided as the new ID, IDj, contained in the output ID signal 281 to the data combiner 267. The IDj is combined with the serial DTsi read from the output DT register 456 and further combined with the ID generation command IDGC by the data combiner 267. The IDj is an output ID, IDoi, of the present device DVi. The resultant combination of IDGC, DTsi and IDoi is transmitted to the next device DV(i+1) in the serial interconnection configuration (step 326).

Figure 4A:
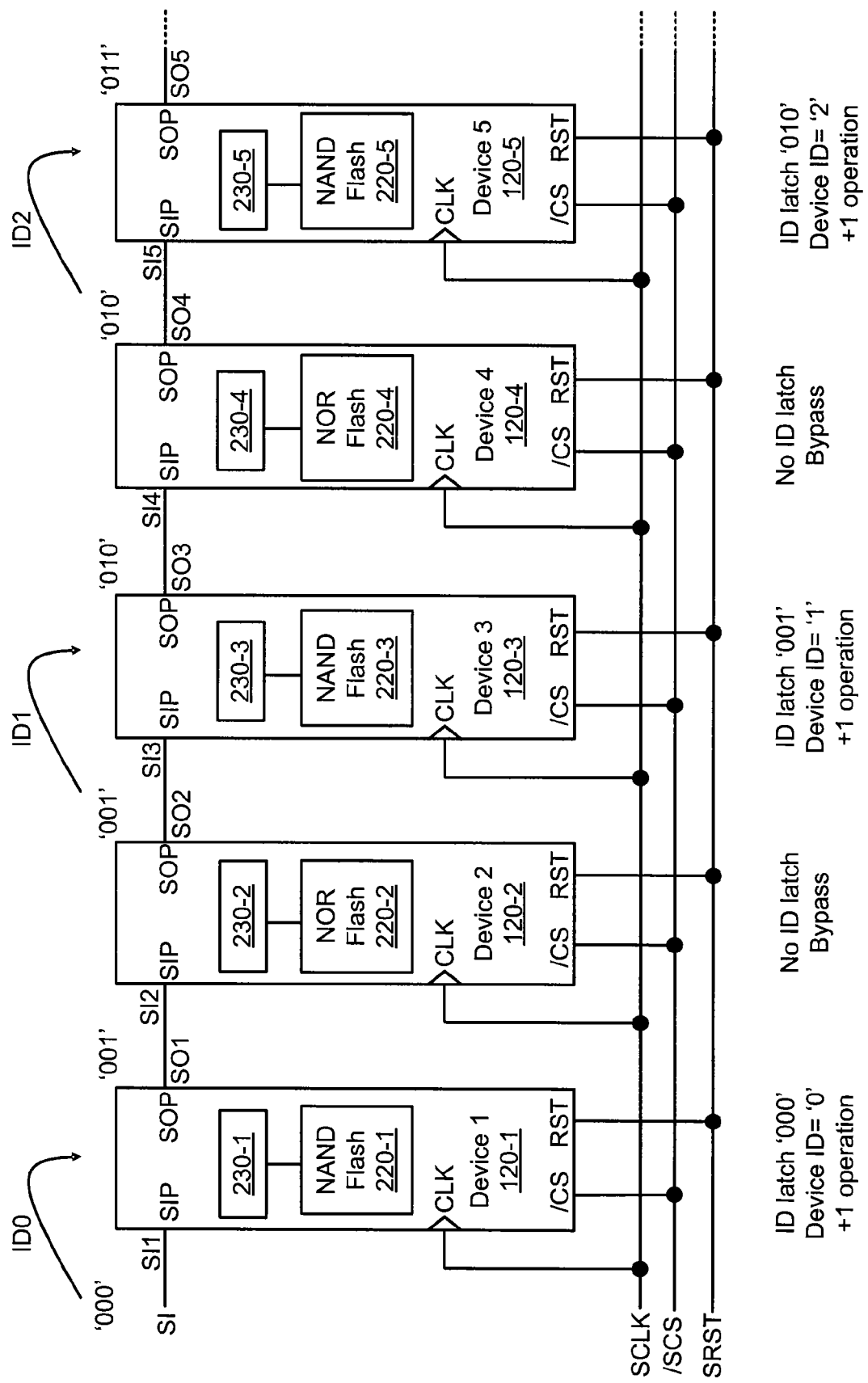
FIG. 4A is a block diagram illustrating the plurality of devices in the serial interconnection configuration shown in FIG. 2A, in which NAND Flash devices perform an ID generation.
Figure 4B:
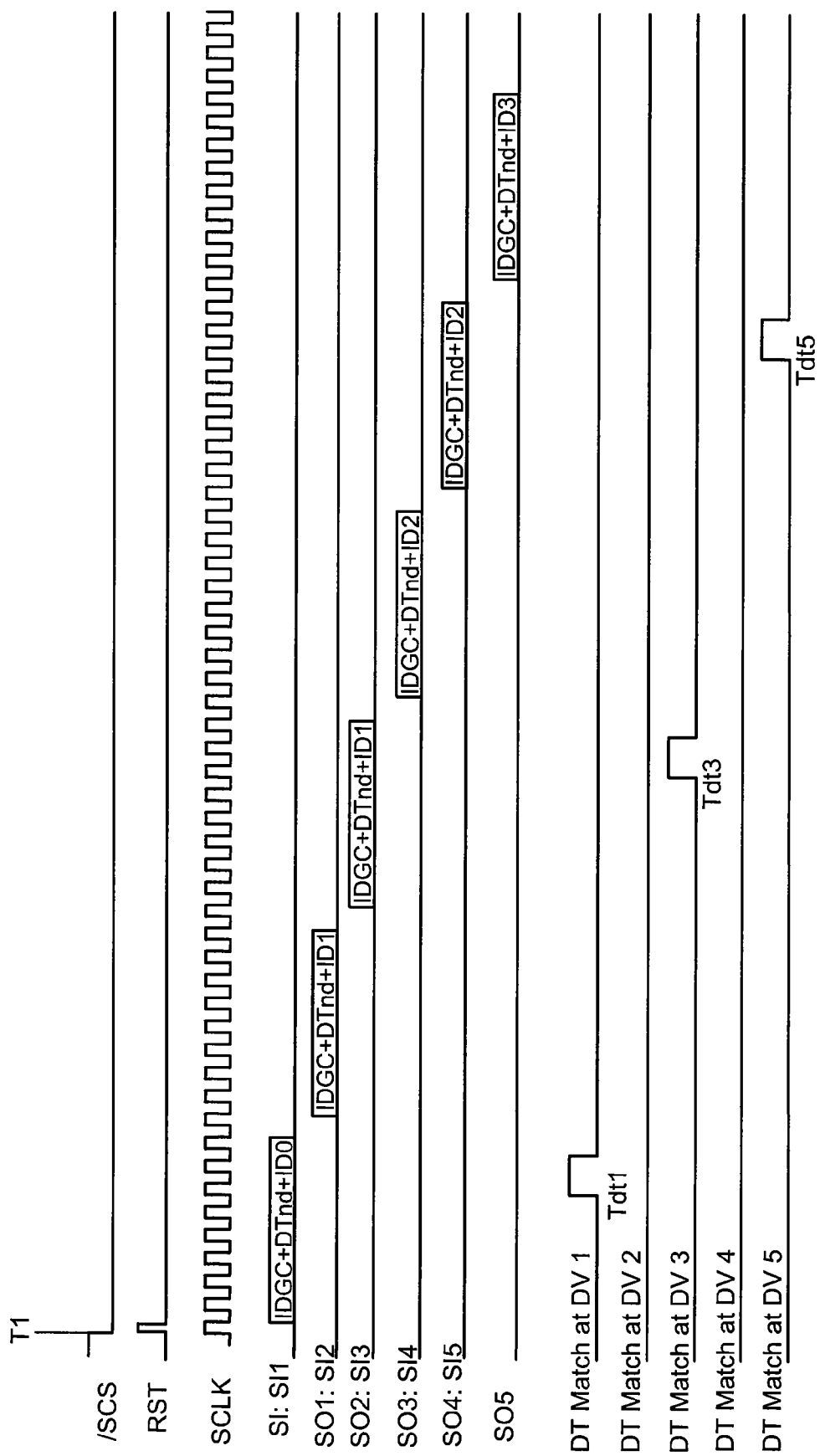
FIG. 4B is a timing diagram of the ID generation in the serial interconnection configuration of FIG. 4A.

FIG. 4A shows the devices in the serial interconnection configuration of FIG. 2A, in which the ID generation is performed by the NAND Flash devices. FIG. 4B shows signal timings for the ID generation by the NAND Flash devices of FIG. 4A. The data on the SIP contains the command, DT and ID bits that are fed as the serial input SI1 to the SIP connection of device 1, 120-1. The serial input data fed to the SIP connection is processed by device controller 230-1 of device 1 and the processed data is outputted as the serial output data on the serial output SO1 through the SOP connection. The serial output SO1 is as the serial input SI2 to neighboring device 2. As such, the serial output of one device is provided to a next device as the serial input.

Referring to FIGS. 2A-2D, 3A, 3B, 4A and 4B, the memory controller 110 makes the chip select signal /SCS be "low" at time T1. Immediately thereafter, the memory controller 110 sends the reset signal SRST to all devices, so that in response to the internal reset signal 238 provided by the device operation controller 260, the ID registers 231 of each device is reset. The ID register 231 holds the reset state (e.g., '000') until an assigned ID is registered therein. Then, the memory controller 110 provides the serial input SI containing a p-bit ID generation command, IDGC, an m-bit device type DT, DTsi, and an n-bit identifier ID (initial ID0) to device 1, 120-1. In the example, the initial ID, ID0, is a three-bit number '000'. Then, device 1, 120-1, performs the operations of the device type match determination, the ID generation or skip, and the ID assignment.

In the example shown in FIG. 4A, the device type DTsi sent by the memory controller 110 is a DTnd for the NAND Flash device and its DT number or code is '00h' as shown in Table 1. The DT match signals 249 at devices 1, 3 and 5 (120-1, 120-3 and 120-5) (i.e., NAND Flash devices) become "high" at determination times Tdt1, Tdt3 and Tdt5, respectively. However, the DT match signals 249 at devices 2 and 4 do not become "high". Thus, devices 2 and 4 (i.e., NOR Flash devices) provide no "high" match signal. In response to the "high" DT match signals 249, devices 1, 3 and 5 latch or register the IDs of '000', '001' and '010', respectively, in the ID registers 231 and generate new IDs with +1 operation by the adders 450.

In the ID generation method shown in FIG. 3B, alternatively, steps 324 and 325 can be reversed, wherein the "new" ID number (resulting from the "+1" operation) is latched or registered in an ID register of a present device. As a result, an assigned ID to the device is the "new" ID number, instead of the received ID number from the previous device. Such an alternative will be described later with reference to FIG. 14. In the alternative, a memory controller may be configured to address the memory devices in the serial interconnection configuration, according to the IDs generated at each device for the device address recognition in the normal mode operations.

When each device in the serial interconnection configuration has completed the process as shown in FIG. 3B, all devices with a matching DT number have generated an ID (step 325), and all other devices have refrained from generating an ID (step 327). To generate IDs for these other devices, the process can be repeated for all devices, wherein the device type DTsi is replaced with another value matching the device type number of some or all of the other devices.

For example, a first process, with the device type DTnd matching a NAND Flash device, could be completed at all devices, thereby assigning an ID at each NAND Flash device in the serial interconnection configuration. Afterwards, a second process, with the device type DTnr matching a NOR Flash device, could be completed at all devices, thereby assigning an ID at each NOR Flash device in the serial interconnection configuration. The process may be further repeated for other device types (e.g., for DRAM devices, SRAM devices) in the serial interconnection configuration. As a result, each device in the serial interconnection configuration can be uniquely identified in subsequent values and commands by specifying the ID and DT of that device.

In a case where the stored reference device type DTref of the DT number storage/provider 442 is selected for the NAND Flash device, the device type DT is "00h" (see Table 1. In the process shown in FIGS. 3A and 3B, at step 322, devices 1, 3 and 5 (120-1, 120-3 and 120-5) determine that the DTsi "matches" the stored DTref (the positive determination) and thus, at step 325, the +1 operation is performed for generating an altered ID. In devices 2 and 4 (120-2 and 120-4)

that are NOR Flash devices, the DT ("01h") do not match the selected DT (the negative determination at step 322) and thus, no +1 operation is performed (step 327). At the "no match" devices, no ID registration (i.e., no ID latch) is performed and thus, the reset "zero state" is maintained in the ID registers. The resulting latched or registered IDs and generated or bypassed IDs are shown in Table 2.

TABLE 2

| Device | Device Type | DT Number or Value (DTref) | Latched or Registered ID | Generated or Bypassed ID |
|---|---|---|---|---|
| 220-1 | NAND Flash | 00h | 000 | 001 |
| 220-2 | NOR Flash | 01h | 000** | 001 |
| 220-3 | NAND Flash | 00h | 001 | 010 |
| 220-4 | NOR Flash | 01h | 000** | 010 |
| 220-5 | NAND Flash | 00h | 010 | 011 |

In Table 2, "000**" is the reset state, not a latched ID. If a different value or number is used for the reset state, the latched or registered initial ID ("000") will be distinguishable from the reset state.

Figure 5A:
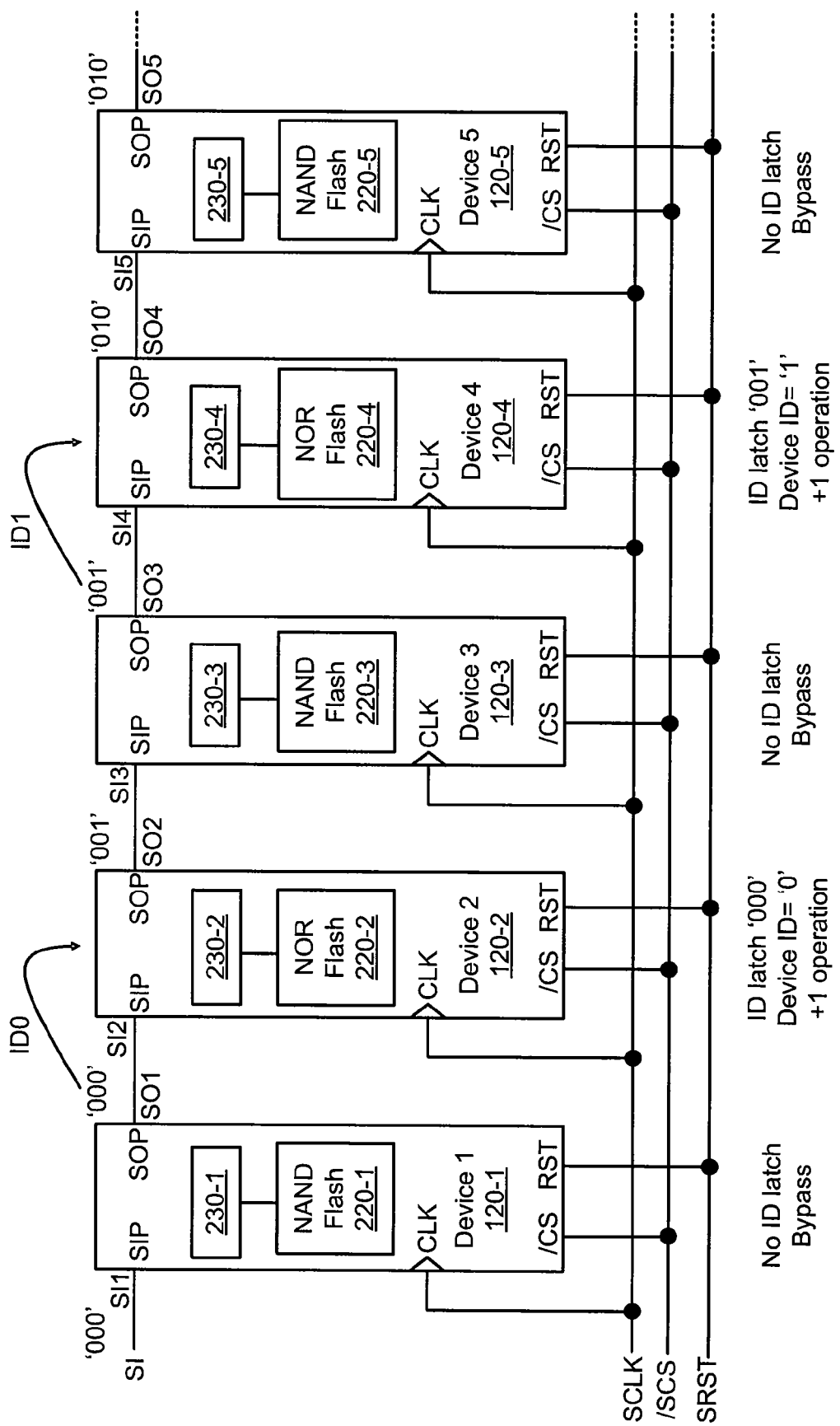
FIG. 5A is a block diagram illustrating the plurality of devices in the serial interconnection configuration shown in FIG. 2A, in which NOR Flash devices perform an ID generation.
Figure 5B:
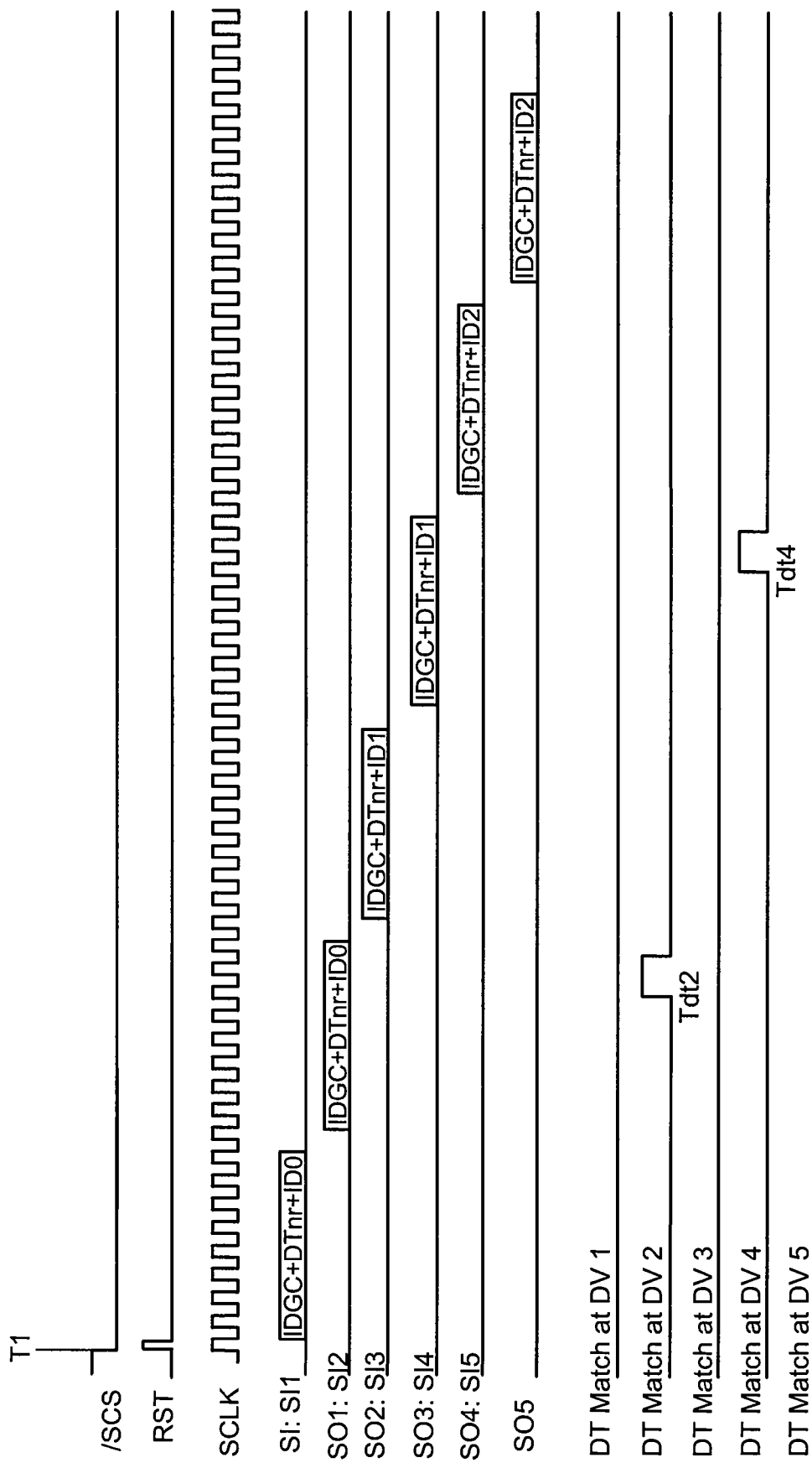
FIG. 5B is a timing diagram of the ID generation in the serial interconnection configuration of FIG. 5A.

FIG. 5A shows the devices in the serial interconnection configuration shown in FIG. 2A, in which the NOR Flash devices perform the ID generation. FIG. 5B is a timing diagram of the ID generation in the serial interconnection configuration of FIG. 5A.

Referring to FIGS. 2A-2D, 3A, 3B, 5A and 5B, devices 1-5 (120-1-120-5) include the device controllers 230-1-230-5, respectively. Each of the device controllers provides the DT match determination, the ID generation or skip, and the ID assignment. The operations of the serially interconnected devices of FIG. 5A is similar to those of FIG. 4A. FIG. 5A depicts the operations performed by the serially interconnected devices, wherein the stored DT of the DT number storage/provider 442 is selected for the NOR Flash device, DTnr, the number or code of which is '01h' as shown in Table 1.

The DT match signals 249 in devices 2 and 4 (120-2 and 120-4) (NOR Flash devices) become "high" at determination times Tdt2 and Tdt4, respectively. In response to the "high" device type match signals, devices 2 and 4 latch or register the IDs '000' and '100' in the ID registers 231 and generate new IDs with +1 operation. However, the DT match signals 249 in devices 1, 3 and 5 do not become "high".

In a case where the device type DTsi sent by the memory controller 110 is the DTnr for the NOR Flash device, the DTsi matches the stored DT of the DT number storage/provider 442 as the reference DTref selected for the NOR Flash device (i.e., "01 h" as shown in Table 1). In the process shown in FIG. 3B, at determination step 322, devices 2 and 4 (120-2 and 120-4) determine that the DTsi "matches" the stored DTref, with the results that the +1 operation is performed by the adders 450 to generate a new ID for another device (step 325). In devices 1, 3 and 5 (220-1, 120-3 and 120-5) that are NAND Flash memories, the DTsi ("00h") does not, however, match the stored DTref (the negative determination at step 322), with the results that no +1 operation is performed (i.e., skip or bypass of ID generation (step 327). Table 3 shows t resulting latched or registered IDs and generated or bypassed IDs. In Table 3, "000**" is the reset state.

TABLE 3

| Device | Device Type | DT Number or Value (DTref) | Latched or Registered ID | Generated or Bypassed ID |
|---|---|---|---|---|
| 220-1 | NAND Flash | 00h | 000** | 000 |
| 220-2 | NOR Flash | 01h | 000 | 001 |
| 220-3 | NAND Flash | 00h | 000** | 001 |
| 220-4 | NOR Flash | 01h | 001 | 010 |
| 220-5 | NAND Flash | 00h | 000** | 010 |

IF N (e.g., 16) devices are serially interconnected, the N-th device provides SON (SO) to the memory controller. A general bit structure of the packet bits is "Packet start+ID generation command IDGC+DT+ID+Packet end". In the example shown in FIG. 4A, the packets of the serial inputs are given by (ID being "MSB (Most Significant Bit) LSB (Least Significant Bit)":

SI1: Packet including the ID0=Packet Start+IDGC+DT+ '000'+Packet End

SI2: Packet including the ID1=Packet Start+IDGC+DT+ '001'+Packet End

SI3: Ibid

SI4: Packet including the ID2=Packet Start+IDGC+DT+ '010'+Packet End

SI5: Ibid

SO5: Packet including the ID3=Packet Start+IDGC+DT+ '011'+Packet End

As such, the packet bit configuration of the serial input and output is a packet start, command (IDGC), DT (device type values), ID values and a packet end (optional). These information bits are required in the packets. Other information bits may be included in the packet depending on the system requirements. The number of bits of the information in the packet is varied depending on the system requirements. For example, each of the packet start and end includes four bits. The command includes any number of bits depending on the system requirements and memory operation modes. The DT includes, for example, eight bits representing the device type value. The ID includes, for example, eight bits representing the ID value. The packet bits are interpreted by the serial packet interpreter 261 and the information of the interpreted packet bits is analyzed by the controller/processor 263.

Figure 6A:
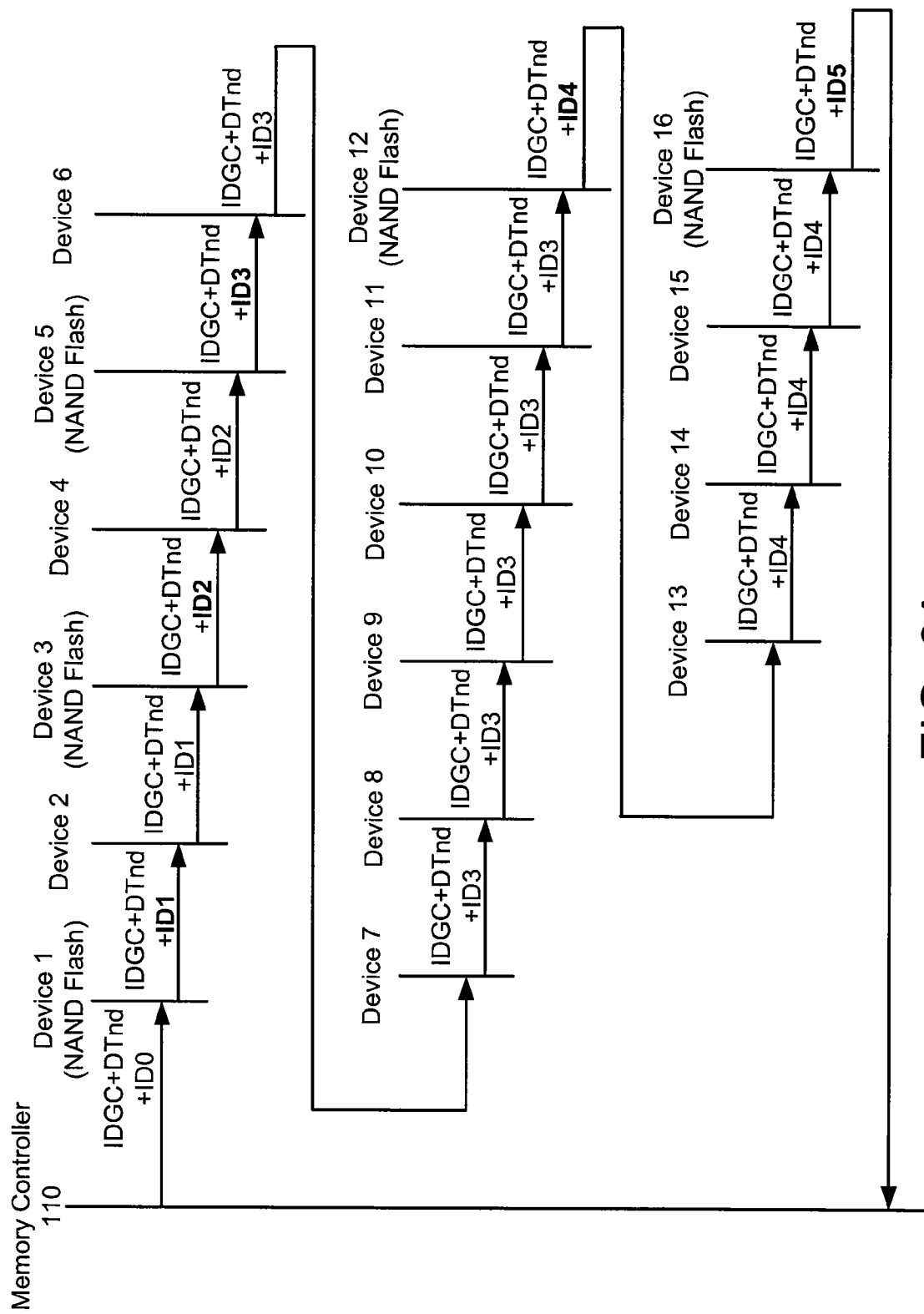
FIG. 6A is a schematic diagram illustrating a protocol conducted in the devices shown in FIG. 1, wherein NAND Flash devices generate IDs.
Figure 6B:
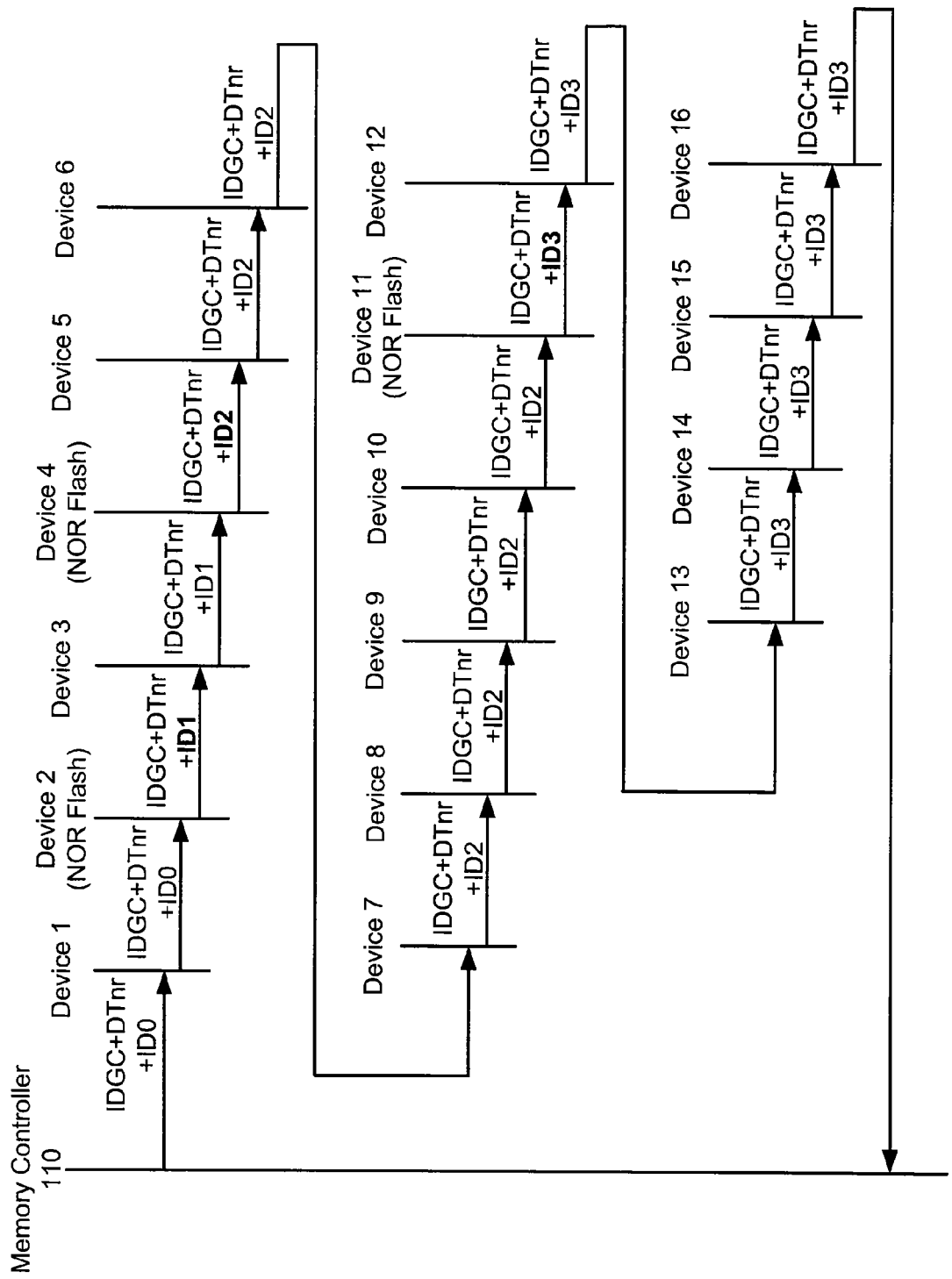
FIG. 6B is a schematic diagram illustrating a protocol conducted in the devices shown in FIG. 1, wherein NOR Flash devices generate IDs.
Figure 6C:
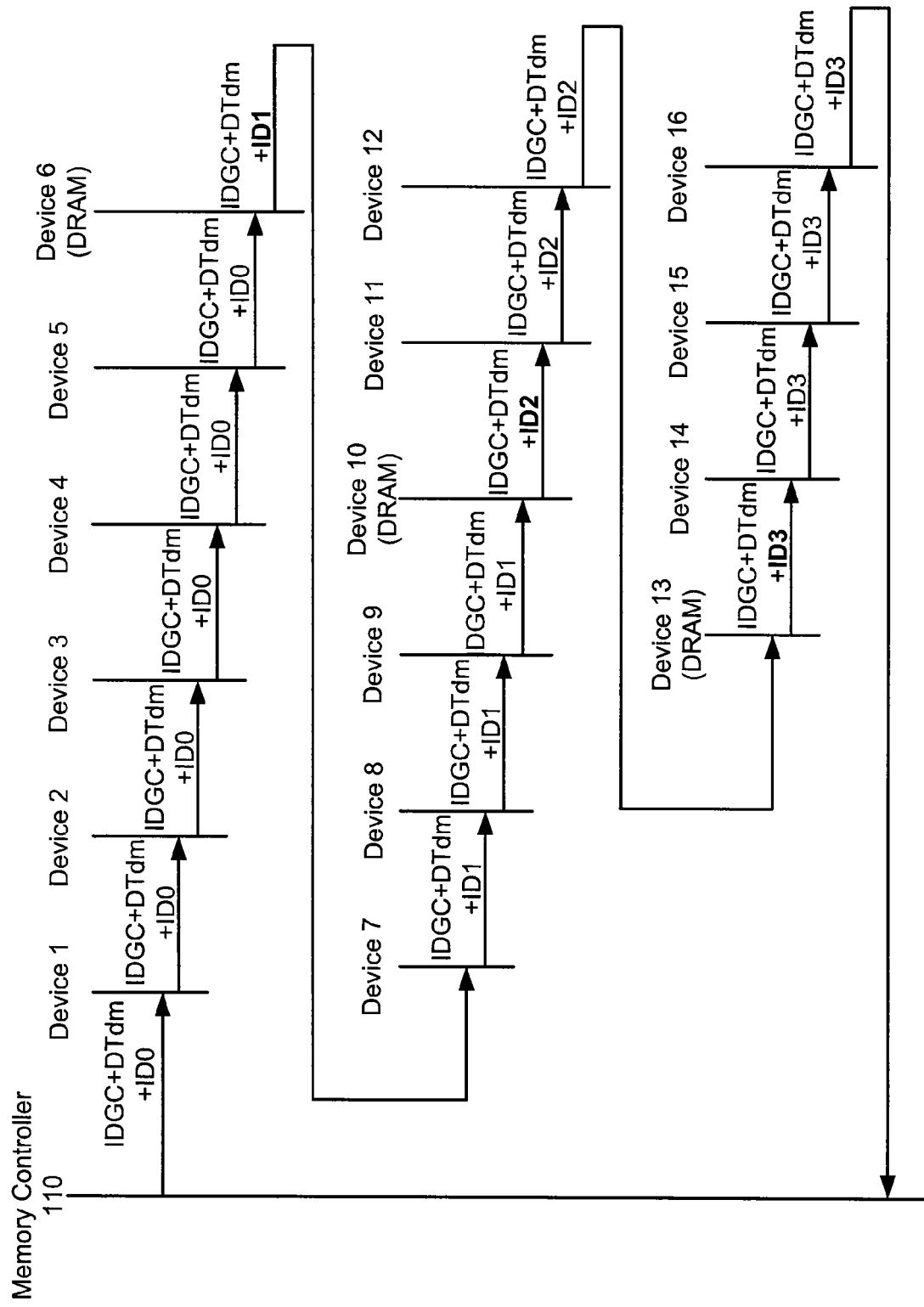
FIG. 6C is a schematic diagram illustrating a protocol conducted in the devices shown in FIG. 1, wherein DRAM devices generate IDs.
Figure 6D:
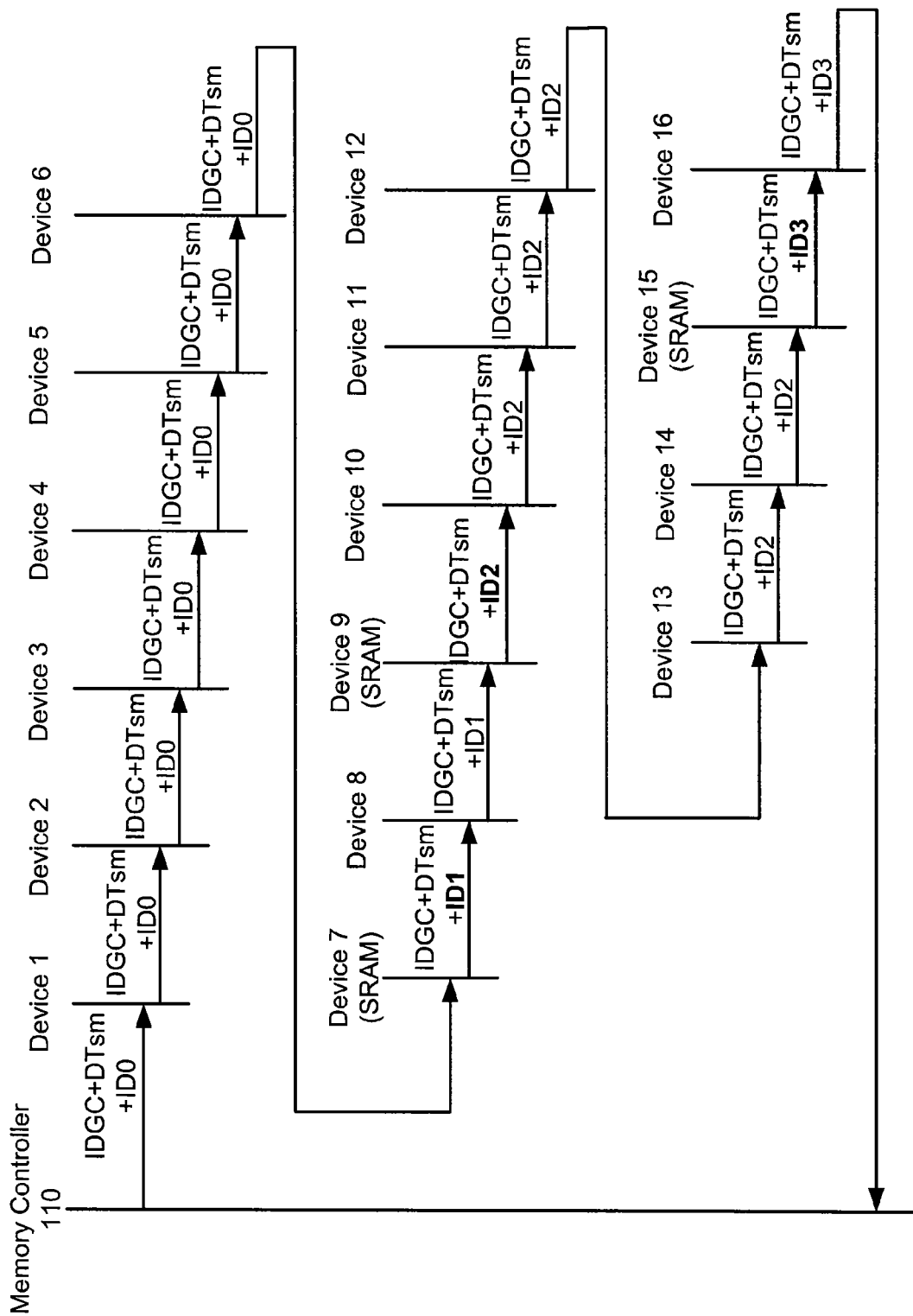
FIG. 6D is a schematic diagram illustrating a protocol conducted in the devices shown in FIG. 1, wherein SRAM devices generate IDs.
Figure 6E:
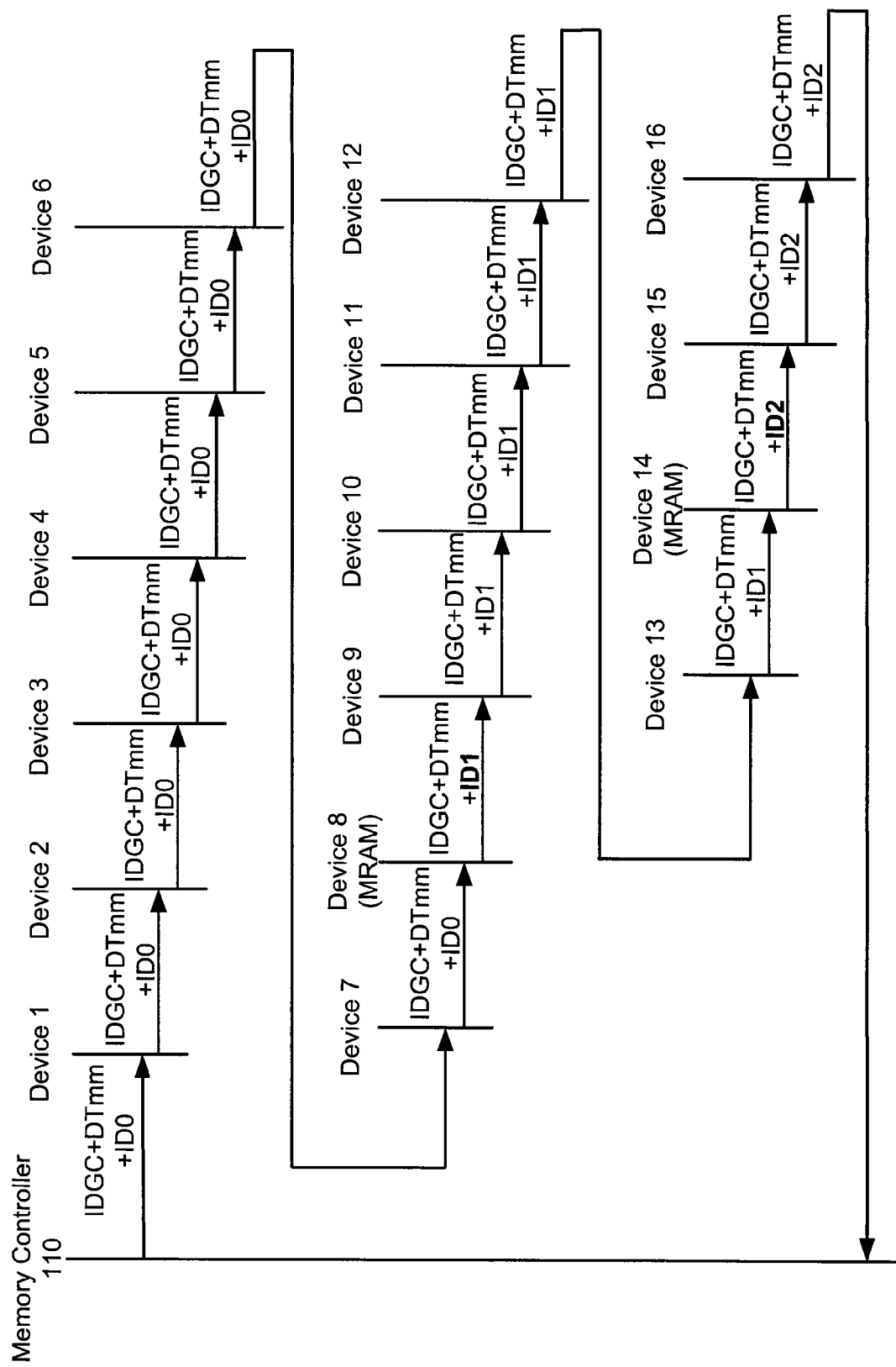
FIG. 6E is a schematic diagram illustrating a protocol conducted in the devices shown in FIG. 1, wherein MRAM devices generate IDs.
Figure 6F:
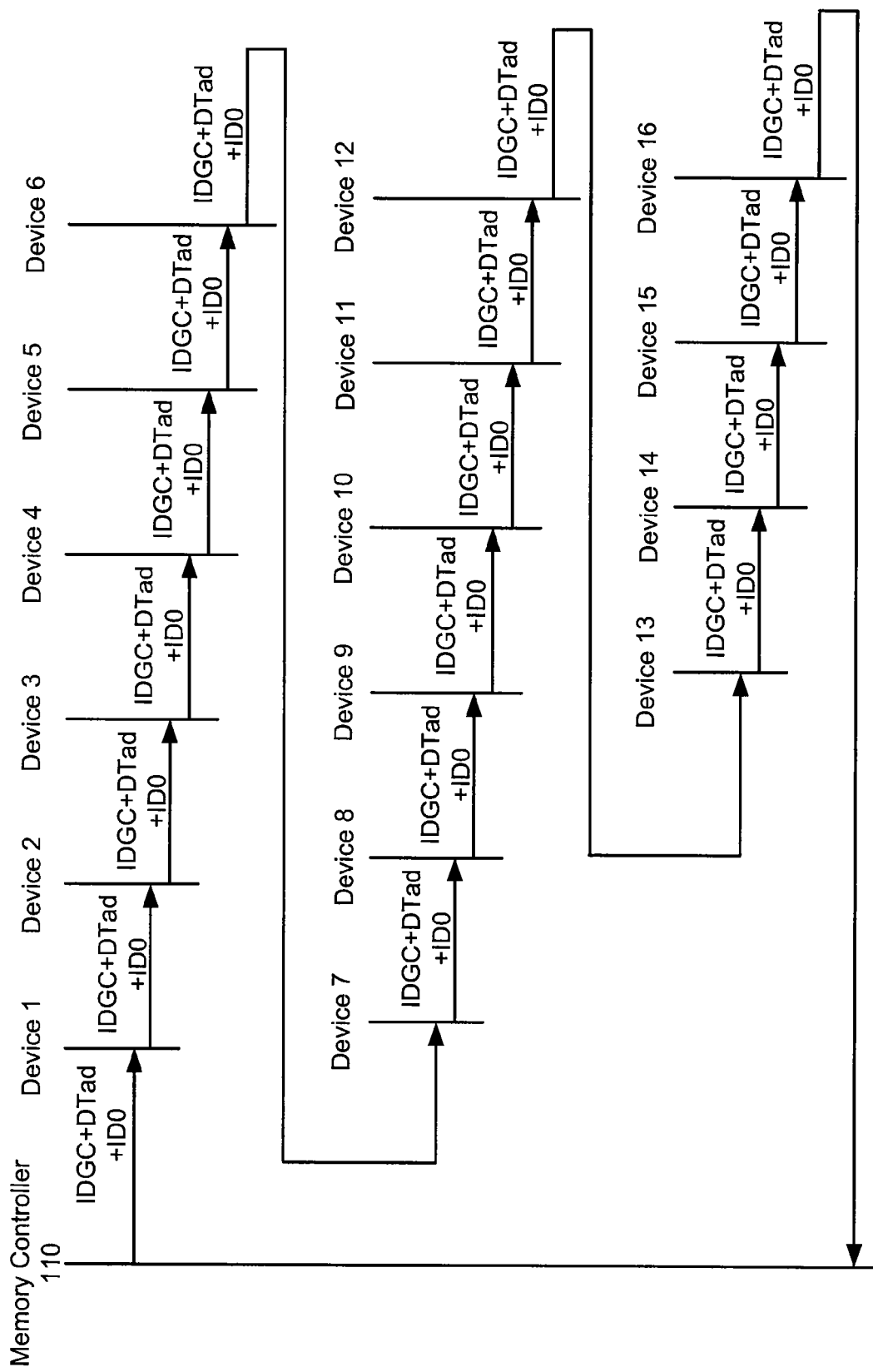
FIG. 6F is a schematic diagram illustrating a protocol conducted in the devices shown in FIG. 1, wherein no devices generate IDs.

With reference to FIG. 1, in a case (1) where the memory controller 110 provides a device type DTnd of a NAND Flash device as DTsi with an initial ID, ID0, only devices 1, 3, 5, 12 and 16 perform the ID generation based on the input ID and the other devices skip or bypass ID generation, as shown in FIG. 6A. In a case (2) where the device type DTsi is a device type DTnr of a NOR Flash device, only devices 2, 4 and 11 perform the ID generation based on the input ID and the other devices skip ID generation, as shown in FIG. 6B. In a case (3) where the device type DTsi is a device type DTdm of a DRAM, only devices 6, 10 and 13 perform the ID generation based on the input ID and the other devices skip ID generation, as shown in FIG. 6C. In a case (4) where the device type DTsi is a device type DTsm of an SRAM, only devices 7, 9 and 15 perform the ID generation based on the input ID and the other devices skip the ID generation, as shown in FIG. 6D. In a case (5) where the device type DTsi is a device type DTmm of an MRAM, only devices 8 and 14 perform the ID generation based on the input ID and the other devices skip the ID generation, as shown in FIG. 6E. In a case (6) where the device type DTsi is a device type DTad of an AND Flash device, it does not match any of the N devices, no ID is generated in the serially interconnected devices, as shown in FIG. 6F. Furthermore, if another type of DTsi is sent the serially interconnected devices, the DTsi will not match any of the devices, with the results that neither ID generation nor ID assignment will be performed.

Table 4 summarizes the input ID, IDi, and the output (generated or skipped) ID, IDo, of each of the devices, in the cases of device types of (1) NAND Flash device (DTnd), (2) NOR Flash device (DTnr), (3) DRAM (DTdm), (4) SRAM (DTsm) and (5) MRAM (DTmm).

TABLE 4

| Number DV# | Memory Device Type | (1) DTnd IDi | (1) DTnd IDo | (2) DTnr IDi | (2) DTnr IDo | (3) DTdm ID | (3) DTdm IDo | (4) DTsm IDi | (4) DTsm IDo | (5) DTmm IDi | (5) DTmm IDo |
|---|---|---|---|---|---|---|---|---|---|---|---|
| 1 | NAND Flash | 0 | 1 | 0 | 0 | 0 | 0 | 0 | 0 | 0 | 0 |
| 2 | NOR Flash | 1 | 1 | 0 | 1 | 0 | 0 | 0 | 0 | 0 | 0 |
| 3 | NAND Flash | 1 | 2 | 1 | 1 | 0 | 0 | 0 | 0 | 0 | 0 |
| 4 | NOR Flash | 2 | 2 | 1 | 2 | 0 | 0 | 0 | 0 | 0 | 0 |
| 5 | NAND Flash | 2 | 3 | 2 | 2 | 0 | 0 | 0 | 0 | 0 | 0 |
| 6 | DRAM | 3 | 3 | 2 | 2 | 0 | 1 | 0 | 0 | 0 | 0 |
| 7 | SRAM | 3 | 3 | 2 | 2 | 1 | 1 | 0 | 1 | 0 | 0 |
| 8 | MRAM | 3 | 3 | 2 | 2 | 1 | 1 | 1 | 1 | 0 | 1 |
| 9 | SRAM | 3 | 3 | 2 | 2 | 1 | 1 | 1 | 2 | 1 | 1 |
| 10 | DRAM | 3 | 3 | 2 | 2 | 1 | 2 | 2 | 2 | 1 | 1 |
| 11 | NOR Flash | 3 | 3 | 2 | 3 | 2 | 2 | 2 | 2 | 1 | 1 |
| 12 | NAND Flash | 3 | 4 | 3 | 3 | 2 | 2 | 2 | 2 | 1 | 1 |
| 13 | DRAM | 4 | 4 | 3 | 3 | 2 | 3 | 2 | 2 | 1 | 1 |
| 14 | MRAM | 4 | 4 | 3 | 3 | 3 | 3 | 2 | 2 | 1 | 2 |
| 15 | SRAM | 4 | 4 | 3 | 3 | 3 | 3 | 2 | 3 | 2 | 2 |
| 16 | NAND Flash | 4 | 5 | 3 | 3 | 3 | 3 | 3 | 3 | 2 | 2 |

When the DTsi matches the DT of the specific device, the ID generation based on the +1 operation is performed and the pre-calculated ID is latched as the ID in that device. In Table 4, the IDs generated by the specific devices are indicated in bold.

The results from the ID generation performed by the ID generator 234 and the ID latched or registered in the ID register 231 are shown in Table 5.

TABLE 5

| Device Number DV# | Memory Device Type | Latched or Registered IDs |
|---|---|---|
| 1 | NAND Flash | 0 |
| 2 | NOR Flash | 0 |
| 3 | NAND Flash | 1 |
| 4 | NOR Flash | 1 |
| 5 | NAND Flash | 2 |
| 6 | DRAM | 0 |
| 7 | SRAM | 0 |
| 8 | MRAM | 0 |
| 9 | SRAM | 1 |
| 10 | DRAM | 1 |
| 11 | NOR Flash | 2 |
| 12 | NAND Flash | 3 |
| 13 | DRAM | 2 |
| 14 | MRAM | 1 |
| 15 | SRAM | 2 |
| 16 | NAND Flash | 4 |

Figure 7A:
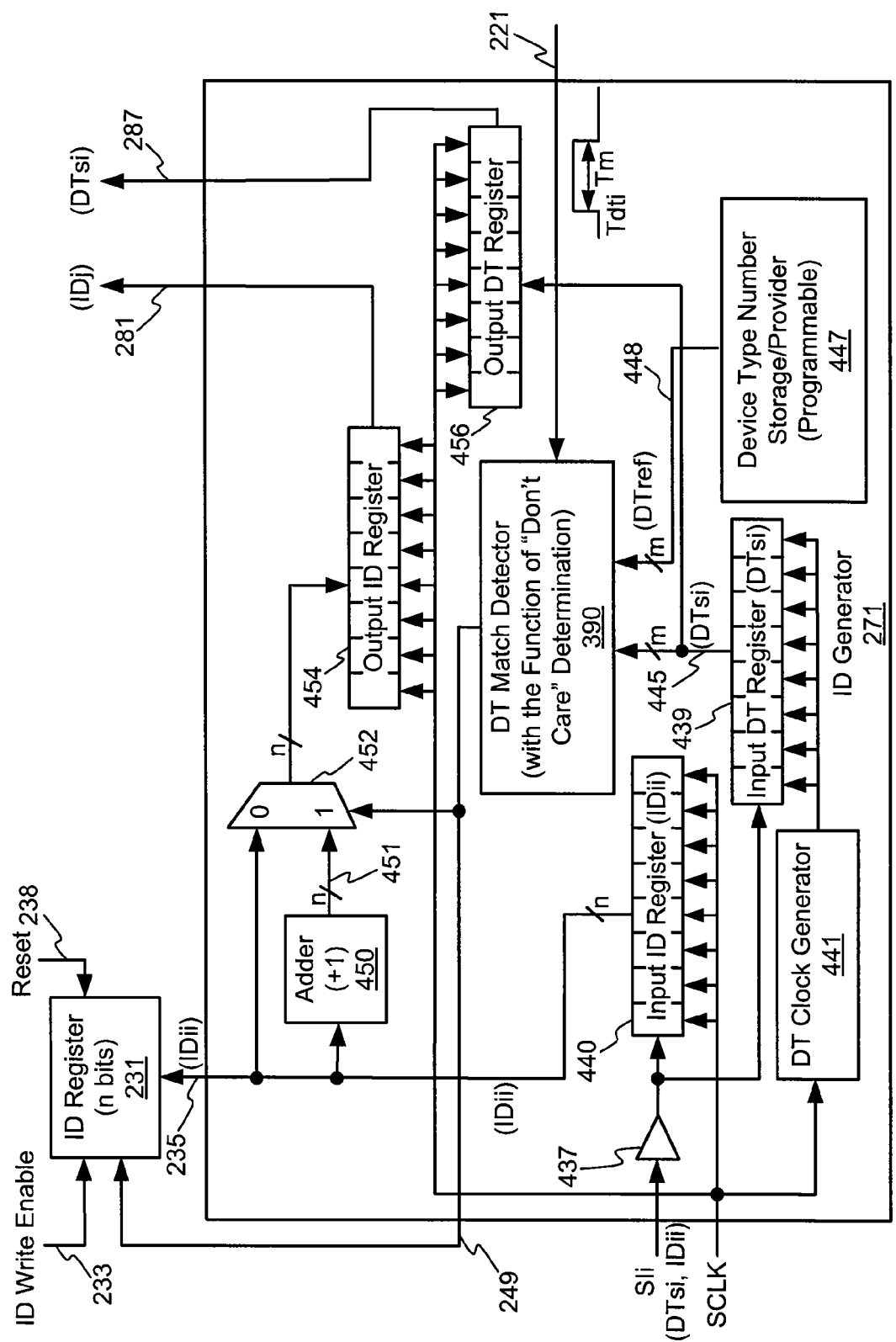
FIG. 7A is a block diagram illustrating another example of the ID generator that is applied to the devices serially interconnected as shown in FIG. 1.

FIG. 7A shows another example of an ID generator that is applied to each of the memory devices serially interconnected as shown in FIG. 1. An ID generator 271 shown in FIG. 7A is similar to the ID generator 234 of FIG. 2D. The same or corresponding elements and components to ones of FIG. 2D are referenced by the same numerals. A DT match detector 390 of the ID generator 271 is different from the DT match detector 446 of the ID generator 234. The DT match detector 390 provides a "don't care" determination as well as the device type match determination.

Referring to FIG. 7A, a device type number storage/provider 447 is a one-time-programmable (OTP) memory or a programmable memory that can store a device type number or value as a device type reference (DTref) programmed to the device prior to performing the ID generation process. The device type number storage/provider 447 provides a reference DT signal 448 containing the reference DT, DTref, of m bits to the DT match detector 390 which also receives the DT signal 445 containing the m-bit DTsi from the input DT register 439. The DT determination control signal 221 is provided to the DT match detector 390, so that the determination time Tdti and its active period Tm are defined by the DT determination control signal 221.

Figure 7B:
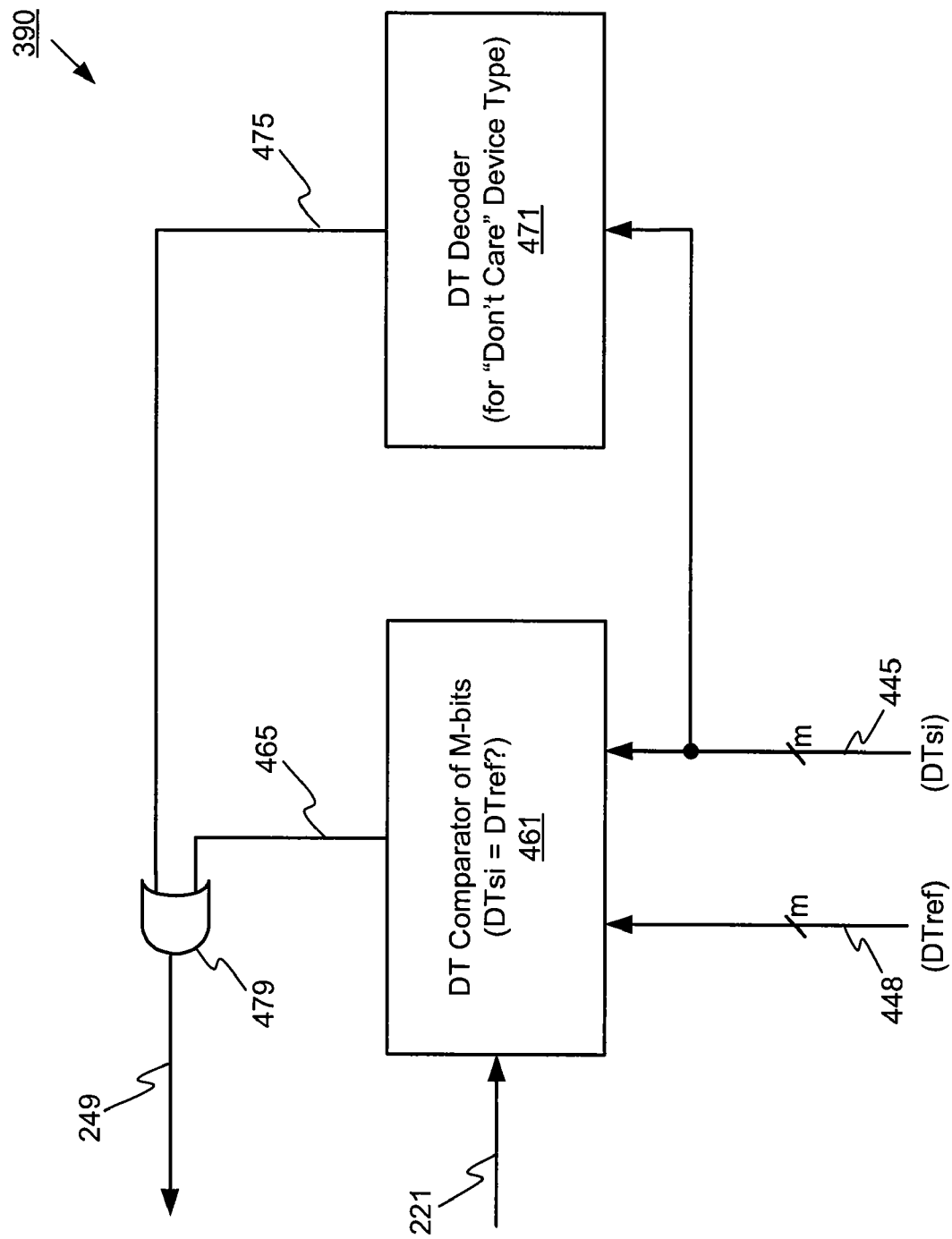
FIG. 7B is a block diagram illustrating a DT match detector shown in FIG. 7A.

FIG. 7B shows details of the DT match detector 390 of FIG. 7A. Referring to FIG. 7B, the DT match detector 390 includes a DT comparator 461 of m bits and a DT decoder 471 of m bits. The DT comparator 461 receives the reference DT signal 448, the DT signal 445 and the DT determination control signal 221 and outputs a comparison result signal 465 to an OR gate 479. The DT decoder 471 receives the DT signal 445 and outputs a one-bit decoded signal 475 to the OR gate 479 which in turn provides the DT match signal 249.

It is noted that the DT comparator 461 is shown for comparing the m-bit data of the DTsi and the DTref. Accordingly, there are m duplicate comparators to determine whether there is a match between the DTsi and DTref data and output the one-bit determination result data, in response to the DT determination control signal 221.

Figure 7C:
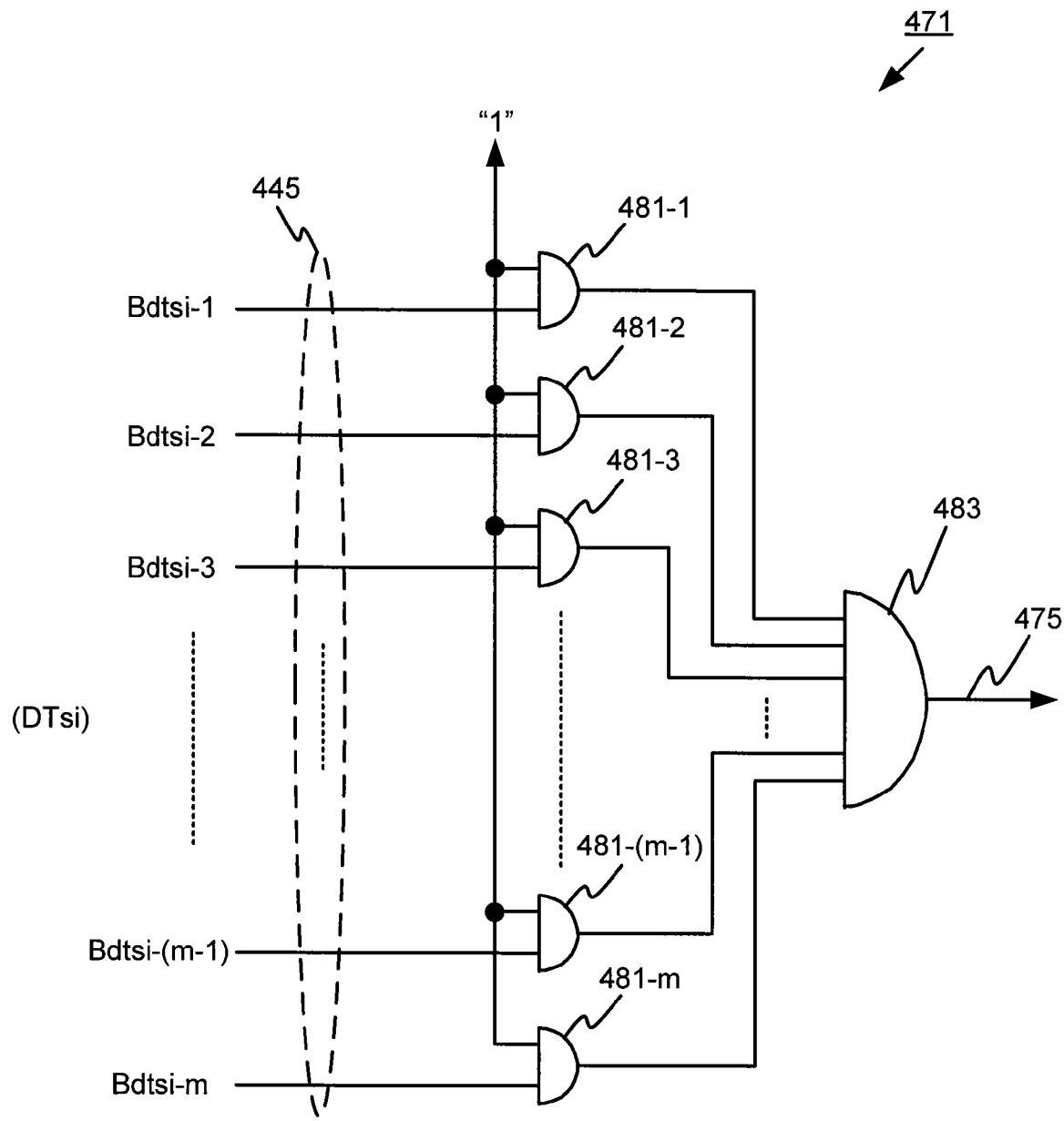
FIG. 7C is a block diagram illustrating a DT decoder shown in FIG. 7B.
Figure 8:
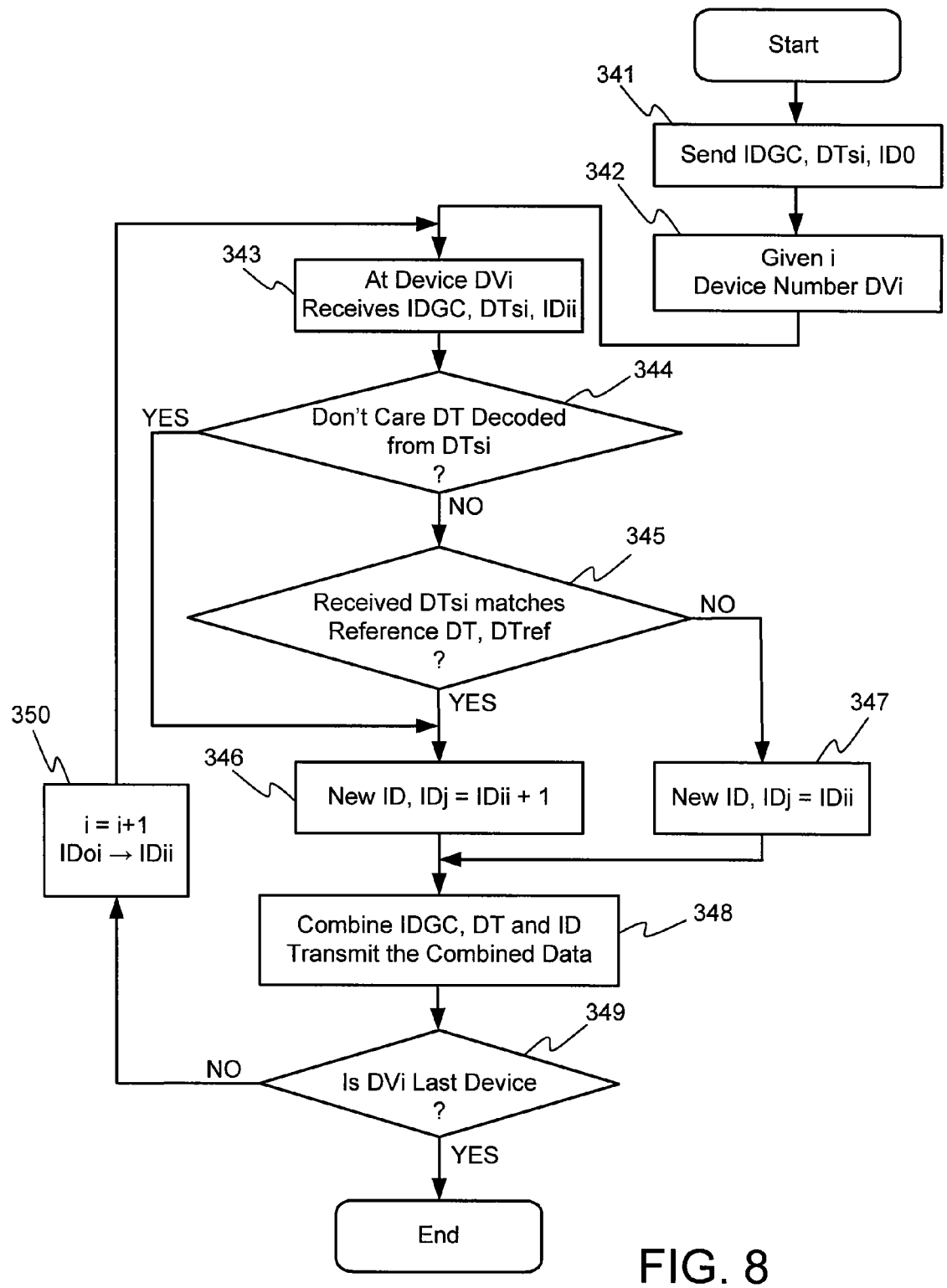
FIG. 8 is a flow chart illustrating an ID generation method applied to the device shown in FIG. 1 with the ID generator shown in FIG. 7A.

FIG. 7C shows details of the DT decoder 471 of FIG. 7B. Referring to FIG. 7C, the DT decoder 471 includes m input AND gates and one output AND gate. Each of the m input AND gates has two logic inputs. The output AND gate has m logic inputs. The m bits of the device type DTsi, Bdtsi-1-Bdtsi-m, contained in the DT signal 445 are fed to one of the logic inputs of AND gates 481-1-481-$m$, respectively. The other logic inputs of the AND gates 481-1-481-$m$ receives logic "1" signal commonly (e.g., the other logic inputs being "pulled-up"). The logic output signals from the AND gates 481-1-481-$m$ are provided to the output AND gate 483 to provide the decoded signal 475. The ID generation performed by the ID generator 271 of FIG. 7A is shown in FIG. 8.

Referring to FIGS. 1, 7A-7C and 8, the ID generation command IDGC and the device type (DT), DTsi, are provided by the memory controller 110 (step 341). The memory controller 110 sends an initial ID, ID0, as the SI format for the ID generation. In the example, "DVi" represents a given device to perform the operations of device type match determination and ID generation. First to consider the operation of device 1, a device parameter "i" is determined to be "1" (step 342). Then, operation starts at a present device DVi and the operations of the DT match determination and the ID generation are performed at the device DVi.

The ID generator 271 of the present device DVi receives the IDGC, the DT, DTsi, and the ID, IDii (step 343). Then, the DTsi is decoded. The "don't care" information bits are specifically assigned. In this specific example, the bits of the "don't care" DT data are m bits (e.g., eight bits), all of which are "1". In a case where the "don't care" DT is not decoded from the received DTsi (NO at step 344), the DTsi is compared to a reference device type DTref (step 345). If the DTsi matches the DTref, the received IDii will be incremented to produce a new ID, IDj (step 346). If there is no match at step 345, the received ID, IDii, will be maintained as a new ID, IDj (step 347). Thus, at step 347, the ID generation is skipped or bypassed. After step 346 or 347, the new IDj is combined with the DTsi and the IDGC. The IDj is an output ID, IDoi, of the present device DVi. The combined IDGC-DT-ID data is transmitted by the present device DVi to a next device DV(i+1) (step 348).

If the present device DVi is not the last device (i.e., the N-th device) of the serial interconnection configuration (NO at step 349), the next device DV(i+1) becomes a device DVi and the device ID, IDii, is received thereby (step 350). At the next device, the ID is received as the IDii and the ID generation is repeated. If the present device DVi is the last device (i.e., device N (=16) of the serial interconnection configuration) (YES at step 349), the ID generation and skip operations end. The determination at step 349 is performed in response to the IDGC. At step 348, the present device DVi transmits the combined IDGC-DT-ID to the next device DV(i+1). If the next device DV(i+1) that received the combined data from the present device DVi is the memory controller 110, the present device DVi will be determined as the last device in the serial interconnection configuration (YES at step 349). This is determined whether the memory controller 110 received the IDGC contained in the combined data.

In a case where the received DTsi is the "don't care" code DTdc (YES at step 344), device type determination step 345 is not performed (i.e., skipped) and always a new ID, IDj, is generated for a next device DV(i+1) (step 346). Such a skip function is performed by the DT match detector 390. As the m bits (Bdtsi-1-Bdtsi-m) of the "don't care" DTdc are "111-11", all logic outputs of the AND gates 481-1-481-m of the DT decoder 471 are "1" and thus, the one-bit decoded signal 475 is "1", which is fed to the OR gate 479. As the DT match signal 249 becomes "high" and the selector 452 performs the "+1 ID" selection and the ID assignment is also performed (step 346).

In the ID generation operation, device 1 receives the initial ID, IDi, as an input ID and device 1 outputs IDo1 as an output ID. Next device 2 receives IDo1 and outputs IDo2. Similarly, each of the other devices receives an input ID from the previous device and outputs an output ID that is provided to the next device.

With reference to FIGS. 7A and 7B, the DTsi contained in the SI is fed to the input DT register 439 which in turn provides the m-bit parallel DTsi to the DT comparator 461 and the DT decoder 471 of the DT match detector 390. The DT decoder 471 receives the m-bit device type DTsi contained in the DT signal 445 and decodes it. Only when the DTsi is a pre-determined bit data (e.g., all "1" bits), the decoded signal 475 becomes "high". Also, the reference device type DTref of m bits is provided by the device type number storage/provider 447 to the DT comparator 461. In response to the DT determination control signal 221, the DT comparator 461 compares the m-bit DTsi to the m-bit DTref.

In a case where the DTsi is the "don't care" device type, the DTsi does not match the DTref, resulting in the comparison result signal 465 from the DT comparator 461 being "low". Simultaneously, the "don't care" DTsi is decoded by the DT decoder 471, resulting in the one-bit decoded signal 475 from the DT decoder 471 being "high" for time period Tm. Thus, the DT match signal 249 from the OR gate 479 becomes "high" and the selector 452 selects the calculation signal 451 having a +1 operation value. These operations are depicted in step 346 in FIG. 8.

In a case where the DTsi is not the "don't care" device type DTdc, the decoded signal 475 from the DT decoder 471 is "low". Furthermore, if the DTsi does not match the DTref, the comparison result signal 465 from the DT comparator 461 will be "low", in response to the DT determination control signal 221. If the DTsi matches the DTref, the comparison result signal 465 will be "high" for time period Tm, with the result that the DT match signal 249 is "high" and the "+1" operation value is selected by the selector 452. These operations are depicted in steps 344-347 in FIG. 8. Therefore, the process shown in FIG. 8 can generate consecutive IDs for all devices, regardless of devices types in the serial interconnection configuration.

Figure 9A:
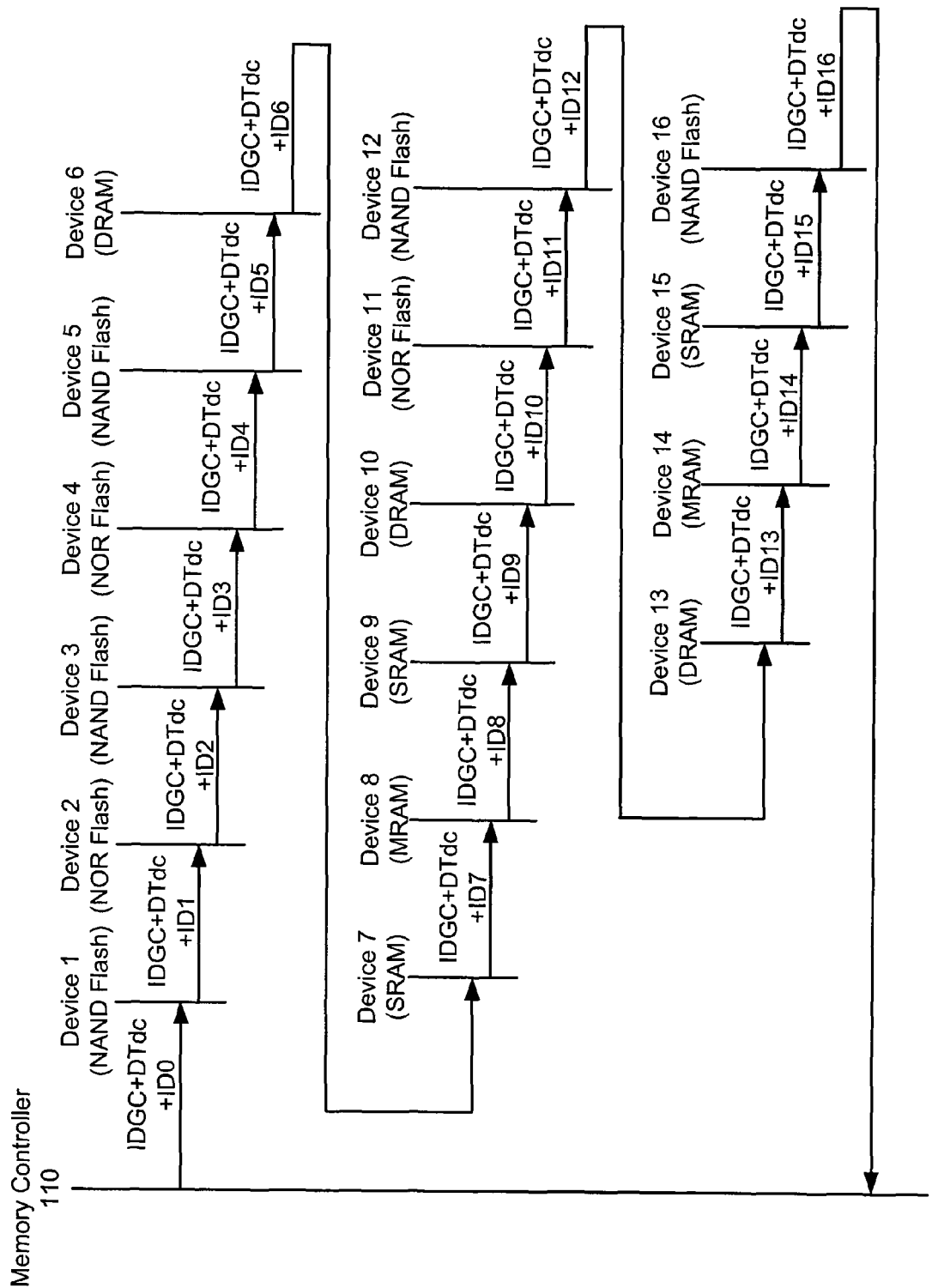
FIG. 9A is a schematic diagram illustrating a protocol conducted in the devices shown in FIG. 1, wherein all of the devices generate IDs.
Figure 9B:
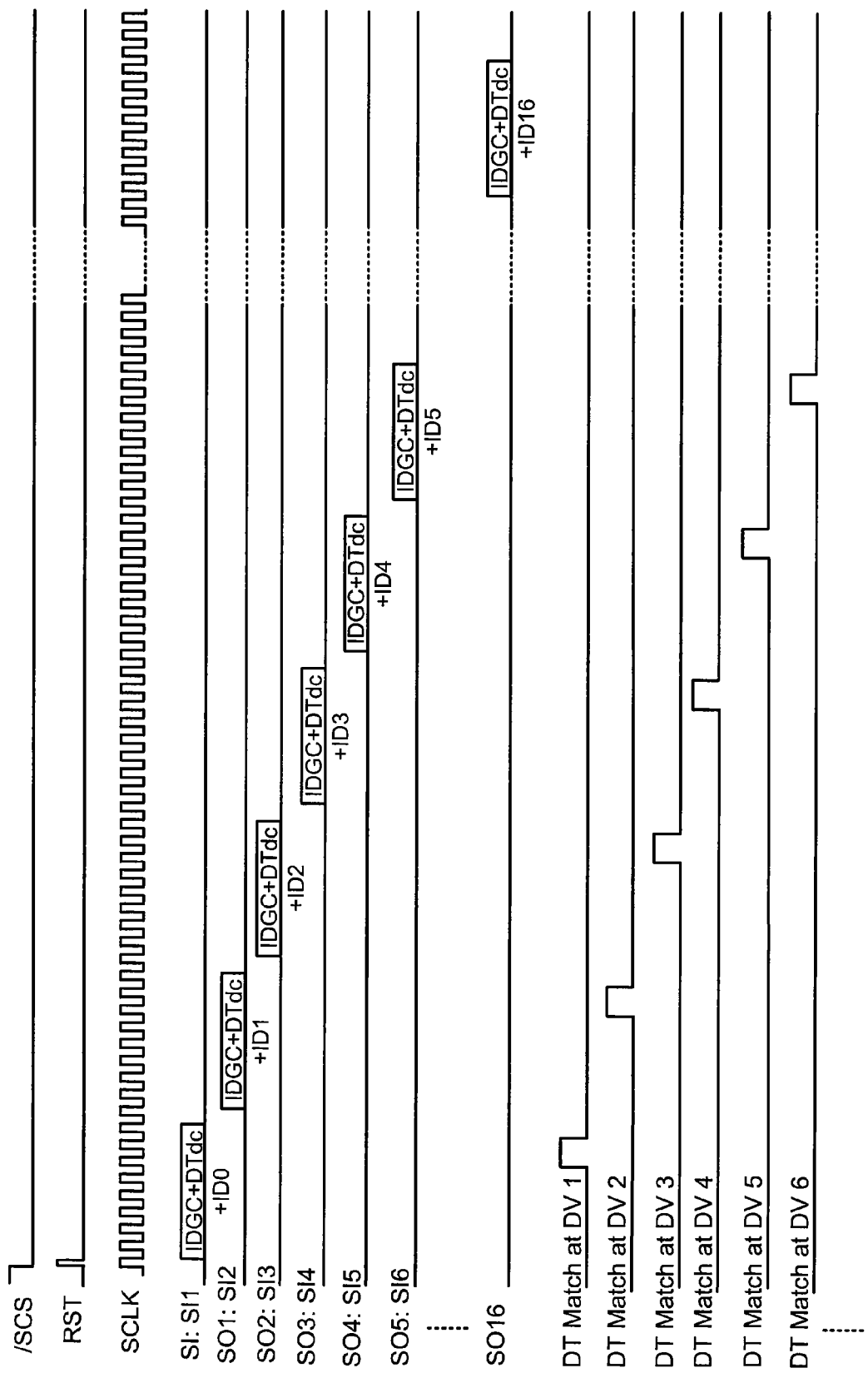
FIG. 9B is a timing diagram of the ID generation in the serial interconnection configuration, wherein all of the devices generate IDs.

When the DTsi is the don't care DT, DTdc, all of devices 1-16 generate IDs regardless of the device types. Such an ID generation process conducted by all devices is shown in FIG. 9A. The serial inputs and outputs of the devices and the DT match signals are shown in FIG. 9B.

When the DT match signal 249 is "high" resulting from the match determination by the DT comparator 461 or the DT decoder 471, in response to the "high" signal and the ID write enable signal 433, the device type IDii for the present device is registered in the ID register 231.

Table 6 shows the latched IDs in and generated IDs by all devices.

TABLE 6

| Device Number DV# | Memory Device Type | Latched ID (Number) | Generated ID (Number) |
|---|---|---|---|
| 1 | NAND Flash | 0 | 1 |
| 2 | NOR Flash | 1 | 2 |
| 3 | NAND Flash | 2 | 3 |
| 4 | NOR Flash | 3 | 4 |
| 5 | NAND Flash | 4 | 5 |
| 6 | DRAM | 5 | 6 |
| 7 | SRAM | 6 | 7 |
| 8 | MRAM | 7 | 8 |
| 9 | SRAM | 8 | 9 |
| 10 | DRAM | 9 | 10 |
| 11 | NOR Flash | 10 | 11 |
| 12 | NAND Flash | 11 | 12 |
| 13 | DRAM | 12 | 13 |
| 14 | MRAM | 13 | 14 |
| 15 | SRAM | 14 | 15 |
| 16 | NAND Flash | 15 | 16 |

Also, it can generate consecutive IDs only for devices of a specific type in accordance with the device type DTsi that match the reference device type DTref.

Figure 10:
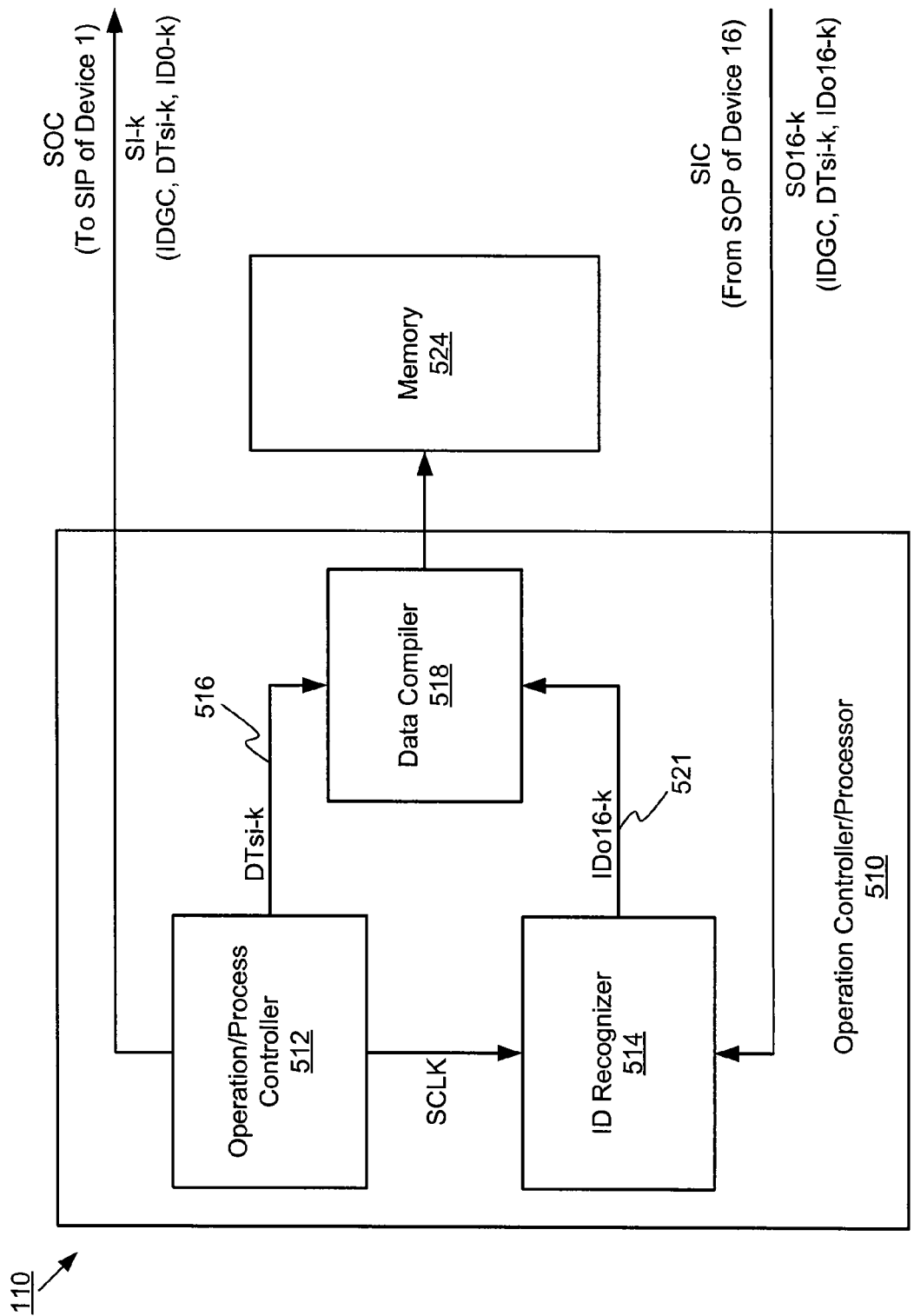
FIG. 10 is a block diagram of an example of a memory controller of FIG. 1.

FIG. 10 shows an example structure of an operation controller/processor included in the memory controller 110 of FIG. 1. Referring to FIG. 10, an operation controller/processor 510 includes an operation/process controller 512 that provides the clock signal SCLK to an ID recognizer 514. The operation/process controller 512 provides a device type (DT) signal 516 containing a device type DTsi-k to a data compiler 518. The ID recognizer 514 receives the ID signal containing the IDo16-k from the last device (i.e., device 16) of the serial interconnection configuration. The ID recognizer 514 provides an ID signal 521 containing the ID, IDo16-k, to the data compiler 518. The data compiler 518 provides a memory 524 with compiled data from the provided DTsi-k and IDo16-k. The memory 524 stores compiled data as a table including the device types and the last IDs. Here, k is an operation repetition parameter of repeated DT recognition and varies from 1 to M, M being an integer greater than 1.

Figure 11A:
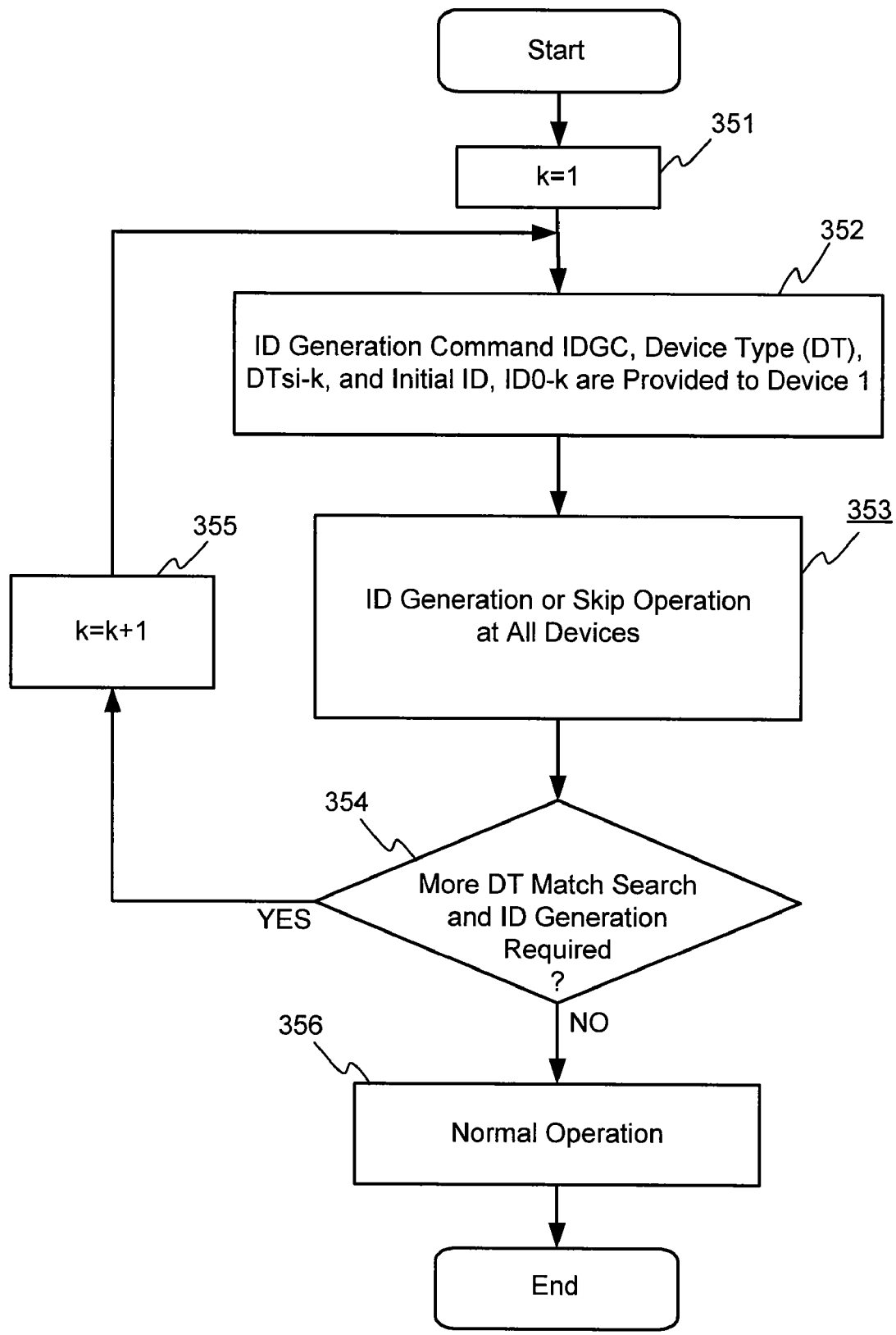
FIG. 11A is a flowchart illustrating an ID generation method performed by the devices shown in FIG. 1.
Figure 11B:
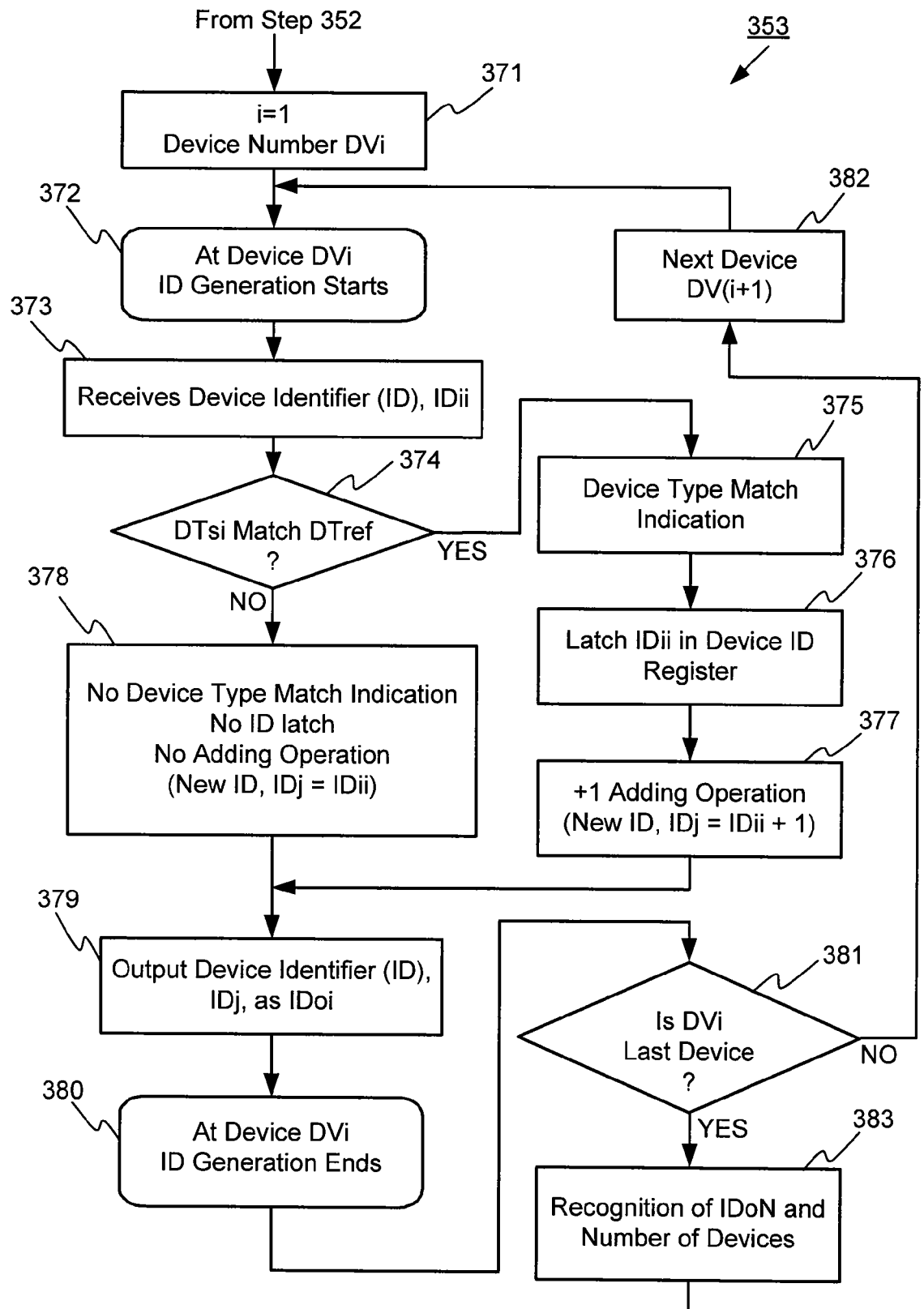
FIG. 11B is a flow chart of part of the ID generation method shown in FIG. 11A.
Figure 12:
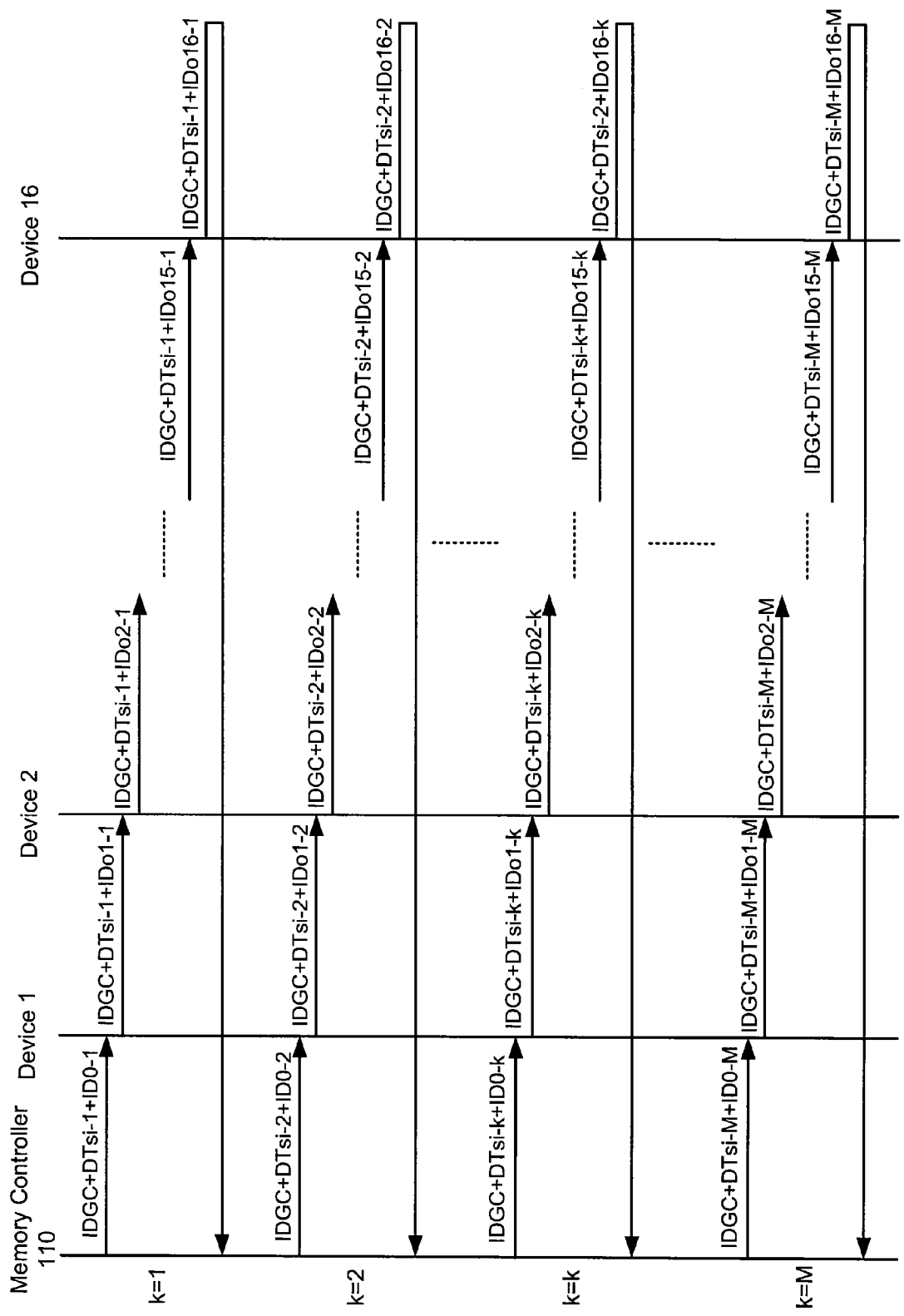
FIG. 12 is a schematic diagram illustrating a protocol conducted in the devices shown in FIG. 1.

FIG. 11A shows an ID generation method performed by the devices shown in FIG. 1. FIG. 11B shows part of the method shown in FIG. 11A. In the example method, the ID generation is performed by the ID generator shown in FIG. 7A. FIG. 12 shows another example of a protocol conducted in the devices shown in FIG. 1.

Referring to FIGS. 1, 7A, 10, 11A, 11B and 12, the operation repetition parameter k is assigned a value of 1 (step 351). The memory controller 110 (the operation controller/processor 510) sends an ID generation command IDGC, a device type DT, DTsi-k, and an initial ID, ID0k, as a packet to device 1 (step 352). The ID generation or the skip operation occurs at all devices (step 353). If another ID generation is necessary with regard to another device type DTsi (YES at step 354), with a new repetition parameter k (k=k+1) (step 355), steps 352-353 will be repeated. If no more ID generation is required (NO at step 354), the operation will be moved to the normal operation mode (step 356).

At step 353, first, a device DVi is assigned as i=1 (step 371). Then, the i-th device (the present device) DVi starts the ID generation process (step 372). The device DVi (e.g., device 2) receives, from a previous device DV(i−1) (e.g., device 1), a device ID, IDii, and the received ID is held in the input ID register 440 (step 373). Then, the device type match determination occurs.

At the device DVi, the DT clock generator 441 of the ID generator 271 generates the DT register clocks in response to the clock signal SCLK and the received DTsi-k is shifted into the input DT register 439. The device type DTsi-k is held in the input DT register 439 of the present device DVi. The DT comparator 461 compares the held DTsi-k to the reference DT, DTrefi, associated with the present device (step 374). If the values or numbers match between the DTsi-k and the DTrefi (YES at step 374), there will be provided a match indication between the DTsi-k and the DTrefi (step 375). Thus, the DT match signal 249 will be "high". This signal indicates to the present device to store the received device ID, IDii, (step 376), thereby assigning or establishing the device ID for the present device, DVi. After step 376, the ID number or value is altered by a "+1" operation (step 377), resulting in a new ID, IDj.

If the values of the DTsi-k and the DTrefi do not match (NO at step 374), there will be no DT match indication, so that the DT match signal 249 will be "low". The DT match signal 249 indicates to the present device neither to store the ID, nor conducting an ID alteration (step 378).

After step 377 or 378, the new ID, IDj, is converted to a serial output signal (step 379) for transmission to the next device DV(i+1) (e.g., device 3) in the serial interconnection configuration. As a result, the next device DV(i+1) receives the ID number, IDii. Upon completion of step 379, the ID generation process at the device DVi ends (step 380). If the device DVi is not the last device (i.e., device N) (NO at step 381), a next device DV(i+1) will be given (step 382) and the process at steps 372-380 will be repeated at that device DV(i+1). After the ID generation and/or skip operation ends at all devices (YES at step 381), the ID recognizer 514 of the operation controller/processor 510 recognizes the IDo16-k received from the last device (i.e., device N), at the time of receiving the IDGC and the DTsi-k (step 383) and moves to step 354.

From the recognized IDo16-k, the number of the devices of the provided device type DTsi-k is recognized by the data compiler 518 (step 383). Such operations of the ID generation and the last ID recognition are repeated with reference to the operation repetition parameter k being 1 to M (i.e., DTsi1 to DTsiM). Upon receipt of the DTsi-k from the operation/process controller 512 and the IDo16-k from the ID recognizer 514, the data compiler 518 compiles data with regard to the device type DTsi-k, the last ID and the number of devices having the device type DTsi-k. The compiled data is stored in the memory 524 as a table. In the example, the device types DTsi for the device type match search are the DTnd for NAND Flash devices, the DTnr for NAND Flash devices, the DTdm for DRAM devices, the DTsm for SRAM devices, the DTmm for MRAM devices and the "don't care" for every type memory device. The data fed by the data compiler 518 is stored in the memory 524. Table 7 shows compiled data.

TABLE 7

| K | Device Type (DTsi) | Last ID (IDo16) | Number of DT's Devices |
|---|---|---|---|
| 1 | NAND Flash (DTnd) | ID5 | 5 |
| 2 | NOR Flash (DTnr) | ID3 | 3 |
| 3 | DRAM (DTdm) | ID3 | 3 |
| 4 | SRAM (DTsm) | ID3 | 3 |
| 5 | MRAM (DTmm) | ID2 | 2 |
| 6 | AND Flash (DTad) | ID0 | 0 |
| 7 | Don't Care (DTdc) | ID16 | 16 |
| — | — | — | — |
| — | — | — | — |
| — | — | — | — |

As shown in Table 7, from the last ID, IDo16, the memory controller can recognize the number of the device with regard to the specific DT.

The DT match detector 390 of FIG. 7A includes the DT decoder 471 that detects only when all bits of the DTsi are "1". The DT decoder 471 can be replaced with an m-bit comparator that detects pre-defined data or information of the "don't care" device type DTdc.

Figure 13A:
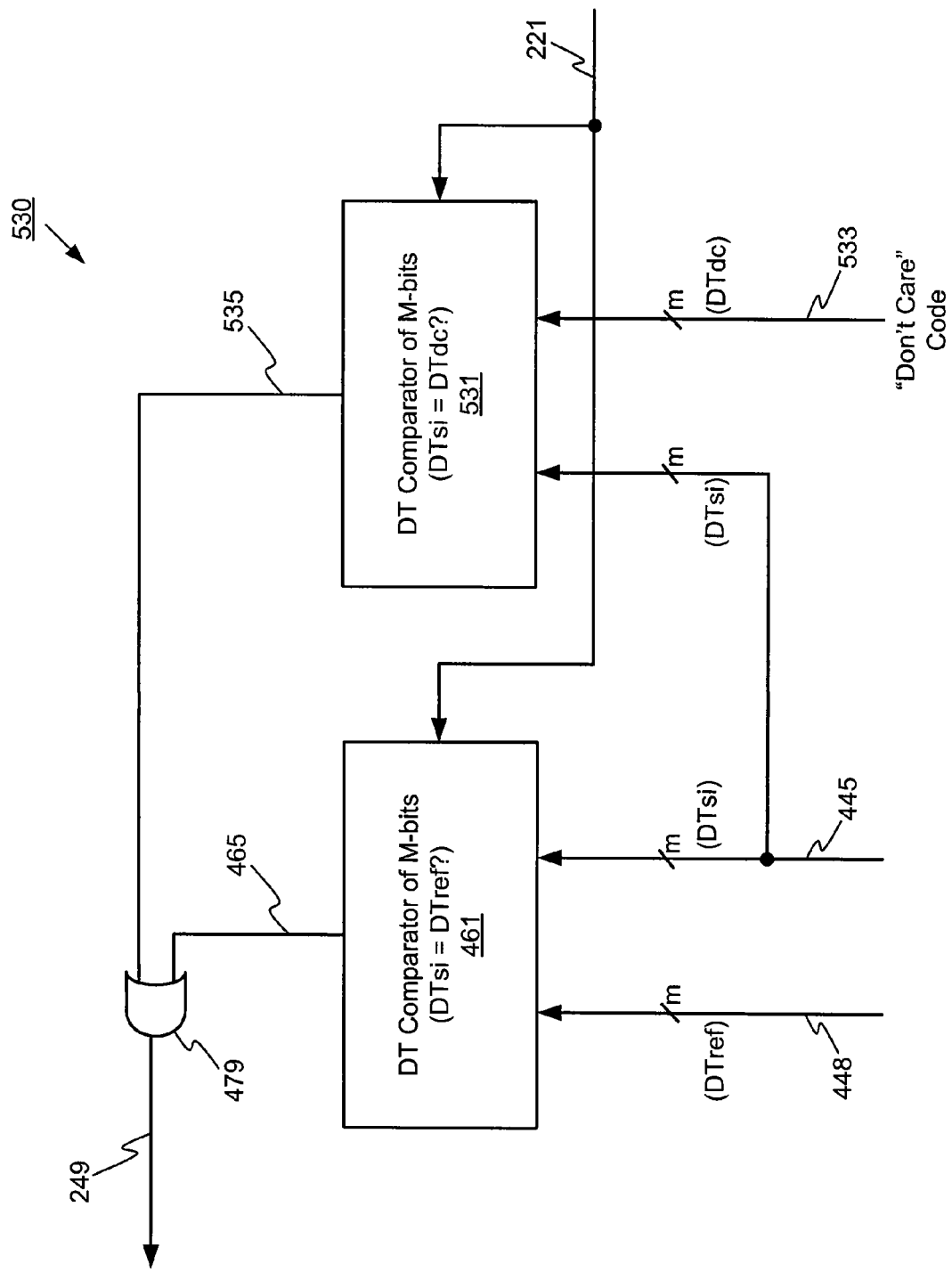
FIG. 13A is a block diagram illustrating another example of a DT match detector shown in FIG. 7A.

FIG. 13A shows another example of a DT match detector shown in FIG. 7A. A DT match detector 530 shown in FIG. 13A is similar to the DT match detector 390 of FIG. 7B. A difference is that the DT match detector 530 includes a DT comparator 531, instead of the DT decoder 471. The DT comparator 531 is similar to the m-bit DT comparator 461.

Referring to FIG. 13A, the DT comparator 531 is also an m-bit comparator. The DT comparator 531 receives the DT signal 445 containing the m-bit parallel DTsi, a "don't care" code signal 533 containing a "don't care" device type DTdc from a code source (not shown) and the DT determination control signal 221. The DT comparator 531 outputs a comparison result signal 535 to the OR gate 479.

Figure 13B:
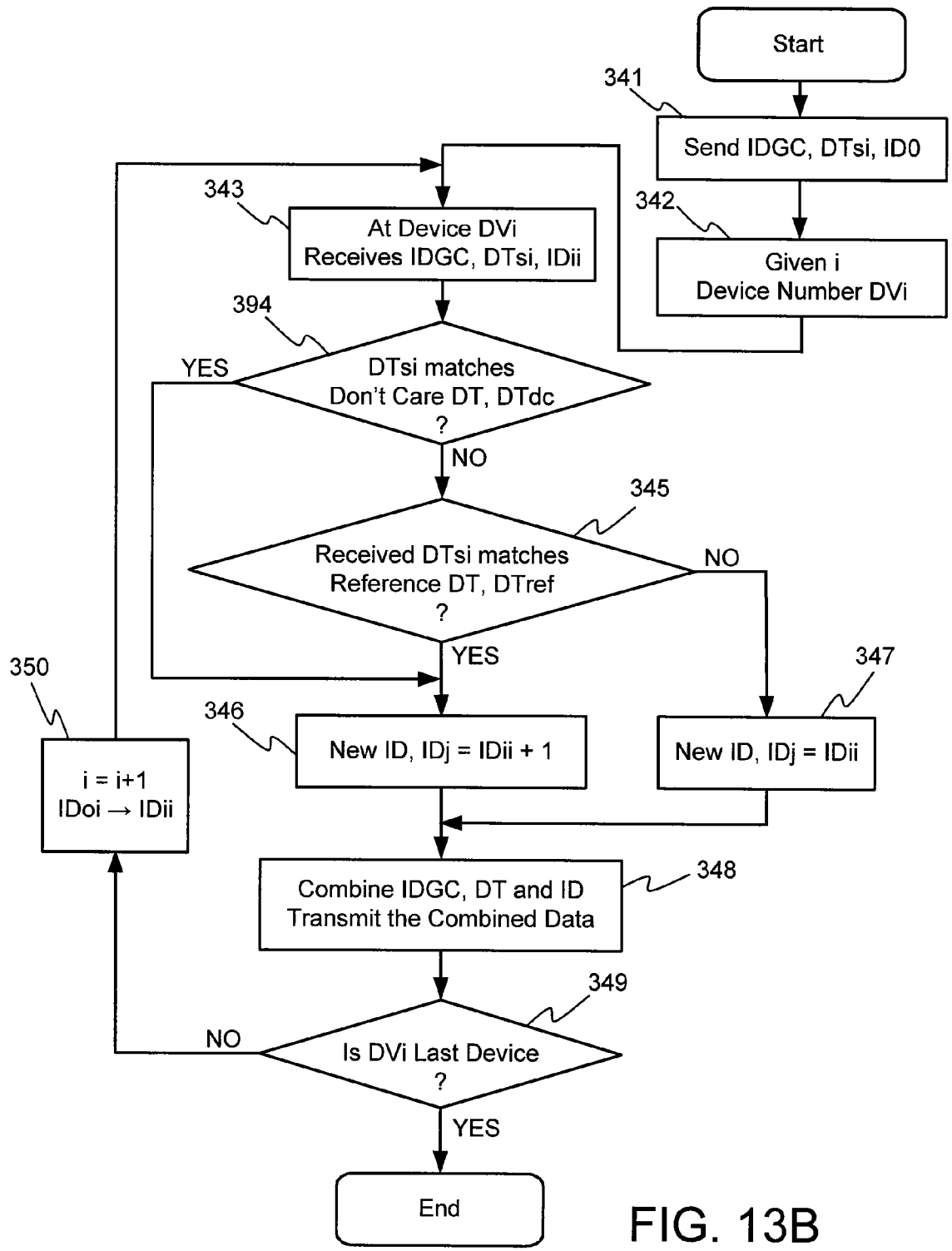
FIG. 13B is a flow chart illustrating an ID generation method applied to the device shown in FIG. 1 with the ID generator shown in FIG. 13A.

The ID generation performed by the ID generator 271 of FIG. 7A including the DT match detector 530 of FIG. 13A is shown in FIG. 13B. The ID generation process shown in FIG. 13B is similar to that of FIG. 8. A difference is that the process shown in FIG. 13B includes a "don't care" determination step (step 394), instead of the "don't care" decoding step (step 344) of FIG. 8.

Referring to FIGS. 1, 7A, 13A and 13B, the ID generator 271 of the present device DVi receives the IDGC, the DT, DTsi, and the ID, IDii (step 343). Then, the DTsi is compared to a "don't care" device type DTdc by the DT comparator 531 (step 394). In a case of the DTsi not being "don't care", the received DTsi is compared to a reference device type DTref (step 345). If the DTsi matches the DTref, the received ID will be incremented to produce a new ID, IDj (step 346). If there is no match at step 394, the received ID, IDii, will be maintained as a new IDj (step 347). Thus, at step 347, the ID generation is skipped or bypassed. After step 346 or 347, the new ID is outputted by the ID generator of the device DVi to a next device DV(i+1) (step 348).

In a case where the received DTsi is the "don't care" code DTdc, device type determination step 345 is not performed and a new ID is always generated for a next device DV(i+1) (step 346).

If the DT comparator 531 is used, the "don't care" code can be defined by any of bit combinations. In a case where IDs are to be generated and to detect the total number of the devices regardless of device types in the serial interconnection configuration, a memory controller can send such a pre-defined code as a device type DTsi as a serial input form.

In the examples described above, the latched ID in the ID register 231 of a device is the ID previously generated in the device wherein the device type DT matches the reference device type DTref thereof. Thus, the assigned ID to the present device is the ID generated by the ID generator 234 of another device and received by the present device.

Figure 14:
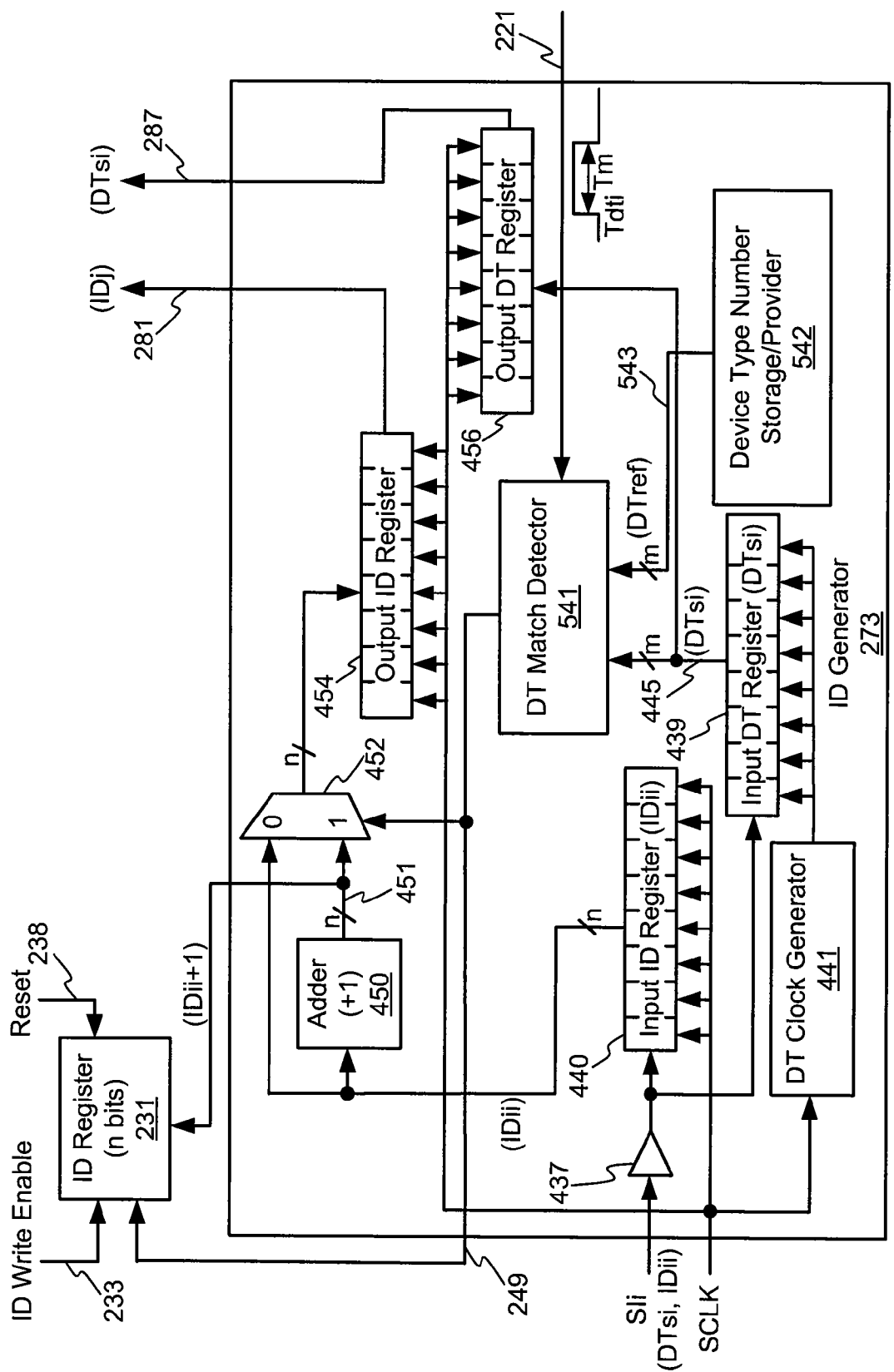
FIG. 14 is a block diagram illustrating another example of the ID generator wherein an altered ID is registered.

Alternatively, a device latches an ID generated thereby before or simultaneously the generated ID is transmitted to a next device. In the example, the stored and assigned ID to a device is the ID generated by the device when the device type DT matches the reference device type DTref thereof. Such an example is shown in FIG. 14. An ID generator shown in FIG. 14 is similar to the ID generators 234 and 271 of FIGS. 2D and 7A. A difference is that in an ID generator 273 of FIG. 14, the added ID (IDii+1) by the adder 450 is provided to the ID register 231 for registration or latch, instead of the non-calculated (non-altered) ID from the input ID register 440. In this example, the assigned ID is one generated by that device, not one generated by the previous or the other device. Therefore, the latched or registered IDs in the devices are different from ones shown in Tables 2 and 3.

Referring to FIG. 14, a DT match detector 541 is similar to the DT match detector 446 of FIG. 2D or the DT match detector 390 of FIG. 7A. A device type number storage/provider 542 provides a reference DT signal 543 containing a reference DTref. The comparator of the DT match detector 541 compares the received DTsi to the reference DTref or the reference DTref and the "don't care" device type DTdc to detect a device type match. In response to the DT match determination, the DT match signal 249 is provided.

Tables 4 and 5 show the latched or registered IDs and the generated or bypassed IDs in the devices of the serial interconnection configuration shown in FIG. 2A with the ID generator as shown in FIG. 14, in the cases where the device types provided by the memory controller are the DTnd and DTnr for NAND and NOR Flash devices, respectively. In Tables 8 and 9, "000**" is the reset state, not a latched ID.

TABLE 8

| Device | Device Type | DT Number or Value | Latched or Registered ID | Generated or Bypassed ID |
|---|---|---|---|---|
| 220-1 | NAND Flash | 00h | 001 | 001 |
| 220-2 | NOR Flash | 01h | 000** | 001 |
| 220-3 | NAND Flash | 00h | 010 | 010 |
| 220-4 | NOR Flash | 01h | 000** | 010 |
| 220-5 | NAND Flash | 00h | 011 | 011 |

TABLE 9

| Device | Device Type | DT Number or Value | Latched or Registered ID | Generated or Bypassed ID |
|---|---|---|---|---|
| 220-1 | NAND Flash | 00h | 000** | 000 |
| 220-2 | NOR Flash | 01h | 001 | 001 |
| 220-3 | NAND Flash | 00h | 000** | 001 |
| 220-4 | NOR Flash | 01h | 010 | 010 |
| 220-5 | NAND Flash | 00h | 000** | 010 |

In a case where the ID generator shown in FIG. 14 is used in the devices, the latched IDs are different. Table 10 shows the latched IDs in and generated IDs by all devices.

TABLE 10

| Device Number DV# | Memory Device Type | Latched ID (Number) | Generated ID (Number) |
|---|---|---|---|
| 1 | NAND Flash | 1 | 1 |
| 2 | NOR Flash | 2 | 2 |
| 3 | NAND Flash | 3 | 3 |
| 4 | NOR Flash | 4 | 4 |
| 5 | NAND Flash | 5 | 5 |
| 6 | DRAM | 6 | 6 |
| 7 | SRAM | 7 | 7 |
| 8 | MRAM | 8 | 8 |
| 9 | SRAM | 9 | 9 |
| 10 | DRAM | 10 | 10 |
| 11 | NOR Flash | 11 | 11 |
| 12 | NAND Flash | 12 | 12 |
| 13 | DRAM | 13 | 13 |
| 14 | MRAM | 14 | 14 |
| 15 | SRAM | 15 | 15 |
| 16 | NAND Flash | 16 | 16 |

Figure 15:
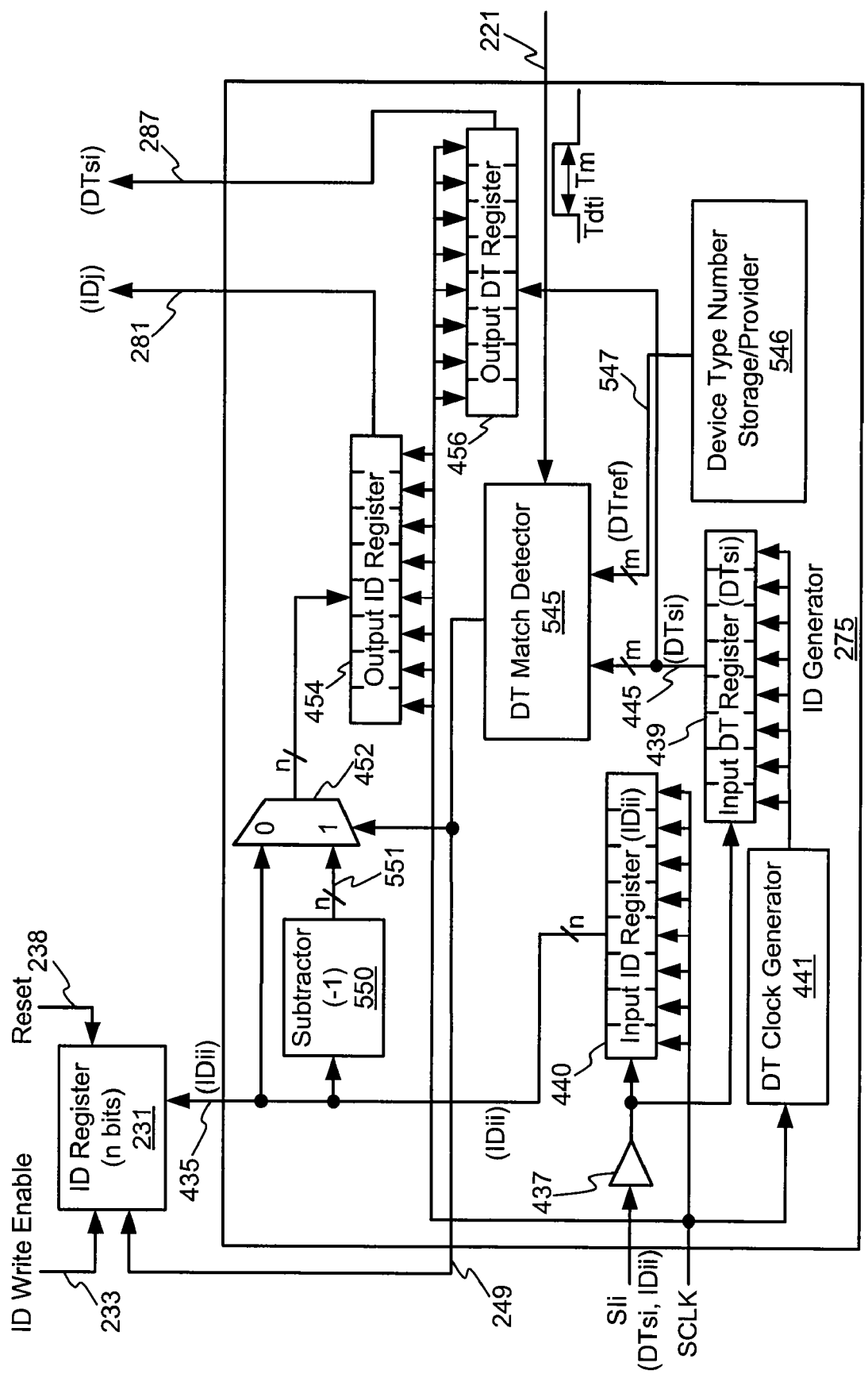
FIG. 15 is a block diagram illustrating another example of the ID generator wherein a subtracted ID is generated.

FIG. 15 shows another example of the ID generation. Referring to FIG. 15, an ID generator 275 is similar to the ID generators 234 and 271 of FIGS. 2D and 7A. A difference is that the ID generator 275 includes a subtractor 550, instated of an adder. A DT match detector 545 is similar to the DT match detector 446 of FIG. 2D or the DT match detector 390 of FIG. 7A. A device type number storage/provider 546 provides a reference DT signal 547 containing a reference DTref. The comparator of the DT match detector 545 compares the received DTsi to the reference DTref or the reference DTref and the "don't care" device type DTdc to detect a device type match. In response to the DT match determination, the DT match signal 249 is provided. The subtractor 550 subtracts one from the received IDi and the subtracted ID will be provided as a new ID, IDj, contained in subtraction output signal 551, if the received DTsi matches the reference DTref, With the ID generator 275, consecutive IDs from high to low are generated. If the initial ID number provided by a memory controller is Q (an integer), IDs will be generated in consecutive numbers from (Q-1) to low by the devices. In a case of Q being 16, the generated ID number is a consecutive number from 15 to 0. Table 11 shows the latched IDs in and generated IDs by all devices wherein the "don't care" device type DTdc is provided by the memory controller 110.

TABLE 11

| Device Number DV# | Memory Device Type | Latched ID (Number) | Generated ID (Number) |
|---|---|---|---|
| 1 | NAND Flash | Q | Q-1 |
| 2 | NOR Flash | Q-1 | Q-2 |
| 3 | NAND Flash | Q-2 | Q-3 |
| 4 | NOR Flash | Q-3 | Q-4 |
| 5 | NAND Flash | Q-4 | Q-5 |
| 6 | DRAM | Q-5 | Q-6 |
| 7 | SRAM | Q-6 | Q-7 |
| 8 | MRAM | Q-7 | Q-8 |
| 9 | SRAM | Q-8 | Q-9 |
| 10 | DRAM | Q-9 | Q-10 |
| 11 | NOR Flash | Q-10 | Q-11 |
| 12 | NAND Flash | Q-11 | Q-12 |
| 13 | DRAM | Q-12 | Q-13 |
| 14 | MRAM | Q-13 | Q-14 |
| 15 | SRAM | Q-14 | Q-15 |
| 16 | NAND Flash | Q-15 | Q-16 |

Each of the subtractor 550 of FIG. 15 and the adder 450 of FIG. 2D performs an arithmetic operation for calculating an ID to be newly generated for another device. The arithmetic operation can be achieved by increment or decrement by one or any other number or value. The increment or decrement by one is an example for an ID alteration.

Figure 16:
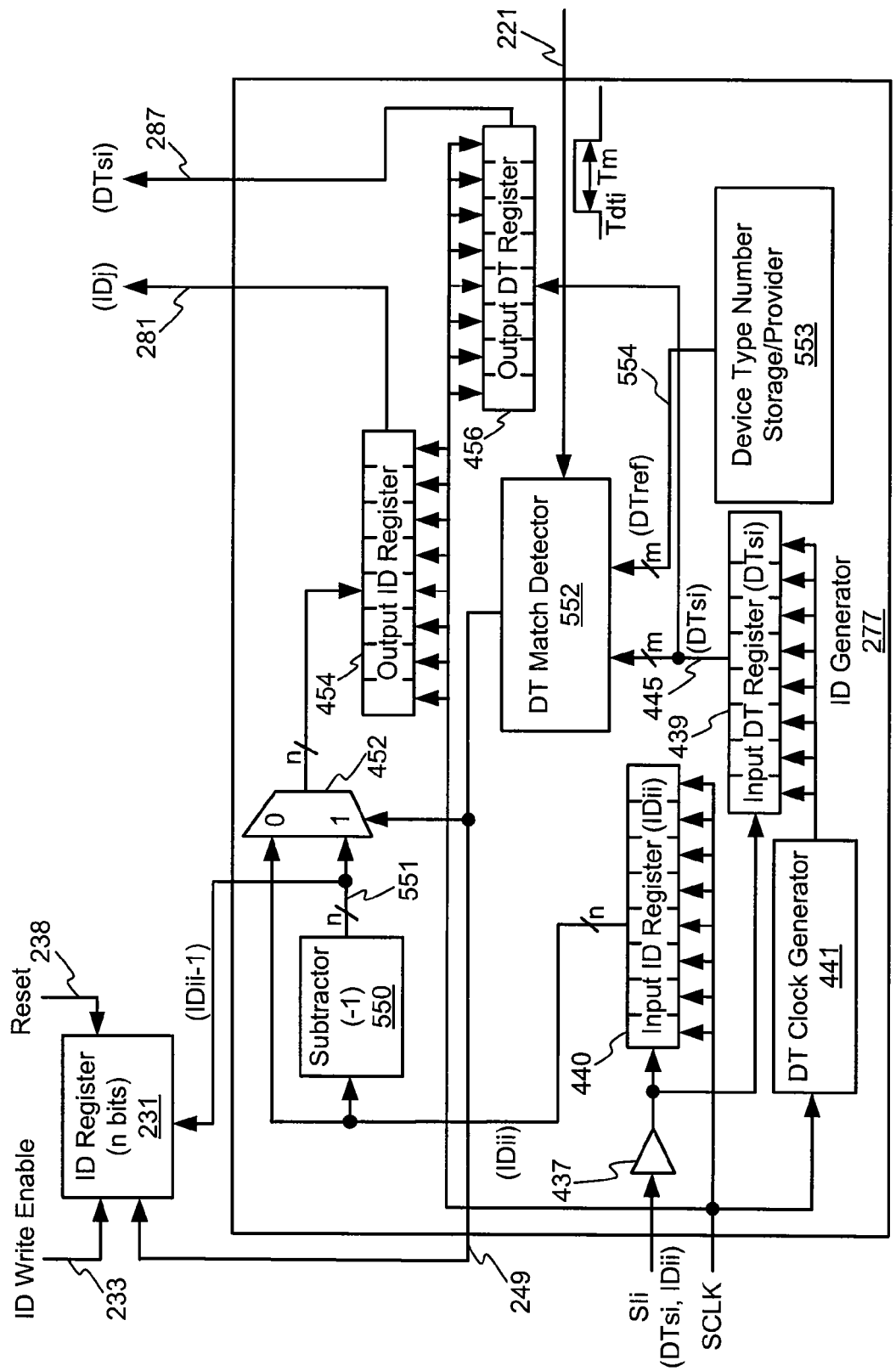
FIG. 16 is a block diagram illustrating another example of the ID generator wherein a subtracted ID is registered.

FIG. 16 shows another example of the ID generator. An ID generator 277 shown in FIG. 16 is similar to the ID generator 275 of FIG. 15. A difference is that the ID generator 277 provides a subtracted ID, IDii-1 to the ID register 231 wherein the ID is latched or registered in accordance with the DT match signal 249.

Referring to FIG. 16, a DT match detector 552 is similar to the DT match detector 446 of FIG. 2D or the DT match detector 390 of FIG. 7A. A device type number storage/provider 553 provides a reference DT signal 554 containing a reference DTref. The comparator of the DT match detector 552 compares the received DTsi to the reference DTref or the reference DTref and the "don't care" device type DTdc to detect a device type match. In response to the DT match determination, the DT match signal 249 is provided. Table 12 shows the latched IDs in and generated IDs by all devices wherein the "don't care" device type DTdc is provided.

TABLE 12

| Device Number DV# | Memory Device Type | Latched ID (Number) | Generated ID (Number) |
|---|---|---|---|
| 1 | NAND Flash | Q-1 | Q-1 |
| 2 | NOR Flash | Q-2 | Q-2 |
| 3 | NAND Flash | Q-3 | Q-3 |
| 4 | NOR Flash | Q-4 | Q-4 |
| 5 | NAND Flash | Q-5 | Q-5 |
| 6 | DRAM | Q-6 | Q-6 |
| 7 | SRAM | Q-7 | Q-7 |
| 8 | MRAM | Q-8 | Q-8 |
| 9 | SRAM | Q-9 | Q-9 |
| 10 | DRAM | Q-10 | Q-10 |
| 11 | NOR Flash | Q-11 | Q-11 |
| 12 | NAND Flash | Q-12 | Q-12 |
| 13 | DRAM | Q-13 | Q-13 |
| 14 | MRAM | Q-14 | Q-14 |
| 15 | SRAM | Q-15 | Q-15 |
| 16 | NAND Flash | Q-16 | Q-16 |

Figure 17A:
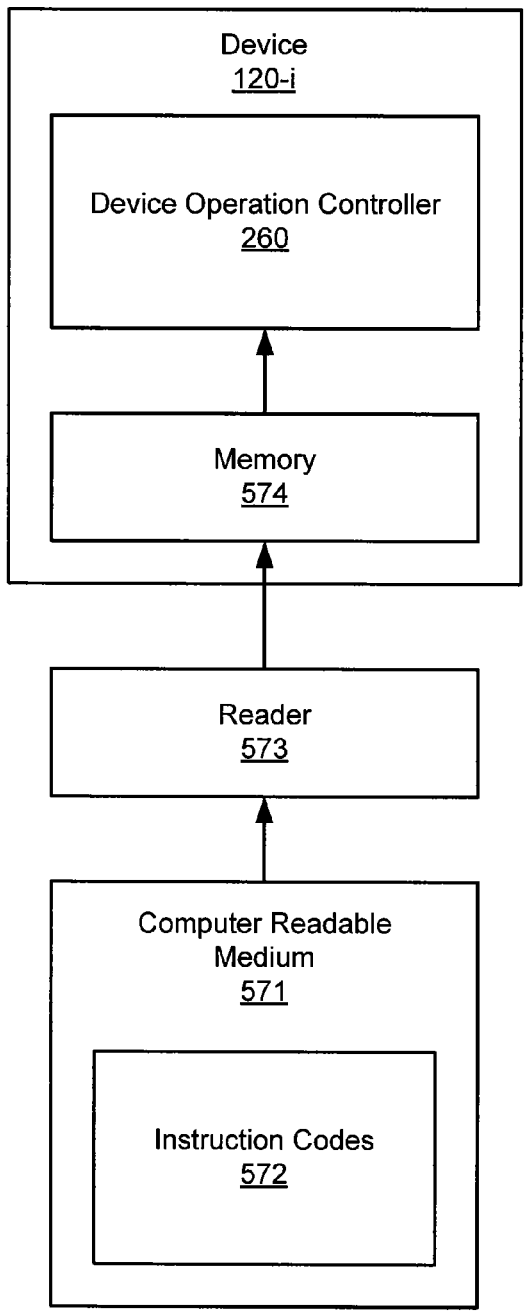
FIG. 17A is a block diagram illustrating a machine-readable medium storing commands and instructions for use in a device of FIG. 1.

FIG. 17A shows a machine-readable medium storing commands and instructions that can be used for the devices 120-1-120-16 of FIG. 1. Referring to FIGS. 1, 2B and 17A, a computer-readable medium 571 (e.g., a non-volatile memory) containing instruction codes 572 is provided to a reader 573 which in turn reads the instruction codes 572. The read codes are provided to a memory 574 and stored therein. If the memory 574 is included in the device 120-*i*, its device operation controller 260 can process the codes stored in the memory 574 and perform the functions defined by the instruction codes 572. In a case where the instruction codes 572 define the methods of the DT match determination and the ID generation described earlier, the device operation controller 260 can execute the commands and instructions to perform the methods.

Figure 17B:
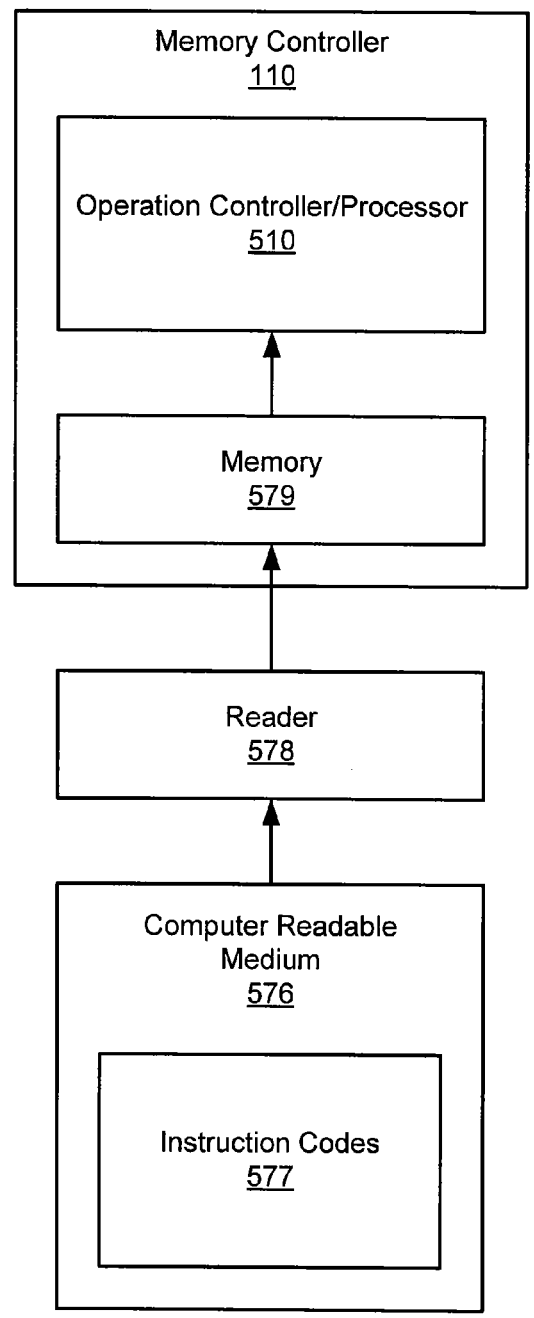
FIG. 17B is a block diagram illustrating a machine-readable medium storing commands and instructions for use in a memory controller of FIG. 1.

FIG. 17B shows a machine-readable medium storing commands and instructions that can be used for the memory controller 110 of FIG. 1. Referring to FIGS. 1, 10 and 17B, a computer-readable medium 576 (e.g., a non-volatile memory) containing instruction codes 577 is provided to a reader 578. The reader 578 reads the instruction codes 577 and the read codes are provided to a memory 579 and stored therein. If the memory 579 is included in the memory controller 110, the operation controller/processor 510 of which can process the codes stored in the memory 579 and perform the functions defined by the instruction codes 577. In a case where the instruction codes 577 contained in the computer-readable medium 576 define the methods of providing the IDGC, IDs and DTs and of receiving the SO and recognizing the IDGC, IDs and DTs described earlier, the operation controller/processor 510 can execute the commands and instructions to perform the methods.

The present invention is applicable to a system including a plurality of devices in a serial interconnection configuration operating to generate an ID at each device employing an example of ID generation logic for dual links. For example, serial inputs SI0 and SI1 are fed into serial input port connections SIP0 and SIP1 of a device and serial outputs SO0 and SO1 are provided from serial output port connections SOP0 and SOP1 of that device. The transferring of the serial inputs SO0, SI1 and the serial outputs SO0, SO1 is separately controlled. Any serial input pin and one control pin can have the same functionality. Also, an ID generation logic may be possible for multiple links wherein a plurality of devices having multiple ports is interconnected.

The above-described embodiments may operate with either of a single data rate (SDR) interface or a double data rate (DDR) interface.

In the above-described examples, the bit structure of the ID stored in the ID register 231 of the devices 120-*i* and transmitted in a packet is "MSB→LSB". The bit structure of each of other data (e.g., "Packet Start", "IDGC", "DT", "Packet End") contained in the packet is also "MSB→LSB". Alternatively, the bit structure of each data contained in a packet can be "LSB→MSB" and the ID bits of "LSB→MSB" can be stored in the ID register 231.

In the above-described examples, the ID generation command IDGC, the device type DT and the device identifier ID are transmitted as a packet. Those of ordinary skill in the art may practice that data on the IDGC, DT and ID can be transmitted as a group by a way other than a packet.

In the above-described embodiments, the operation has been described based on the active "high" signals for the purpose of simplicity. The circuits of any blocks may be designed to perform the operation based on the "low" active signals, in accordance with a design preference.

In the embodiments described above, the device elements and circuits are connected to each other as shown in the figures, for the sake of simplicity. In practical applications of the present invention to apparatus, devices, elements, circuits, etc., may be connected directly to each other. As well, devices, elements, circuits etc., may be connected indirectly to each other through other devices, elements, circuits, etc., necessary for operation of the apparatus. Thus, in actual configuration, the circuit elements and devices are directly or indirectly coupled with or connected to each other.

The embodiments described above are directed to systems including memory devices. The technique described above can be applied to systems including other semiconductor devices, such as, for example, data processing devices, which are distinguishable in accordance with predetermined data or information on their characteristics or types. Such systems can be included by electronic equipment or products.

It will be apparent to those of ordinary skill in the art that the ID generators or producers, the controllers, the processors and the other device elements and the memory controllers may be achieved by hardware or software.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A system comprising:
   a signal processor for outputting an initial serial input signal including a search device type and an initial device identifier, and receiving a last serial output signal; and
   a serial interconnection configuration of first to N-th semiconductor memory devices of mixed types, N being an integer greater than one, each of the semiconductor memory devices having a semiconductor memory associated therewith, and a device type, the device type being related to the semiconductor memory;
   each i-th semiconductor memory device of the first to N-th semiconductor memory devices, where i is one to N, having
      a serial input connection for receiving the initial serial input signal or a serial input signal from an (i−1)-th semiconductor memory device and
      a serial output connection for providing a serial output signal including a combination of the search device type and a propagated device identifier as the serial input signal to the (i+1)-th semiconductor memory device except for the i=N-th semiconductor memory device that provides the signal processor with the last serial output signal having the combination of the search device type and a last device identifier,
   the serial input connection of the i-th semiconductor memory device being coupled to the signal processor or the serial output connection of an (i−1)-th semiconductor memory device,
   the serial output connection of the i-th semiconductor memory device being coupled to the serial input connection of an (i+1)-th semiconductor memory device or the signal processor,
   the initial serial input signal provided to the serial input connection of the first semiconductor memory device of the first to N-th semiconductor memory devices being propagated through the first to N-th semiconductor memory devices with or without the initial device identifier or the propagated device identifier being altered as each i-th semiconductor memory device is configured to determine the device type of the i-th semiconductor memory device by comparing the device type of the i-th semiconductor memory device to the search device type, each i-th semiconductor memory device modifying the initial device identifier to provide the propagated device identifier or the propagated device identifier to provide the last device identifier, in response to the comparison to provide the serial output signal or the last serial output signal, the last serial output signal including the last device identifier.

2. The system of claim 1, wherein each i-th semiconductor memory devices comprises:
   a receiver for receiving the initial device identifier or the propagated device identifier and the search device type provided through the serial input connection of the i-th semiconductor memory device;
   a determiner for comparing the device type of the i-th semiconductor memory device to the search device type to provide a determination result;
   an output device identifier provider for outputting an output device identifier in response to the determination result; and
   an information provider for providing a combination of the search device type and the initial device identifier or propagated device identifier as the output device identifier, the output device identifier corresponding to the serial output signal or the last serial output signal.

3. The system of claim 2, wherein the output device identifier provider comprises:
   a calculator for performing a calculation based on the initial device identifier or the propagated device identifier and a pre-defined value to produce a calculated device identifier.

4. The system of claim 3, wherein each i-th semiconductor memory device further comprises:
   a device type provider for providing device type information associated with the i-th semiconductor memory device as a reference device type.

5. The system of claim 4, wherein the determiner comprises:
   a comparator for comparing the search device type with the reference device type to provide the determination result.

6. The system of claim 5, wherein the output device identifier provider further comprises:
   a selector for selecting the
   initial device identifier or the calculated device identifier as the output device identifier in response to the determination result, or the propagated device identifier or the calculated device identifier as the output device identifier in response to the determination result, the output device identifier being outputted from the output device identifier provider.

7. The system of claim 6, wherein the receiver comprises:
   a register:
      for registering the initial device identifier or the propagated device identifier and the search device type in serial manner to provide a registered device identifier; and
      for outputting each of the registered device identifier and the search device type in a parallel manner,
   the search device type being provided to the comparator in parallel, the initial device identifier or the propagated device identifier being provided to the calculator in parallel.

8. The system of claim 7, wherein the device type provider comprises:
a device type information storage for:
holding the device type information corresponding to the device type of the i-th semiconductor memory device; and
providing the device type information as the reference device type for the comparator.

9. The system of claim 1, wherein the signal processor comprises:
a serial output receiver for receiving the last serial output signal from the N-th semiconductor memory device.

10. The system of claim 9, wherein the serial output receiver comprises:
a recognizer for recognizing a device identifier number contained in the last serial output signal from the N-th semiconductor memory device, the number of semiconductor memory devices being obtained from the device identifier number with respect to a specific device type provided by the signal processor.

11. The system of claim 2, wherein the search device type and the initial device identifier or the propagated device identifier are transmitted as a packet.

12. The system of claim 11, wherein:
the packet includes a device identifier generation command for instructing each i-th semiconductor memory device to execute a device identifier generation operation; and
the determiner includes a packet interpreter for interpreting the device identifier generation command and the search device type.

13. The system of claim 12, wherein the information provider comprises:
a combiner for combining the device identifier generation command, the search device type and the initial device identifier or the propagated device identifier; and
a packet output provider for providing the device identifier generation command, search device type and initial device identifier or propagated device identifier in the packet.

14. The system of claim 6, wherein the receiver comprises:
a register for registering the calculated device identifier or the propagated device identifier and the search device type in serial manner to provide a registered device identifier.

15. An apparatus for outputting a device identifier at an i-th semiconductor memory device coupled to an (i+1)-th semiconductor memory device in a serial interconnection configuration where i is an integer value, the i-th semiconductor memory device having a serial input connection coupled to a serial output connection of an (i−1)-th semiconductor memory device in the serial interconnection configuration, the (i+1)-th semiconductor memory device having a serial input connection coupled to a serial output connection of the i-th semiconductor memory device, each i-th semiconductor memory device having a semiconductor memory associated therewith and a device type, the device type being related to the semiconductor memory, each of the semiconductor memory devices being of different types, the apparatus comprising:
a receiver for receiving an input device identifier and an input device type through the serial input connection of the i-th semiconductor memory device;
a determiner for performing:
a determination of whether the device type of the i-th semiconductor memory device contains pre-defined data corresponding to any device type of the different types in response to the input device type to provide a determination result; and
an output device identifier provider for outputting the input device identifier with or without being altered as the device identifier in response to the determination result.

16. The apparatus of claim 15, wherein the determination is a first determination and the determination result is a first determination result, and the determiner further performs:
a second determination of the device type of the i-th semiconductor memory device by comparing the device type of the i-th semiconductor memory device to the input device type to provide a second determination result.

17. The apparatus of claim 16, wherein the output device identifier provider comprises:
a calculator for performing a calculation of the input device identifier with a pre-defined value to produce a calculated device identifier.

18. The apparatus of claim 17, further comprising:
a device type provider for providing device type information of the i-th semiconductor memory device.

19. The apparatus of claim 18, wherein the determiner comprises:
a first device type determiner for determining whether the pre-defined data is contained in the input device type to provide the first determination result; and
a second device type determiner for determining whether the device type information is contained in the input device type to provide the second determination result.

20. The apparatus of claim 19, wherein the output device identifier provider further comprises:
a selector for selecting the input device identifier or the calculated device identifier as the output device identifier in response to the first determination result and the second determination result, the output device identifier being outputted through the output connection of the i-th semiconductor memory device.

21. The apparatus of claim 20, wherein the receiver comprises:
a register:
for registering the input device identifier to provide a registered device identifier and the input device type in serial manner; and
for outputting each of the registered device identifier and the input device type in parallel manner,
the input device type being provided to the comparator in a parallel manner, the registered device identifier being provided to the calculator in a parallel manner.

22. The apparatus of claim 21, wherein the determiner further comprises:
a device type information storage for:
holding the device type information corresponding to the device type of the i-th semiconductor memory device; and
providing the device type information for the second determination.

23. The apparatus of claim 19, wherein:
the first device type determiner comprises a decoder for decoding the input device type to provide the first determination result when the pre-defined data is detected; and
the second device type determiner comprises a comparator for comparing the input device type with the device type information to provide the second determination result.

24. The apparatus of claim 19, wherein:
the first device type determiner comprises a first comparator for comparing the input device type with the pre-defined data to provide the first determination result; and
the second device type determiner comprises a second comparator for comparing the input device type with the device type information to provide the second determination result.

25. A system comprising a plurality of semiconductor memory devices of mixed types in a serial interconnection configuration, each of the plurality of semiconductor memory devices having a semiconductor memory associated therewith and a device type, the device type being related to the semiconductor memory, an i-th semiconductor memory device having a serial input connection coupled to a serial output connection of an (i-1)-th semiconductor memory device where i is an integer number, an (i+1)-th semiconductor memory device having a serial input connection coupled to a serial output connection of the i-th semiconductor memory device, at least one of the semiconductor memory devices comprising:
a receiver for receiving a device identifier and a search device type provided through the serial input connection of the at least one of the semiconductor memory devices;
a determiner for providing a determination result corresponding to a determination of the device type of the at least one of the semiconductor memory devices based on the search device type or whether the device type of the at least one of the semiconductor memory devices contains pre-defined data corresponding to any of the mixed types; and
an output device identifier provider for outputting an output device identifier corresponding to the at least one of the semiconductor memory devices in response to the determination result, the output device identifier including the device identifier with or without being altered.

26. The system of claim 25, wherein the output device identifier provider comprises:
a calculator for performing a calculation of the modified device identifier based on the device identifier and a pre-defined value; and
a pass operator for passing the device identifier,
wherein, in response to the determination result, the modified device identifier or the device identifier is provided by the device identifier assignor.

27. The system of claim 26, wherein the at least one of the semiconductor memory devices further comprises:
a device information provider for providing device type information of the at least one of the semiconductor memory devices.

28. The system of claim 27, wherein the determiner comprises:
a comparator for comparing the search device type to the device type information to provide the determination result.

29. The system of claim 28, wherein the output device identifier provider further comprises:
a selector for selecting the modified device identifier or the device identifier as the output device identifier in response to the determination result from the comparator, the output device identifier being outputted through the output connection of the at least one of the semiconductor memory devices.

30. The system of claim 29, wherein the receiver comprises:
a holder for holding the device identifier and the search device type, the held device identifier and the search device type being provided to the calculator and the comparator, respectively.

31. The system of claim 30, wherein the holder comprises:
a first serial to parallel holder for holding the device identifier in a serial manner and outputting the device identifier in a parallel manner; and
a second serial to parallel holder for holding the device type in a serial manner and outputting the device type in a parallel manner.

32. The system of claim 31, wherein the output device identifier provider further comprises:
a parallel to serial holder for holding the modified device identifier in a parallel manner and outputting the modified device identifier in a serial manner.

33. The system of claim 32, wherein the device information provider comprises:
an information storage for storing the device type information on the mixed types of the plurality of semiconductor memory devices, the device type information being provided in a parallel manner to the comparator.

34. The system of claim 33, wherein:
the information storage comprises a storage capable of:
storing the device type information corresponding to different types of semiconductor memory devices; and
providing one of the device type information corresponding to a selected type of the semiconductor memory devices.

35. The system of claim 25, wherein the mixed types comprise more than one type of random access memories and Flash memories.

36. The system of claim 35, wherein the at least one of the semiconductor memory devices further comprises:
a device identifier holder for holding the device identifier in response to the determination result.

37. A method for assigning a device identifier number for first to N-th semiconductor memory devices of mixed types in a serial interconnection configuration, where N is an integer greater than one, each of the first to N-th semiconductor memory devices having a semiconductor memory associated therewith and a device type, the device type being related to the semiconductor memory, an i-th semiconductor memory device having a serial input connection coupled to a serial output connection of an (i−1)-th semiconductor memory device, where i is one to N, an (i+1)-th semiconductor memory device having a serial input connection coupled to a serial output connection of the i-th semiconductor memory device, the method comprising:
providing a search device type to the i-th semiconductor memory device;
holding the search device type at the i-th semiconductor memory device;
determining whether the search device type matches a reference device type associated with the i-th semiconductor memory device to provide a first determination result;
determining whether the device type of the i-th semiconductor memory device contains pre-defined data corresponding to any device type of the different types to provide a second determination result;
outputting a device identifier through the serial input connection of the i-th semiconductor memory device; and at the i-th semiconductor memory device wherein the device identifier is provided, conducting a device identifier assignment to assign the device identifier as the device identifier number for the i-th semiconductor memory device in response to the first determination result and the second determination result at the i-th semiconductor memory device.

38. A method for use in a serial interconnection configuration of N semiconductor memory devices of mixed types, N being an integer greater than one, each semiconductor memory device having a semiconductor memory associated therewith and a device type, the device type being based on the semiconductor memory, a first semiconductor memory device of the N semiconductor memory devices having a serial input connection coupled to a serial output connection of a previous semiconductor memory device of the N semiconductor memory devices, a second semiconductor memory device of the N semiconductor memory devices having a serial input connection coupled to a serial output connection of the first semiconductor memory device, each i-th semiconductor memory device of the N semiconductor memory devices determining the device type of the i-th semiconductor memory device in response to a search device type and providing a combination of an output device type and a device identifier, where i is one to N; the method comprising:
providing a serial input signal containing the search device type to the first semiconductor memory device, the output device type being propagated through the N semiconductor memory devices and the device identifier being propagated through the N semiconductor memory devices with or without being altered in response to the determination of the device type; and
receiving a serial output signal containing the output device type and the device identifier provided from the N-th semiconductor memory device.

39. The method of claim 38, wherein the step of receiving further comprises:
recognizing a device identifier number contained in the serial input signal from the serial output connection of the N-th semiconductor memory device.

40. The method of claim 39, wherein:
the step of providing comprises:
providing a unique device type accompanied with an initial device identifier number contained in the serial input signal to the first semiconductor memory device, the unique device type matching any of the mixed types of the semiconductor memory devices, the serial input signal containing a device identifier number altered by the i-th semiconductor memory device in response to a determination result; and
the step of recognizing comprises:
receiving the serial output signal containing the device identifier number accompanied with the unique device type from the N-th semiconductor memory device; and
recognizing the number of the semiconductor memory devices in the serial interconnection configuration based on the device identifier number.

41. The method of claim 40, wherein the step of providing further comprises:
providing a device identifier generation command; and
combining the device identifier generation command, the initial device identifier number and the unique device type into the serial input signal.

42. The method of claim 41, wherein the unique device type and the initial device identifier are transmitted as a packet.

43. A machine-readable medium storing commands and instructions which, when executed, cause a processor to perform a method of receiving an output signal from a last semiconductor memory device of N semiconductor memory devices of mixed types in a serial interconnection, N being an integer greater than one, each of the N semiconductor memory devices having a semiconductor memory associated therewith and a device type, the device type being based on the semiconductor memory, a first semiconductor memory device of the N semiconductor memory devices having a serial input connection coupled to a serial output connection of a previous semiconductor memory device of the N semiconductor memory devices, a second semiconductor memory device of the N semiconductor memory devices having a serial input connection coupled to a serial output connection of the first semiconductor memory device, each i-th semiconductor memory device of the N semiconductor memory devices determining the device type of the i-th semiconductor memory device in response to a search device type and providing a combination of an output device type and a device identifier, the method comprising:
providing a serial input signal containing the search device type to the first semiconductor memory device, the output device type being propagated through the N semiconductor memory devices and the device identifier being propagated through the N semiconductor memory devices with or without being altered in response to the determination of the device type; and
receiving a serial output signal containing the output device type and the device identifier provided from the N-th semiconductor memory device.

44. The machine-readable medium of claim 43, wherein the method further comprises:
providing a device identifier generation command;
providing in the serial input signal a unique device type accompanied with an initial device identifier number and the device identifier generation command to the first semiconductor memory device, the unique device type matching any of the mixed types of the semiconductor memory devices, the serial input signal containing a device identifier number altered by the i-th semiconductor memory device in response to the determination of the device type of the i-th semiconductor memory device;
receiving the serial output signal containing the device identifier number from the N-th semiconductor memory device; and
recognizing a number of the N semiconductor memory devices in the serial interconnection configuration based on the device identifier number.

45. The machine-readable medium of claim 44, wherein the method further comprises:
combining the device identifier generation command, the initial device identifier number and the unique device type to provide combined data; and
providing the serial input signal containing the combined data as a packet to the first semiconductor memory device of the serial interconnection configuration.

46. A machine-readable medium storing commands and instructions which, when executed, cause a processor to perform a method of assigning a device identifier for a plurality of semiconductor memory devices of mixed types in a serial interconnection configuration, each of the plurality of semiconductor memory devices having a semiconductor memory associated therewith and a device type, the device type being related to the semiconductor memory, an i-th semiconductor memory device of the plurality of semiconductor memory devices having a serial input connection coupled to a serial output connection of an (i-1)-th semiconductor memory device of the plurality of semiconductor memory devices, an (i+1)-th semiconductor memory device of the plurality of semiconductor memory devices having a serial input connection coupled to a serial output connection of the i-th semiconductor memory device, where i is an integer number, the method being adopted to be executed in at least one of the plurality of semiconductor memory devices, the method comprising:

receiving the device identifier and a search device type through the serial input connection of the i-th semiconductor memory device;

performing:

a first determination whether the device type of the i-th semiconductor memory device contains pre-defined data corresponding to any of the mixed device types to provide a first determination result; and a second determination of the device type of the i-th semiconductor memory device by comparing the device type of the i-th semiconductor memory device to the search device type received at the serial input connection of the i-th semiconductor memory device to provide a second determination result; and outputting an output device identifier containing the device identifier of the i-th semiconductor memory device in response to the first determination result and the second determination result.

47. The machine-readable medium of claim 46, wherein the step of performing comprises:

performing the first determination of whether the search device type of the i-th semiconductor memory device matches the pre-defined data; and performing the second determination of whether the search device type matches a reference device type assigned to the i-th semiconductor memory device.

48. The machine-readable medium of claim 47, wherein the method further comprises:

receiving a device identifier generation command;

combining the device identifier generation command, the search device type and the device identifier to provide combined data; and providing the serial output signal containing the combined data as a packet.

49. A method for determining a device identifier in a serial interconnection configuration of first to N-th semiconductor memory devices of mixed types, N being an integer greater than one, each of the first to N-th semiconductor memory devices having a semiconductor memory associated therewith and a device type, the device type being related to the semiconductor memory, an i-th semiconductor memory device where i is one to N, having a serial input connection coupled to a serial output connection of an (i−1)-th semiconductor memory device, an (i+1)-th semiconductor memory device having a serial input connection coupled to a serial output connection of the i-th semiconductor memory device, the method being adopted for execution in at least one of the first to N-th semiconductor memory devices, the method comprising:

receiving a device identifier and a search device type through the serial input connection of the i-th semiconductor memory device;

performing:

in response to the search device type received through the serial input connection, a first determination whether the device type of the i-th semiconductor memory device contains pre-defined data corresponding to any device type to provide a first determination result; and outputting an output device identifier in response to the first determination result.

50. The method of claim 49, wherein the step of performing a first determination comprises:

comparing the search device type received through the serial input connection to the device type of the i-th semiconductor memory device.

51. The method of claim 50, wherein:

the step of performing further comprises performing a second determination of the device type of the i-th semiconductor memory device by comparing the device type of the i-th semiconductor memory device to the search device type received through the serial input connection to provide a second determination result; and the step of outputting comprises outputting the output device identifier in response to the first and second determination results.

52. The method of claim 51, wherein:

the step of performing the first determination comprises determining whether the search device type matches the pre-defined data of the i-th semiconductor memory device; and the step of performing the second determination comprises determining whether the search device type matches a reference device type as the device type assigned to the i-th semiconductor memory device.

53. The method of claim 52, wherein:

the step of performing the first determination further comprises:

providing a pre-defined value as the pre-defined data that corresponds to any device type.

54. The method of claim 50, wherein:

the step of performing the first determination is executed before the step of performing the second determination.

* * * * *